US012765185B2

(12) United States Patent
Yanagisawa et al.

(10) Patent No.: US 12,765,185 B2
(45) Date of Patent: Oct. 13, 2026

(54) DISPLAY DEVICE WITH A GROOVE OVERLAPPING PIXEL ELECTRODES AND METHODS FOR FABRICATING THE SAME

(71) Applicant: Semiconductor Energy Laboratory Co., Ltd., Atsugi (JP)

(72) Inventors: Yuichi Yanagisawa, Atsugi (JP); Ryota Hodo, Atsugi (JP); Hiromi Sawai, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 343 days.

(21) Appl. No.: 18/702,404

(22) PCT Filed: Oct. 13, 2022

(86) PCT No.: PCT/IB2022/059800
§ 371 (c)(1),
(2) Date: Apr. 18, 2024

(87) PCT Pub. No.: WO2023/073473
PCT Pub. Date: May 4, 2023

(65) Prior Publication Data
US 2024/0423026 A1 Dec. 19, 2024

(30) Foreign Application Priority Data
Oct. 27, 2021 (JP) ................................ 2021-175770

(51) Int. Cl.
*H10K 59/122* (2023.01)
*H10K 59/12* (2023.01)
*H10K 59/124* (2023.01)

(52) U.S. Cl.
CPC ....... *H10K 59/122* (2023.02); *H10K 59/1201* (2023.02); *H10K 59/124* (2023.02)

(58) Field of Classification Search
CPC .. H10K 59/00; H10K 59/122; H10K 59/1201; H10K 59/124; H10K 59/35;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 103311268 A 9/2013
CN 107799555 A 3/2018
(Continued)

OTHER PUBLICATIONS

International Search Report (Application No. PCT/IB2022/059800) Dated Dec. 27, 2022.
(Continued)

*Primary Examiner* — William B Partridge
*Assistant Examiner* — Noah C. Robertson
(74) *Attorney, Agent, or Firm* — Eric J. Robinson; Robinson Intellectual Property Law Office, P.C.

(57) ABSTRACT

A high-resolution display device and a fabrication method thereof are provided. The display device includes a first insulating layer, a second insulating layer, a first light-emitting element, a second light-emitting element, and a resin layer. The first light-emitting element includes a first pixel electrode, a first organic layer, and a common electrode, and the second light-emitting element includes a second pixel electrode, a second organic layer, and the common electrode. The first insulator has a groove. The groove has a region overlapping with the first pixel electrode and a region overlapping with the second pixel electrode. The second insulating layer has a region in contact with part of the top surface of the first organic layer, a region in
(Continued)

contact with the side surface of the first organic layer, and a region in contact with the first insulating layer below the first pixel electrode. The resin layer is positioned between the first organic layer and the second organic layer. The common electrode is provided to cover the top surface of the resin layer.

8 Claims, 29 Drawing Sheets

(58) Field of Classification Search
CPC ............. H10K 59/121; H10K 59/8051; H10K 59/8052; H10K 50/00; H10K 50/84; H10K 71/00; H10K 71/16; H10K 71/12; H10K 71/60; H05B 33/10; H05B 33/12; H05B 33/14; H05B 33/22
See application file for complete search history.

(56) References Cited

U.S. PATENT DOCUMENTS

| | | | | |
|---|---|---|---|---|
| 7,399,991 | B2 | 7/2008 | Seo et al. | |
| 8,729,539 | B2 | 5/2014 | Kakinuma et al. | |
| 8,981,352 | B2 | 3/2015 | Yamada et al. | |
| 9,997,576 | B2 | 6/2018 | Jinbo. et al. | |
| 10,304,919 | B2 | 5/2019 | Jinbo. et al. | |
| 10,636,851 | B2 | 4/2020 | Ukigaya | |
| 11,678,550 | B2 | 6/2023 | Kato | |
| 2002/0072139 | A1 | 6/2002 | Kashiwabara | |
| 2005/0264189 | A1 | 12/2005 | Choi et al. | |
| 2005/0285134 | A1 | 12/2005 | Kang et al. | |
| 2011/0148290 | A1 | 6/2011 | Oota | |
| 2012/0217516 | A1 | 8/2012 | Hatano et al. | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0001620 | A1 | 1/2013 | Sugisawa et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0234120 | A1 | 9/2013 | Kakinuma et al. | |
| 2013/0280839 | A1 | 10/2013 | Sonoda et al. | |
| 2013/0295705 | A1 | 11/2013 | Sonoda. et al. | |
| 2013/0299791 | A1 | 11/2013 | Hirakata et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto. et al. | |
| 2015/0069360 | A1 | 3/2015 | Sato | |
| 2015/0076476 | A1 | 3/2015 | Odaka et al. | |
| 2016/0043345 | A1 | 2/2016 | Goden et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2017/0271421 | A1* | 9/2017 | Jinbo | H10K 59/124 |
| 2018/0061907 | A1* | 3/2018 | Kim | H10K 59/124 |
| 2018/0190908 | A1 | 7/2018 | Ke et al. | |
| 2019/0006618 | A1 | 1/2019 | Sonoda et al. | |
| 2020/0203662 | A1 | 6/2020 | Mollard et al. | |
| 2021/0043705 | A1 | 2/2021 | Lim et al. | |
| 2021/0202610 | A1 | 7/2021 | Ryu | |
| 2021/0265432 | A1 | 8/2021 | Kato | |
| 2022/0209162 | A1 | 6/2022 | Seo et al. | |
| 2023/0301151 | A1 | 9/2023 | Kato | |
| 2024/0049560 | A1 | 2/2024 | Nakamura et al. | |
| 2024/0057451 | A1 | 2/2024 | Yanagisawa et al. | |
| 2024/0224698 | A1 | 7/2024 | Nakamura et al. | |
| 2024/0423025 | A1 | 12/2024 | Hodo et al. | |
| 2025/0098429 | A1 | 3/2025 | Yanagisawa et al. | |

FOREIGN PATENT DOCUMENTS

| | | | | |
|---|---|---|---|---|
| CN | 108780617 | A | 11/2018 | |
| CN | 112314056 | A | 2/2021 | |
| CN | 112349752 | A | 2/2021 | |
| EP | 3291302 | A | 3/2018 | |
| JP | 2000-036385 | A | 2/2000 | |
| JP | 2002-324673 | A | 11/2002 | |
| JP | 2003-059663 | A | 2/2003 | |
| JP | 2005-276667 | A | 10/2005 | |
| JP | 2008-098106 | A | 4/2008 | |
| JP | 2008-108482 | A | 5/2008 | |
| JP | 2008-147072 | A | 6/2008 | |
| JP | 2008-251270 | A | 10/2008 | |
| JP | 2012-216338 | A | 11/2012 | |
| JP | 2013-187095 | A | 9/2013 | |
| JP | 2014-120218 | A | 6/2014 | |
| JP | 2014-135251 | A | 7/2014 | |
| JP | 2014-232568 | A | 12/2014 | |
| JP | 2015-115178 | A | 6/2015 | |
| JP | 2016-197494 | A | 11/2016 | |
| JP | 2017-174811 | A | 9/2017 | |
| JP | 2019-067525 | A | 4/2019 | |
| JP | 2019-179696 | A | 10/2019 | |
| JP | 2020-160305 | A | 10/2020 | |
| KR | 2018-0025024 | A | 3/2018 | |
| KR | 2018-0130521 | A | 12/2018 | |
| KR | 2020-0002575 | A | 1/2020 | |
| KR | 2021-0017179 | A | 2/2021 | |
| KR | 2021-0086287 | A | 7/2021 | |
| WO | WO-2017/158477 | | 9/2017 | |
| WO | WO-2020/004086 | | 1/2020 | |
| WO | WO-2020004086 | A1 * | 1/2020 | H05B 33/12 |

OTHER PUBLICATIONS

Written Opinion (Application No. PCT/IB2022/059800) Dated Dec. 27, 2022.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke. T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International

(56) References Cited

OTHER PUBLICATIONS

Symposium Digest of Technical Papers, May 1, 2017, vol. 48, No. 1, pp. 623-626.

* cited by examiner

DISPLAY DEVICE WITH A GROOVE OVERLAPPING PIXEL ELECTRODES AND METHODS FOR FABRICATING THE SAME

TECHNICAL FIELD

One embodiment of the present invention relates to a display device. One embodiment of the present invention relates to a method for fabricating a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. Note that in this specification and the like, a semiconductor device generally means a device that can function by utilizing semiconductor characteristics.

BACKGROUND ART

In recent years, higher-resolution display panels have been required. As a device that requires a high-resolution display panel, for example, devices for virtual reality (VR), augmented reality (AR), substitutional reality (SR), or mixed reality (MR) are given and have been actively developed in recent years.

Examples of a display device that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By voltage application to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

For example, in the above-described device for VR, AR, SR, or MR that is wearable, a lens for focus adjustment needs to be provided between eyes and the display panel. Since part of the screen is enlarged by the lens, low resolution of the display panel might cause a problem of weak sense of reality and immersion.

The display panel is also required to have high color reproducibility. In particular, when using the display panel with high color reproducibility, the above-described device for VR, AR, SR, or MR can perform display with colors that are close to those of the actual objects, leading to higher sense of reality and immersion.

An object of one embodiment of the present invention is to provide a display device with extremely high resolution. An object of one embodiment of the present invention is to provide a display device in which high color reproducibility is achieved. An object of one embodiment of the present invention is to provide a high-luminance display device. An object of one embodiment of the present invention is to provide a highly reliable display device. An object of one embodiment of the present invention is to provide a display device manufactured at low cost. An object of one embodiment of the present invention is to provide a method for manufacturing the above-described display device.

Note that the description of these objects does not preclude the existence of other objects. One embodiment of the present invention does not have to achieve all the objects. Note that objects other than these can be derived from the description of the specification, the drawings, the claims, and the like.

Means for Solving the Problems

One embodiment of the present invention is a display device including a first insulating layer, a first light-emitting element and a second light-emitting element over the first insulating layer, a second insulating layer, a third insulating layer, and a resin layer. The first light-emitting element includes a first pixel electrode, a first organic layer, and a common electrode. The second light-emitting element includes a second pixel electrode, a second organic layer, and the common electrode. The first light-emitting element and the second light-emitting element emit light of different colors. The first insulating layer has a groove. The groove has a region overlapping with the first pixel electrode, a region overlapping with the second pixel electrode, and a region overlapping with neither the first pixel electrode nor the second pixel electrode. The second insulating layer has a region in contact with at least part of a top surface of the first organic layer, a region in contact with a side surface of the first organic layer, and a region in contact with the first insulating layer below the first pixel electrode. The third insulating layer has a region in contact with at least part of a top surface of the second organic layer, a region in contact with a side surface of the second organic layer, and a region in contact with the first insulating layer below the second pixel electrode. The resin layer has a region in contact with the first insulating layer in a portion positioned between the first organic layer and the second organic layer. The common electrode is provided to cover a top surface of the resin layer.

In the display device, the shortest distance between an end portion of the first pixel electrode and an end portion of the second pixel electrode is preferably twice or more a thickness of the first organic layer.

In the display device, the groove preferably has a downward-convex arc shape in a cross-sectional view.

In the display device, the second insulating layer and the third insulating layer each preferably contain aluminum and oxygen.

Another embodiment of the present invention is a method for fabricating a display device including a first light-emitting element and a second light-emitting element; the first light-emitting element includes a first pixel electrode, a first organic layer, and a common electrode; the second light-emitting element includes a second pixel electrode, a second organic layer, and the common electrode; and the first light-emitting element and the second light-emitting element emit light of different colors. The first pixel electrode and the second pixel electrode are formed over a first insulating layer. In the first insulating layer, a groove having a region overlapping with the first pixel electrode, a region overlapping with the second pixel electrode, and a region overlapping with neither the first pixel electrode nor the second pixel electrode is formed by an isotropic etching method. The first organic layer is formed over the first pixel electrode by forming a film containing a first light-emitting compound over the first pixel electrode and the first insulating layer. A second insulating layer is formed over the first organic layer. The second organic layer is formed over the second pixel electrode by forming a film containing a second light-emitting compound over the second pixel electrode and the first insulating layer. A third insulating layer is formed over the second organic layer. A resin layer is formed over the first insulating layer, the second insulating layer, and the third insulating layer. A first opening portion reaching the first organic layer is formed in the resin layer and the second insulating layer and a second opening portion reaching the second organic layer is formed in the resin layer and the third insulating layer by removing part of the resin layer, part of the second insulating layer, and part of the third insulating layer. The common electrode is formed to overlap with the first organic layer in the first opening portion and to overlap with the second organic layer in the second opening portion.

Another embodiment of the present invention is a method for fabricating a display device including a first light-emitting element and a second light-emitting element; the first light-emitting element includes a first pixel electrode, a first organic layer, and a common electrode; the second light-emitting element includes a second pixel electrode, a second organic layer, and the common electrode; and the first light-emitting element and the second light-emitting element emit light of different colors. The first pixel electrode and the second pixel electrode are formed over a first insulating layer. In the first insulating layer, a groove having a region overlapping with the first pixel electrode, a region overlapping with the second pixel electrode, and a region overlapping with neither the first pixel electrode nor the second pixel electrode is formed by an isotropic etching method. A first resist mask is formed in part of the groove and a portion overlapping with the second pixel electrode. The first organic layer is formed over the first pixel electrode and a first layer is formed over the first resist mask by forming a film containing a first light-emitting compound over the first pixel electrode, the first insulating layer, and the first resist mask. A second insulating layer is formed over the first organic layer. The first resist mask and the first layer are removed. A second resist mask is formed over the second insulating layer. The second organic layer is formed over the second pixel electrode and a second layer is formed over a third resist mask by forming a film containing a second light-emitting compound over the second pixel electrode, the first insulating layer, and the second resist mask. A third insulating layer is formed over the second organic layer. The second resist mask and the second layer are removed. A resin layer is formed over the first insulating layer, the second insulating layer, and the third insulating layer. A first opening portion reaching the first organic layer is formed in the resin layer and the second insulating layer and a second opening portion reaching the second organic layer is formed in the resin layer and the third insulating layer by removing part of the resin layer, part of the second insulating layer, and part of the third insulating layer. The common electrode is formed to overlap with the first organic layer in the first opening portion and to overlap with the second organic layer in the second opening portion.

In the method for fabricating the display device, it is preferable that the first insulating layer be an insulating layer containing an inorganic material, and that the groove be formed by wet etching treatment.

In the method for fabricating the display device, the second insulating layer and the third insulating layer are preferably formed by an ALD method.

Effect of the Invention

According to one embodiment of the present invention, a display device with extremely high resolution can be provided. A display device in which high color reproducibility is achieved can be provided. A high-luminance display device can be provided. A highly reliable display device can be provided. A display device manufactured at low cost can be provided. A method for manufacturing the above-described display device can be provided.

Note that the description of these effects does not preclude the existence of other effects. One embodiment of the present invention does not need to have all of these effects. Note that effects other than these can be derived from the description of the specification, the drawings, the claims, and the like.

MODE FOR CARRYING OUT THE INVENTION

Figure 1A:
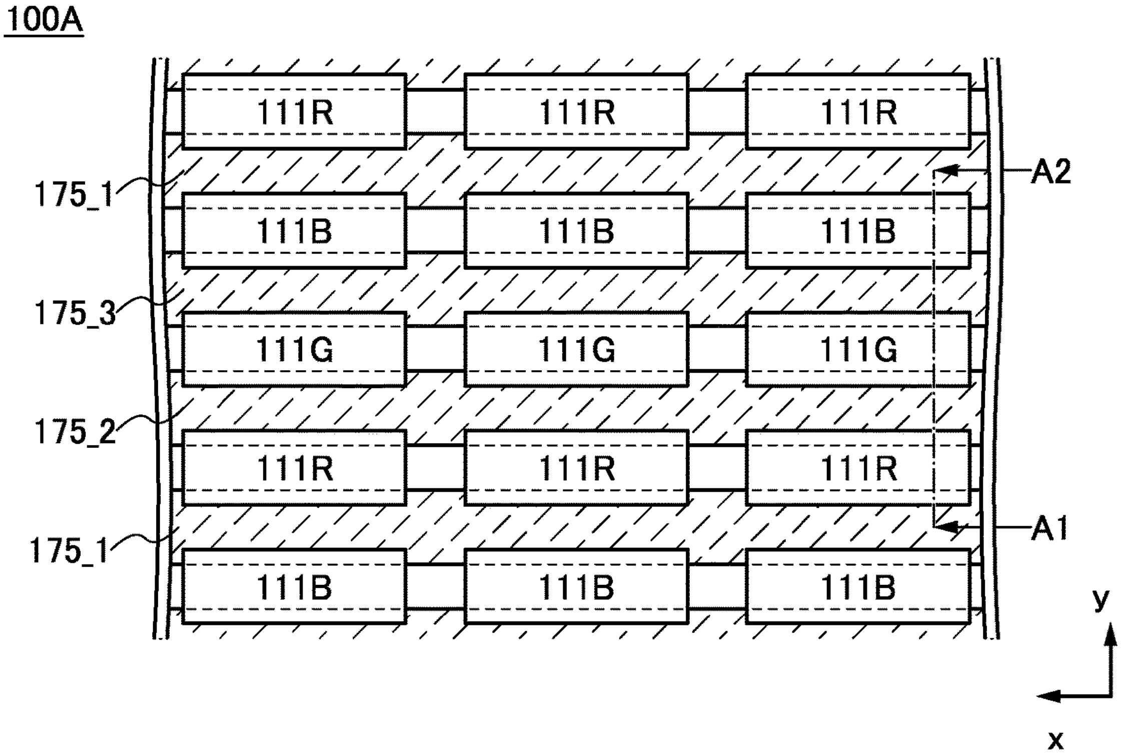
FIG. 1A and FIG. 1B are diagrams illustrating a structure example of a display device.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatching pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as “first” and “second” are used in order to avoid confusion among components and do not limit the number.

In this specification and the like, a hole or an electron is sometimes referred to as a “carrier”. Specifically, a hole-injection layer or an electron-injection layer may be referred to as a “carrier-injection layer”, a hole-transport layer or an electron-transport layer may be referred to as a “carrier-transport layer”, and a hole-blocking layer or an electron-blocking layer may be referred to as a “carrier-blocking layer”. Note that the above-described carrier-injection layer, carrier-transport layer, and carrier-blocking layer cannot be clearly distinguished from each other on the basis of the cross-sectional shape, properties, or the like in some cases. One layer may have two or three functions of the carrier-injection layer, the carrier-transport layer, and the carrier-blocking layer in some cases.

In this specification and the like, a light-emitting element (also referred to as a light-emitting device) includes an EL layer between a pair of electrodes. The EL layer includes at least a light-emitting layer. Examples of layers (also referred to as functional layers) included in the EL layer include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer).

Note that in this specification and the like, a tapered shape refers to a shape in which at least part of a side surface of a component is inclined to a substrate surface. For example, a tapered shape preferably includes a region where an angle formed by the inclined side surface and the substrate surface (such an angle is also referred to as a taper angle) is less than 90°. Note that the side surface of the component and the substrate surface are not necessarily completely flat and may be substantially flat with a small curvature or substantially flat with slight unevenness.

In this specification and the like, an inverse tapered shape refers to the case where an angle formed by at least part of the side surface of a component and the bottom surface of the component is greater than 90°. Alternatively, the inverse tapered shape refers to a shape in which a side portion or an upper portion extends beyond a bottom portion in the direction parallel to a substrate.

In this specification, in the case where the maximum value and the minimum value are specified, a structure in which the maximum value and the minimum value are freely combined is disclosed.

Embodiment 1

In this embodiment, a display device of one embodiment of the present invention and a method for fabricating the display device will be described.

The display device of one embodiment of the present invention includes light-emitting elements (also referred to as light-emitting devices) emitting light of different colors. The light-emitting element includes a lower electrode, an upper electrode, and a layer containing a light-emitting compound (also referred to as a light-emitting layer or an EL layer) therebetween. As the light-emitting element, an electroluminescent element such as an organic EL element or an inorganic EL element is preferably used. Alternatively, a light-emitting diode (LED) may be used.

As the light-emitting element, an OLED (Organic Light Emitting Diode) or a QLED (Quantum-dot Light Emitting Diode) is preferably used, for example. Examples of a light-emitting substance contained in the light-emitting element include a substance that emits fluorescent light (fluorescent material), a substance that emits phosphorescent light (phosphorescent material), a substance exhibiting thermally activated delayed fluorescence (thermally activated delayed fluorescent (TADF) material), and an inorganic compound (e.g., a quantum dot material). Alternatively, an LED such as a micro-LED (Light Emitting Diode) can be used as the light-emitting element.

The emission color of the light-emitting element can be red, green, blue, cyan, magenta, yellow, or white, for example. Furthermore, the color purity can be further increased when the light-emitting element has a microcavity structure.

Refer to Embodiment 2 for the structure and materials of the light-emitting element.

The light-emitting layer may contain one or more kinds of compounds (a host material and an assist material) in addition to the light-emitting substance (a guest material). As the host material and the assist material, one or more kinds of substances whose energy gap is larger than the energy gap of the light-emitting substance (the guest material) can be selected and used. As the host material and the assist material, compounds that form an exciplex are preferably used in combination. In order to form an exciplex efficiently, it is particularly preferable to combine a compound that easily accepts holes (a hole-transport material) and a compound that easily accepts electrons (an electron-transport material).

Either a low molecular compound or a high molecular compound can be used for the light-emitting element, and an inorganic compound (e.g., a quantum dot material) may be contained.

In the display device of one embodiment of the present invention, the light-emitting elements of different colors can be separately formed with extremely high accuracy. Thus, a display device with higher resolution than a conventional display device can be achieved. For example, the display device preferably has extremely high resolution in which pixels including one or more light-emitting elements are arranged with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

More specific structure examples of a display device and fabrication method examples thereof will be described below with reference to drawings.

Structure Example 1

Structure Example 1-1

Figure 1B:
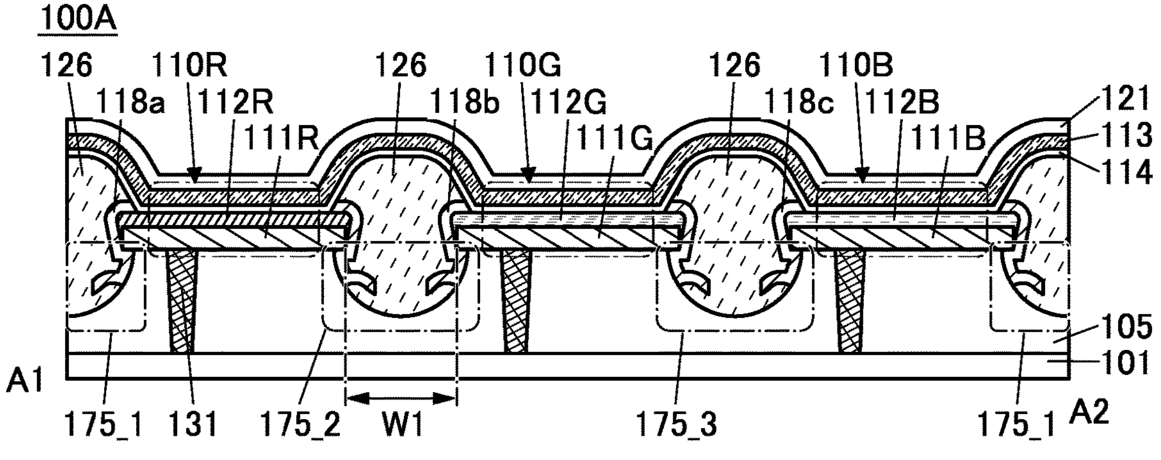

FIG. 1A and FIG. 1B are diagrams illustrating a display device of one embodiment of the present invention. FIG. 1A is a schematic top view of a display device 100A, and FIG. 1B is a schematic cross-sectional view of the display device 100A. Here, FIG. 1B is a cross-sectional view of a portion indicated by the dashed-dotted line A1-A2 in FIG. 1A. Note that for clarity of the drawing, some components are omitted in the top view of FIG. 1A.

The display device 100A includes an insulating layer 105, a light-emitting element 110R, a light-emitting element 110G, and a light-emitting element 110B. The light-emitting element 110R is a light-emitting element emitting red light, the light-emitting element 110G is a light-emitting element emitting green light, and the light-emitting element 110B is a light-emitting element emitting blue light. In other words, the light-emitting element 110R and the light-emitting element 110G emit light of different colors. The light-emitting element 110G and the light-emitting element 110B emit light of different colors. The light-emitting element 110B and the light-emitting element 110R emit light of different colors.

In this specification and the like, a structure in which at least light-emitting layers of light-emitting elements with different emission wavelengths are separately formed may be referred to as an SBS (Side By Side) structure. The SBS structure can optimize materials and structures of light-emitting elements and thus can increase the degree of freedom in selecting materials and structures, so that the luminance and the reliability can be easily improved.

The light-emitting element 110R includes a pixel electrode 111R, an organic layer 112R, a common layer 114, and a common electrode 113. The light-emitting element 110G includes a pixel electrode 111G, an organic layer 112G, the common layer 114, and the common electrode 113. The light-emitting element 110B includes a pixel electrode 111B, an organic layer 112B, the common layer 114, and the common electrode 113. The common layer 114 and the common electrode 113 are provided to be shared by the light-emitting element 110R, the light-emitting element 110G, and the light-emitting element 110B.

The organic layer 112R contains at least a light-emitting organic compound that emits light with intensity in a red wavelength range. The organic layer 112G contains at least a light-emitting organic compound that emits light with intensity in a green wavelength range. The organic layer 112B contains at least a light-emitting organic compound that emits light with intensity in a blue wavelength range. Each of the organic layer 112R, the organic layer 112G, and the organic layer 112B includes at least a layer containing a light-emitting organic compound (a light-emitting layer).

The pixel electrode 111R, the pixel electrode 111G, and the pixel electrode 111B are provided for the respective light-emitting elements. In addition, the common layer 114 and the common electrode 113 are each provided as a continuous layer shared by the light-emitting elements. A conductive film having a property of transmitting visible light is used for either the pixel electrodes or the common electrode 113, and a conductive film having a reflective property is used for the other. When the pixel electrodes have light-transmitting properties and the common electrode 113 has a reflective property, a bottom-emission display device can be obtained. By contrast, when the pixel electrodes have reflective properties and the common electrode 113 has a light-transmitting property, a top-emission display device can be obtained. Note that when both the pixel electrodes and the common electrode 113 have light-transmitting properties, a dual-emission display device can be obtained.

A protective layer 121 is provided over the common electrode 113 to cover the light-emitting element 110R, the light-emitting element 110G, and the light-emitting element 110B. The protective layer 121 has a function of preventing diffusion of impurities such as water into the light-emitting elements from the above.

In the following description common to the light-emitting element 110R, the light-emitting element 110G, and the light-emitting element 110B, the alphabets are omitted from the reference numerals and the term "light-emitting element 110" is used in some cases. Similarly, the pixel electrode 111R, the pixel electrode 111G, and the pixel electrode 111B are described using the term "pixel electrode 111" in some cases. Similarly, the organic layer 112R, the organic layer 112G, and the organic layer 112B are described using the term "organic layer 112" in some cases.

The combination of colors of light emitted from the light-emitting elements 110 is not limited to the above, and for example, colors such as cyan, magenta, and yellow may also be used. Although the example of three colors of red (R), green (G), and blue (B) is shown above, the number of colors of light emitted from the light-emitting elements 110 included in the display device 100A may be two or four or more.

The pixel electrode 111 functions as a lower electrode, and the common electrode 113 functions as an upper electrode. The common electrode 113 has properties of transmitting and reflecting visible light. The organic layer 112 contains a light-emitting compound.

As the light-emitting element 110, it is possible to use an electroluminescent element having a function of emitting light in accordance with current flowing into the organic layer 112 when a potential difference is supplied between the pixel electrode 111 and the common electrode 113. In particular, an organic EL element using a light-emitting organic compound is preferably used for the organic layer 112. In addition, the light-emitting element 110 is preferably an element emitting monochromatic light, which has one peak in the visible light region of the emission spectrum. Note that the light-emitting element 110 may be an element emitting white light, which has two or more peaks in the visible light region of the emission spectrum.

A potential for controlling the amount of light emitted from the light-emitting element 110 is independently supplied to the pixel electrodes 111 provided in the light-emitting elements 110.

The organic layer 112 and the common layer 114 can each independently include one or more of an electron-injection layer, an electron-transport layer, a hole-injection layer, and a hole-transport layer. For example, it is possible to employ a structure in which the organic layer 112 has a stacked-layer structure of a hole-injection layer, a hole-transport layer, a light-emitting layer, and an electron-transport layer from the pixel electrode 111 side and the common layer 114 includes an electron-injection layer.

The common electrode 113 is formed to have properties of transmitting and reflecting visible light. For example, a metal film or an alloy film that is thin enough to transmit visible light can be used. Alternatively, a light-transmitting conductive film (e.g., a metal oxide film) may be stacked over such a film.

The insulating layer 105 has a groove. One groove is provided in the insulating layer 105 in a region positioned between two pixel electrodes 111 adjacent to each other in the A1-A2 direction illustrated in FIG. 1A. As illustrated in FIG. 1A and FIG. 1B, a groove 175_2 is provided in the insulating layer 105 in a region positioned between the light-emitting element 110R and the light-emitting element 110G, a groove 175_3 is provided in the insulating layer 105 in a region positioned between the light-emitting element 110G and the light-emitting element 110B, and a groove 175_1 is provided in the insulating layer 105 in a region positioned between the light-emitting element 110B and the light-emitting element 110R.

In the following description common to the groove 175_1, the groove 175_2, and the groove 175_3, some reference numerals are omitted and the term "groove 175" is used in some cases.

As illustrated in FIG. 1A, in the top view of the display device 100A, the extending direction of the groove 175 provided in the insulating layer 105 is referred to as the x direction, and the direction perpendicular to the x direction is referred to as the y direction. In other words, the groove 175 has a linear shape extending in the x direction.

In the case where the stripe arrangement illustrated in FIG. 1A is employed for the light-emitting elements 110 (the pixel electrodes 111), the adjacent light-emitting elements of the same color are arranged in the x direction, and the adjacent light-emitting elements of different colors are arranged in they direction. They direction can be referred to as the A1-A2 direction illustrated in FIG. 1A.

Part of the groove 175 is preferably positioned below the pixel electrode 111. In other words, the groove 175 preferably has a region positioned below the pixel electrode 111.

For example, the groove 175 positioned between a first pixel electrode and a second pixel electrode preferably has a first region overlapping with the first pixel electrode, a second region overlapping with the second pixel electrode, and a third region overlapping with neither the first pixel electrode nor the second pixel electrode. The third region is positioned between the first region and the second region. The first region can be regarded as being positioned below the first pixel electrode. The second region can be regarded as being positioned below the second pixel electrode. Note that a light-emitting element including the first pixel electrode and a light-emitting element including the second pixel electrode emit light of different colors.

As illustrated in FIG. 1B, the groove 175 preferably has a downward-convex arc shape in the cross-sectional view of the display device 100A, for example. Note that the downward-convex arc shape can be regarded as a concave curved shape. Furthermore, the downward-convex arc shape includes a downward-convex semicircular shape. With the groove 175 having such a shape, the organic layer 112 is divided between the adjacent light-emitting elements of different colors. Thus, current (also referred to as leakage current) flowing between the adjacent light-emitting elements of different colors through the organic layer 112 can be prevented. Accordingly, light emission caused by the leakage current can be inhibited, so that display with a high contrast can be achieved. Furthermore, even in the case where the resolution is increased, the range of choices for materials can be widened since the organic layer 112 can be formed using a material with high conductivity, which facilitates an improvement in efficiency, a reduction in power consumption, and an improvement in reliability.

The organic layer 112 may be patterned into an island shape by deposition with use of a shadow mask such as a metal mask; however, it is particularly preferable to employ a processing method using no metal mask. Accordingly, an extremely fine pattern can be formed; thus, resolution and an aperture ratio can be improved as compared to the formation method using a metal mask. A typical example of such a processing method is a photolithography method. Alternatively, a formation method such as a nanoimprinting method or a sandblasting method can be used.

In this specification and the like, a device formed using a metal mask or an FMM (fine metal mask) may be referred to as a device having an MM (metal mask) structure. In this specification and the like, a device formed without using a metal mask or an FMM may be referred to as a device having an MML (metal maskless) structure.

Figure 2A:
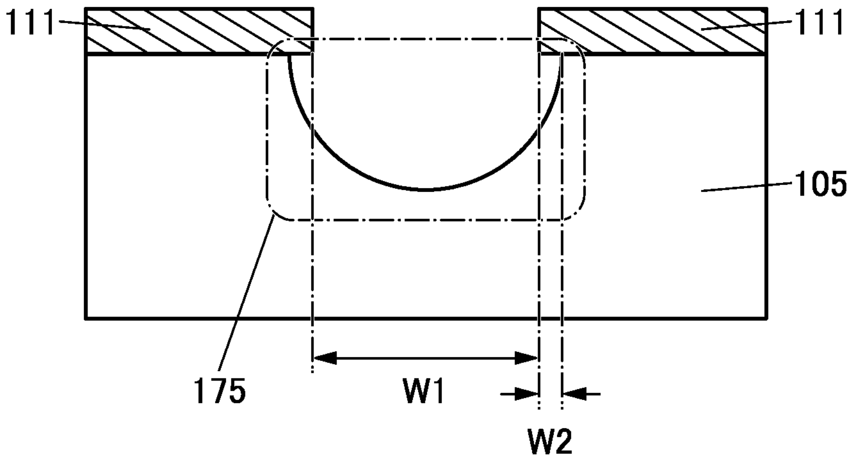
FIG. 2A and FIG. 2B are diagrams illustrating a structure example of a display device.

FIG. 2A is a schematic cross-sectional view of the groove 175 and its vicinity in the display device 100A. Note that for clarity of the drawing, some components (the organic layer 112, the common electrode 113, and the like) are omitted in FIG. 2A.

A width W1 illustrated in FIG. 2A is a width of the groove 175 in a region not overlapping with the pixel electrode 111 in the A1-A2 direction. Note that in the display device 100A illustrated in FIG. 2A, the width W1 can be rephrased as the shortest distance between the end portions of the pixel electrodes 111 that face each other. A width W2 illustrated in FIG. 2A is a width of the groove 175 in a region overlapping with the pixel electrode 111 in the A1-A2 direction.

The width W1 is preferably twice or more the thickness of the organic layer 112. In the case where the thickness of the organic layer 112 is 100 nm, for example, the width W1 is greater than or equal to 200 nm and less than or equal to 1200 nm, preferably greater than or equal to 200 nm and less than or equal to 1000 nm, further preferably greater than or equal to 200 nm and less than or equal to 900 nm. This enables the groove 175 to cause disconnection of the organic layer 112 so that the organic layer 112 can be formed over each pixel electrode 111. In that case, the organic layer 112 is placed to cover the side surface and the top surface of the pixel electrode 111 as illustrated in FIG. 1B. Note that in this specification and the like, a state where a layer covers a structure body indicates a state where the layer covers part of an end surface of the structure body or a state where the layer completely covers the structure body so as to surround the end surface of the structure body. Examples of the layer here include an insulating layer, an insulating film, and a conductive layer. Examples of the structure body include a conductive layer, an organic layer, a stack, and a light-emitting element.

Note that the width W1 is preferably adjusted as appropriate in accordance with the processing accuracy at the time of forming the groove 175, the deposition conditions of the organic layer 112, and the like. In the case where the organic layer 112 is formed by a vacuum evaporation method, for example, disconnection of the organic layer 112 might occur even when the width W1 is less than twice the thickness of the organic layer 112. For example, in the case where the thickness of the organic layer 112 is 100 nm, the width W1 may be greater than or equal to 100 nm and less than or equal to 1200 nm, less than or equal to 1000 nm, or less than or equal to 900 nm.

The width W2 is set to a width such that disconnection of the organic layer 112 occurs. The width W2 is preferably greater than or equal to 2 nm, greater than or equal to 5 nm, greater than or equal to 10 nm, or greater than or equal to 20 nm, and less than or equal to 500 nm, less than or equal to 300 nm, less than or equal to 200 nm, less than or equal to 150 nm, or less than or equal to 100 nm.

Accordingly, it is possible to achieve an extremely high-resolution display device in which pixels including one or more light-emitting elements are arranged with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

In the display device 100A, the organic layer 112 is preferably formed so as not to be divided but to be continuous between the light-emitting elements exhibiting the same color. For example, the organic layer 112 is preferably formed in a stripe pattern. The common electrode 113 is preferably formed so as not to be divided but to be continuous between the light-emitting elements exhibiting the same color, and is preferably formed so as not to be divided but to be continuous between the light-emitting elements. Thus, the common electrode 113 for all the light-emitting elements can be supplied with a predetermined potential without being in a floating state.

In the cross-sectional view of FIG. 1B, the end portions of the organic layer 112 are positioned outward from the end portions of the pixel electrode 111. The end portions of the organic layer 112 cover the end portions of the pixel electrode 111. When the end portions of the organic layer 112 are positioned outward from the end portions of the pixel electrode 111, a short circuit between the pixel electrode 111 and the common electrode 113 can be inhibited.

The display device 100A includes an insulating layer 118*a* over the organic layer 112R, an insulating layer 118*b* over the organic layer 112G, an insulating layer 118*c* over the organic layer 112B, and a resin layer 126.

In the following description common to the insulating layer 118*a*, the insulating layer 118*b*, and the insulating layer 118*c*, the alphabets are omitted from the reference numerals and the term "insulating layer 118" is used in some cases.

The insulating layer 118 is provided to cover at least part of the top surface of the organic layer 112. In addition, the insulating layer 118 is provided to overlap with at least part of the groove near the organic layer 112. As illustrated in FIG. 1B, the insulating layer 118*a* over the organic layer 112R is provided to overlap with at least part of the groove 175_1 and at least part of the groove 175_2, the insulating layer 118*b* over the organic layer 112G is provided to overlap with at least part of the groove 175_2 and at least part of the groove 175_3, and the insulating layer 118*c* over the organic layer 112B is provided to overlap with at least part of the groove 175_3 and at least part of the groove 175_1.

In the cross-sectional view in the A1-A2 direction, the insulating layer 118 has a region in contact with at least part of the top surface of the organic layer 112 and a region in contact with the side surface of the organic layer 112. The insulating layer 118 also has a region in contact with the insulating layer 105 below the light-emitting element 110 (specifically, the pixel electrode 111).

The insulating layer 118 has an opening portion reaching the organic layer 112. In the opening portion, the organic layer 112 is in contact with the common layer 114. The common electrode 113 has a region overlapping with the organic layer 112 in the opening portion.

The insulating layer 118 has a region positioned between the resin layer 126 and the organic layer 112 and functions as a protective film for preventing contact between the resin layer 126 and the organic layer 112. When the organic layer 112 and the resin layer 126 are in contact with each other, the organic layer 112 might be dissolved by an organic solvent or the like used at the time of forming the resin layer 126. Thus, the insulating layer 118 is provided between the organic layer 112 and the resin layer 126 as described in this embodiment to protect the side surfaces of the organic layer 112.

The insulating layer 118 can be an insulating layer containing an inorganic material. As the insulating layer 118, an inorganic insulating film such as an oxide insulating film, a nitride insulating film, an oxynitride insulating film, or a nitride oxide insulating film can be used, for example. The insulating layer 118 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, a metal oxide film such as an aluminum oxide film or a hafnium oxide film, or an inorganic insulating film such as a silicon oxide film, which is formed by an ALD method, is used for the insulating layer 118, whereby the insulating layer 118 can have few pinholes and an excellent function of protecting the organic layer 112.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The insulating layer 118 may function as a protective layer that prevents diffusion of impurities such as water into the organic layer 112. As the insulating layer 118, it is preferable to use an inorganic insulating film with low moisture permeability, such as a silicon oxide film, a silicon nitride film, or an aluminum oxide film. In the case where aluminum oxide is used for the insulating layer 118, the insulating layer 118 contains aluminum and oxygen.

The insulating layer 118 can be formed by a sputtering method, a chemical vapor deposition (CVD) method, a pulsed laser deposition (PLD) method, an atomic layer deposition (ALD) method, or the like. The insulating layer 118 is preferably formed by an ALD method achieving good coverage.

The thickness of the insulating layer 118 is preferably greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

Between the adjacent light-emitting elements of different colors, the side surfaces of the organic layers 112 face each other with the resin layer 126 therebetween. The resin layer 126 is positioned between the adjacent light-emitting elements of different colors and is provided to fill a region between the end portions of the organic layers 112 and a region between the two organic layers 112. The resin layer 126 has a top surface with a smooth convex shape, and the common layer 114 and the common electrode 113 are provided to cover the top surface of the resin layer 126.

The resin layer 126 has a region in contact with the insulating layer 105 between the adjacent light-emitting elements of different colors. For example, the resin layer 126 has the region in contact with the insulating layer 105 in a portion positioned between the organic layer 112R and the organic layer 112G. The resin layer 126 also has the region in contact with the insulating layer 105 in a portion positioned between the organic layer 112G and the organic layer 112B. The resin layer 126 also has the region in contact with the insulating layer 105 in a portion positioned between the organic layer 112B and the organic layer 112R.

The resin layer 126 functions as a planarization film that fills a step positioned between the adjacent light-emitting elements of different colors. Providing the resin layer 126 can prevent a phenomenon in which the common electrode 113 is divided by a step at the end portion of the organic layer 112 (such a phenomenon is also referred to as disconnection) from occurring and the common electrode 113 over the organic layer 112 from being insulated. The resin layer 126 can also be referred to as LFP (Local Filling Planarization).

An insulating layer containing an organic material can be suitably used as the resin layer 126. For the resin layer 126, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of these resins, or the like can be used, for example. For the resin layer 126, an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin may be used.

Alternatively, a photosensitive resin can be used for the resin layer 126. A photoresist may be used for the photosensitive resin. As the photosensitive resin, a positive photosensitive material or a negative photosensitive material can be used.

The resin layer 126 may contain a material absorbing visible light. For example, the resin layer 126 itself may be made of a material absorbing visible light, or the resin layer 126 may contain a pigment absorbing visible light. For example, for the resin layer 126, it is possible to use a resin that can be used as a color filter transmitting red, blue, or green light and absorbing other light, a resin that contains carbon black as a pigment and functions as a black matrix, or the like.

The protective layer 121 is provided to cover the common electrode 113.

The protective layer 121 can have, for example, a single-layer structure or a stacked-layer structure including an inorganic insulating film. Examples of the inorganic insulating film include an oxide film, an oxynitride film, a nitride oxide film, or a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material or a conductive material such as indium gallium oxide, indium zinc oxide, indium tin oxide, or indium gallium zinc oxide may be used for the protective layer 121.

For the protective layer 121, a stacked film of an inorganic insulating film and an organic insulating film can be used. For example, a structure in which an organic insulating film is sandwiched between a pair of inorganic insulating films is preferable. Furthermore, the organic insulating film preferably functions as a planarization film. This enables the top surface of the organic insulating film to be flat, which results in improved coverage with the inorganic insulating film thereover and a higher barrier property. Moreover, the top surface of the protective layer 121 is flat, which is preferable because when a structure body (e.g., a color filter, an electrode of a touch sensor, a lens array, or the like) is provided above the protective layer 121, the structure body can be less affected by an uneven shape caused by a lower component.

Figure 2B:
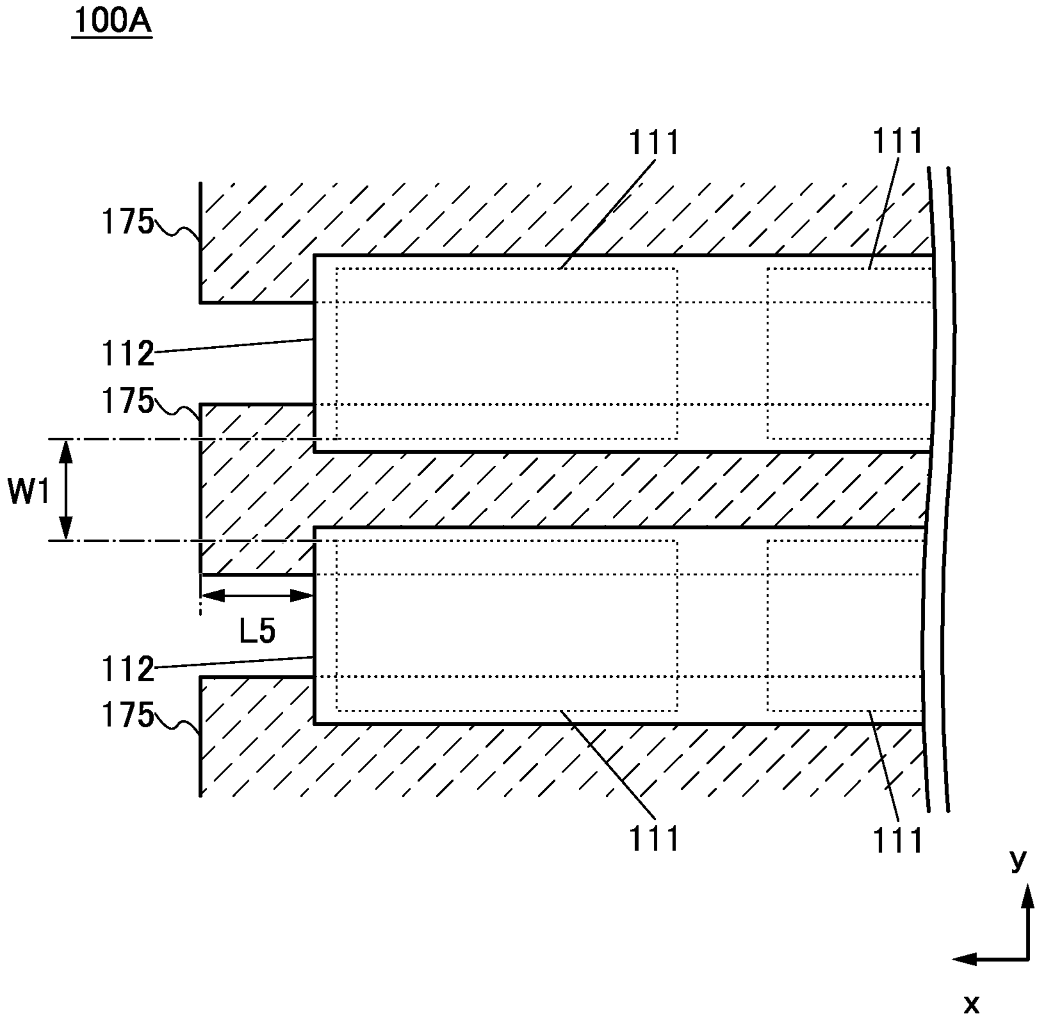

FIG. 2B is a schematic top view of the end portion of the groove 175 and its vicinity in the x direction. Note that for clarity of the drawing, some components are omitted in the top view of FIG. 2B.

As illustrated in FIG. 2B, the groove 175 preferably extends beyond the end portion of the organic layer 112 in the x direction. In FIG. 2B, the distance between the end portion of the groove 175 and the end portion of the organic layer 112 is denoted by a distance L5. With such a structure, the EL layers adjacent in the y direction can be separated from each other.

Although not illustrated in FIG. 2B, the common electrode 113 preferably extends beyond the end portion of the groove 175 in the x direction. In other words, the end portion of the groove 175 is preferably positioned inward from the end portion of the common electrode 113 in the x direction.

With such a structure, the EL layers can be separately provided in the light-emitting elements 110 of different colors, whereby color display with high color reproducibility can be performed with low power consumption. In addition, a microcavity structure can be given when the thickness of the EL layer included in the light-emitting element 110 is adjusted in accordance with a peak wavelength of an emission spectrum, so that a high luminance display device can be achieved. Moreover, the light-emitting elements 110 can be arranged extremely densely. For example, a display device having resolution exceeding 2000 ppi can be achieved.

In order to obtain a microcavity structure, the thickness of the EL layer included in the light-emitting element 110 is sometimes adjusted in accordance with the peak wavelength of the emission spectrum. For example, the organic layer 112R included in the light-emitting element 110R that emits light with the longest wavelength has the largest thickness, and the organic layer 112B included in the light-emitting element 110B that emits light with the shortest wavelength has the smallest thickness. Without limitation to this, the thickness of each organic layer can be adjusted in consideration of the wavelength of light emitted from the light-emitting element, the optical characteristics of the layers included in the light-emitting element, the electrical characteristics of the light-emitting element, and the like.

In the above, the width W1 is preferably more than twice the smallest thickness of the organic layer 112, further preferably more than twice the largest thickness of the organic layer 112. This enables the groove 175 to cause disconnection of the organic layer 112 so that the organic layer 112 can be formed over each pixel electrode 111. Furthermore, a microcavity structure can be obtained.

In the display device 100A, the insulating layer 105, the light-emitting element 110R, the light-emitting element 110G, and the light-emitting element 110B are provided over a substrate 101 provided with a semiconductor circuit. The display device 100A also includes a plug 131.

A circuit substrate including a transistor, a wiring, and the like can be used as the substrate 101. Note that in the case where either a passive matrix method or a segment method can be employed, an insulating substrate such as a glass substrate can be used as the substrate 101. The substrate 101 is a substrate provided with a circuit for driving the light-emitting elements (also referred to as a pixel circuit) or a semiconductor circuit functioning as a driver circuit for driving the pixel circuit. More specific structure examples of the substrate 101 will be described later.

The substrate 101 and the pixel electrode 111 of the light-emitting element 110 are electrically connected to each other through the plug 131. The plug 131 is formed to be embedded in an opening provided in the insulating layer 105. The pixel electrode 111 is provided in contact with the top surface of the plug 131.

Although FIG. 1A illustrates the structure in which the groove is provided between the light-emitting elements of different colors, the present invention is not limited thereto. For example, the groove may be provided between the light-emitting elements of different colors and between the light-emitting elements of the same color.

Figure 3A:
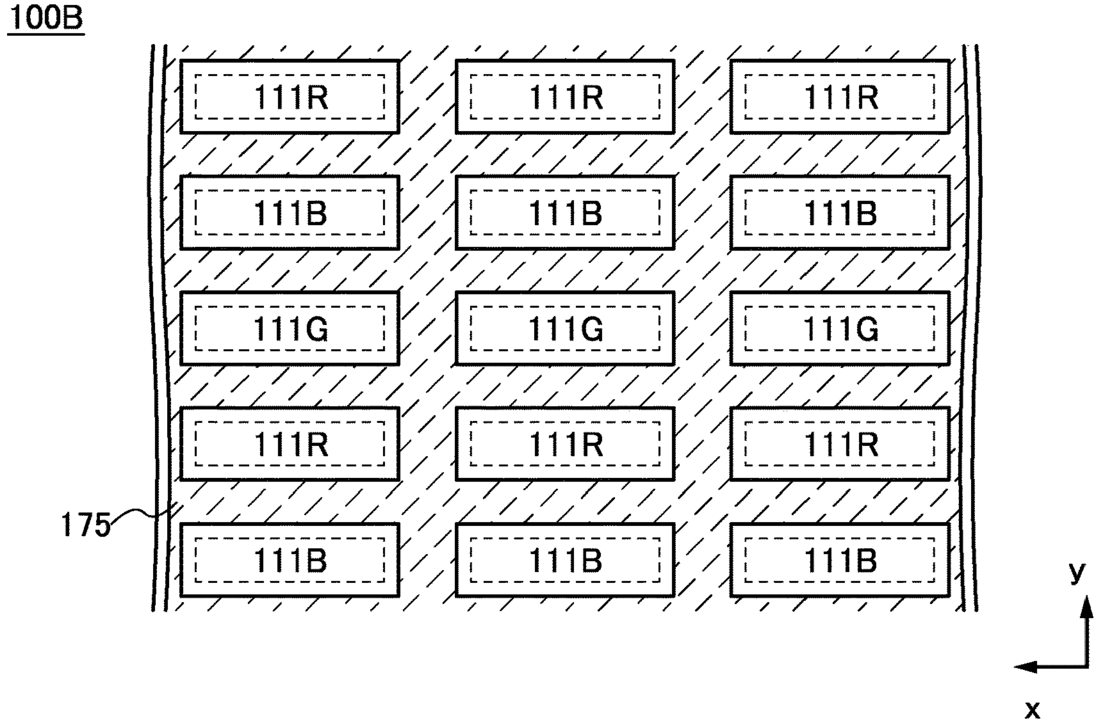
FIG. 3A and FIG. 3B are diagrams illustrating structure examples of display devices.

FIG. 3A is a schematic top view of a display device 100B. The display device 100B illustrated in FIG. 3A differs from the display device 100A illustrated in FIG. 1A in the shape of the groove.

As illustrated in FIG. 3A, the groove may be provided between the light-emitting elements of the same color as well as between the light-emitting elements of different colors. In other words, the groove may be formed between the light-emitting elements adjacent in the x direction as well as between the light-emitting elements adjacent in the y direction. For example, as illustrated in FIG. 3A, part of the groove 175 may be positioned below all the end portions of the pixel electrodes 111. In other words, the groove 175 preferably has a region positioned below the pixel electrode 111 in the cross-sectional view in the y direction and a region positioned below the pixel electrode 111 in the cross-sectional view in the x direction. With such a structure, the groove 175 can be formed regardless of the alignment margin for the groove 175 with respect to the pixel electrode 111. Furthermore, leakage current between the adjacent light-emitting elements of different colors and leakage current between the adjacent light-emitting elements of the same color can be prevented.

Although the preferable arrangement of the light-emitting elements 110 (the pixel electrodes 111) is stripe arrangement, arrangement other than the stripe arrangement may be employed. Examples of the arrangement of the light-emitting elements 110 (the pixel electrodes 111) include delta arrangement and mosaic arrangement.

Figure 3B:
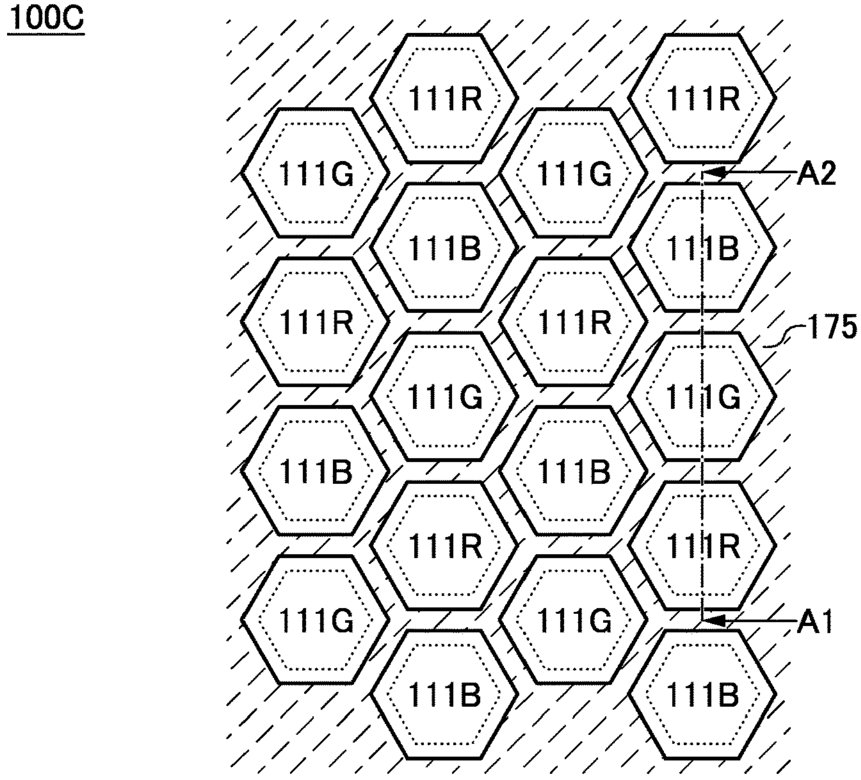

FIG. 3B is a schematic top view of a display device 100C. The display device in FIG. 3B differs from the display device 100B illustrated in FIG. 3A in that the arrangement of the pixel electrodes 111 (the light-emitting elements 110) is delta arrangement. For example, when the groove 175 illustrated in FIG. 3B is provided, the organic layers 112 can be separated from each other.

There is no particular limitation on the shape of the groove 175 as long as part of the groove 175 is positioned below the pixel electrode 111. For example, in the cross-sectional view of the display device, the groove 175 may have a downward-convex arc shape (see FIG. 1*i*), or a shape with a flat bottom surface and a downward-convex arc sidewall. Alternatively, the groove 175 may have a cross shape, a T shape, or an inverted T shape.

Note that the shape of the groove 175 is not limited to the above shapes as long as the organic layer is divided. For example, the groove 175 does not necessarily have the region positioned below the pixel electrode 111 in some cases. For example, the groove 175 may have a cross shape, a T shape, or an inverted T shape in the cross-sectional view of the display device.

A single-layer structure or a stacked-layer structure of two or more layers is preferably selected as appropriate as the structure of the insulating layer 105 depending on the shape of the groove 175. The insulating layer 105 can be an insulating layer containing an inorganic material. Note that the insulating layer 105 may be an insulating layer containing an organic material.

Hereinafter, the groove 175 having a shape different from the shape illustrated in FIG. 1B will be described.

Structure Example 1-2

Figure 4A:
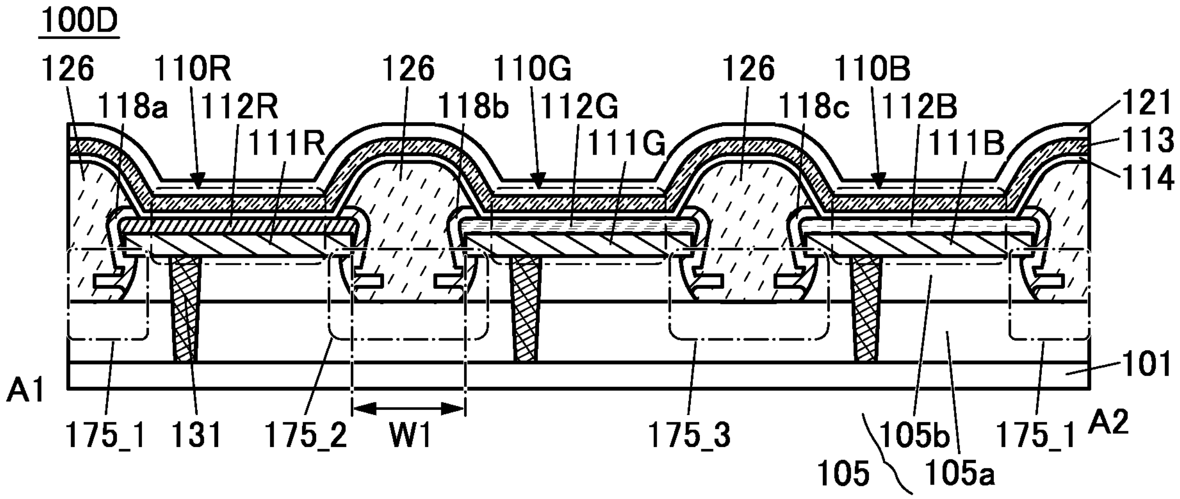
FIG. 4A and FIG. 4B are diagrams illustrating a structure example of a display device.

FIG. 4A is a schematic cross-sectional view of a display device 100D.

The display device 100D differs from the display device 100A in the shape of the groove 175. Specifically, the groove 175 included in the display device 100D has a shape with a flat bottom surface and a downward-convex arc sidewall in the cross-sectional view of the display device 100D.

Figure 4B:
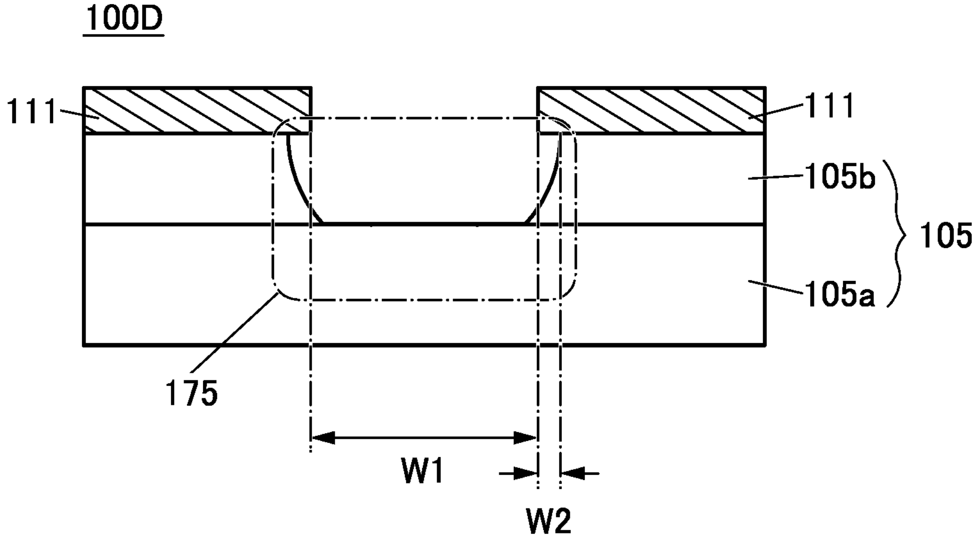

FIG. 4B is a schematic cross-sectional view of the groove 175 and its vicinity in the display device 100D. Note that for clarity of the drawing, some components (the insulating layer 118, the organic layer 112, and the like) are omitted in FIG. 4B.

The width W1 illustrated in FIG. 4B is the width of the groove 175 in the region not overlapping with the pixel electrode 111 in the A1-A2 direction. Note that in the display device 100D illustrated in FIG. 4B, the width W1 can be rephrased as the shortest distance between the end portions of the pixel electrodes 111 that face each other. The width W2 illustrated in FIG. 4B is the width of the groove 175 in the region overlapping with the pixel electrode 111 in the A1-A2 direction.

The insulating layer 105 includes an insulating layer 105*a* and an insulating layer 105*b* over the insulating layer 105*a*. That is, the insulating layer 105 has a stacked-layer structure of two layers. As the insulating layer 105*a*, it is preferable to select an insulator that functions as an etching stopper film at the time when the groove 175 is formed by etching the insulating layer 105*b*. For example, in the case where silicon oxide or silicon oxynitride is used for the insulating layer

105*b*, it is preferable to use silicon nitride, aluminum oxide, hafnium oxide, or the like for the insulating layer 105*a*.

With the groove 175 having the above shape, the organic layers 112 can be separated between the adjacent light-emitting elements of different colors without using a shadow mask such as a metal mask. Accordingly, leakage current between the adjacent light-emitting elements of different colors can be prevented. Thus, display with a high contrast can be performed as described above. Furthermore, an improvement in efficiency, a reduction in power consumption, and an improvement in reliability are facilitated.

The insulating layer 105 having the above structure can prevent the depth of the groove 175 from becoming too large even when the width W1 illustrated in FIG. 4B is large. Thus, the degree of freedom in the shape (e.g., width and depth) of the groove 175 can be increased. Note that the description of the width W1 illustrated in FIG. 2B can be referred to for the preferable range of the width W1 illustrated in FIG. 4B. The description of the width W2 illustrated in FIG. 2A can be referred to for the preferable range of the width W2 illustrated in FIG. 4B.

The depth of the groove 175 is preferably larger than the thickness of the organic layer 112. Such a structure can cause disconnection of the organic layer 112. Note that in the structure illustrated in FIG. 4A, the depth of the groove 175 corresponds to the thickness of the insulating layer 105*b*.

Although the insulating layer 105 has the stacked-layer structure of the two layers of the insulating layer 105*a* and the insulating layer 105*b* in the display device 100D, the present invention is not limited thereto. For example, the insulating layer 105 may have a stacked-layer structure of three or more layers, or one or both of the insulating layer 105*a* and the insulating layer 105*b* may have a stacked-layer structure.

Structure Example 1-3

Figure 5A:
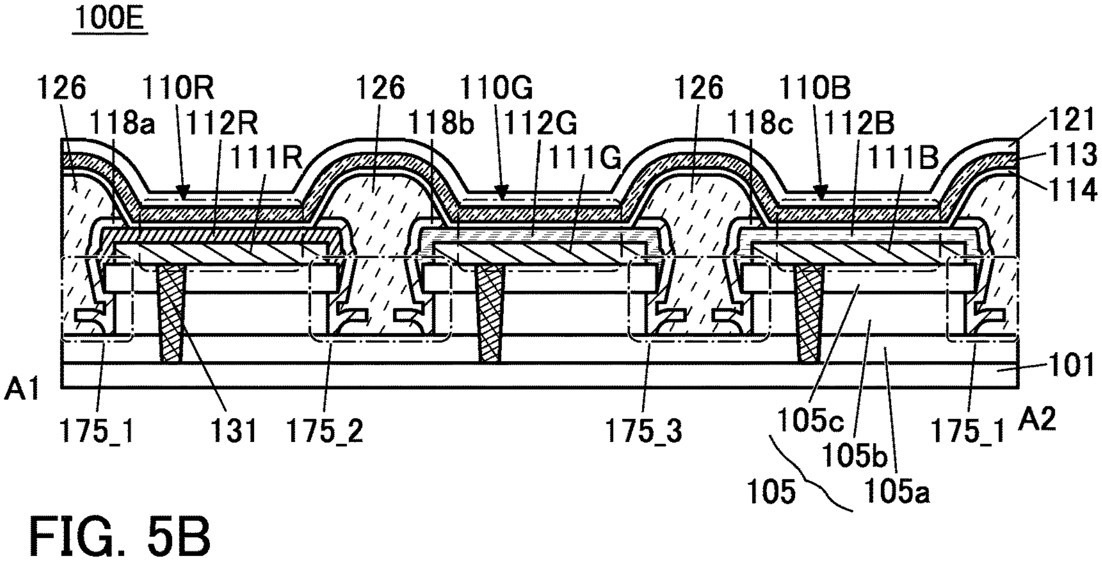
FIG. 5A to FIG. 5C are diagrams illustrating structure examples of display devices.
Figure 5B:
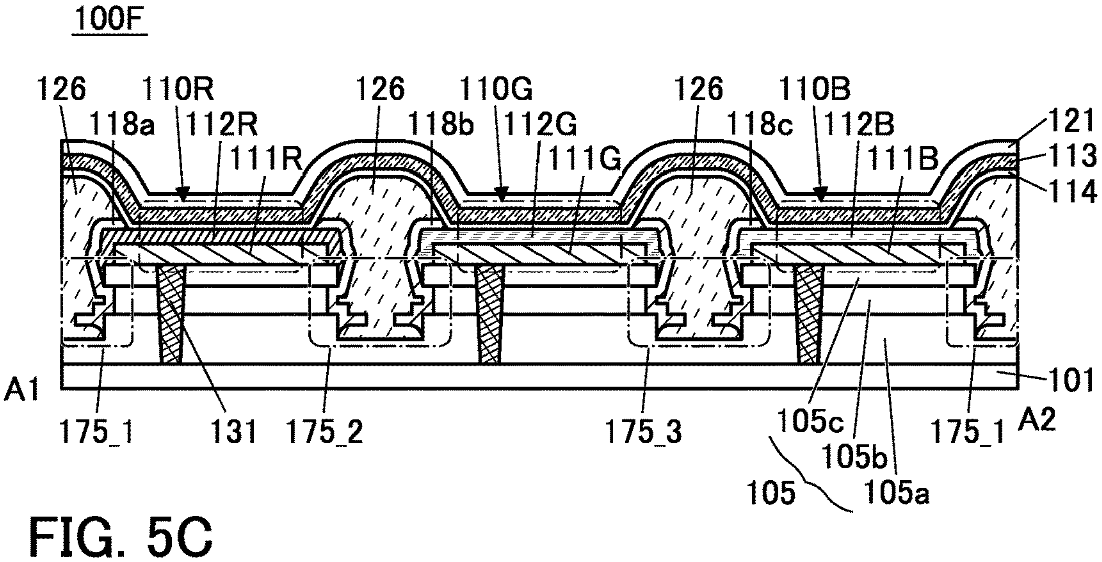

FIG. 5A and FIG. 5B are schematic cross-sectional views of a display device 100E and a display device 100F. The display device 100E and the display device 100F differ from the display device 100A in the shape of the groove 175.

As illustrated in FIG. 5A, the groove 175 included in the display device 100E has an inverted T shape in the cross-sectional view of the display device 100E. As illustrated in FIG. 5B, the groove 175 included in the display device 100F has a cross shape in the cross-sectional view of the display device 100F.

Figure 5C:
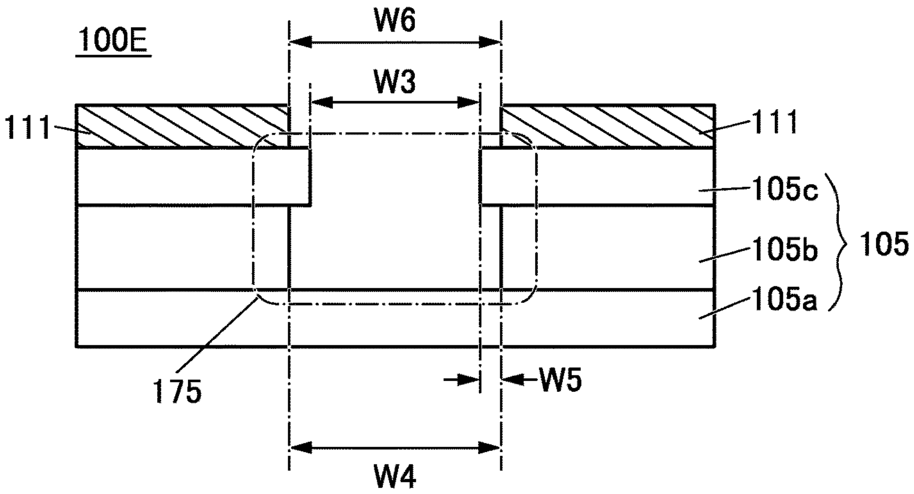

FIG. 5C is a schematic cross-sectional view of the groove 175 and its vicinity in the display device 100E. Note that for clarity of the drawing, some components (the insulating layer 118, the organic layer 112, and the like) are omitted in FIG. 5C.

In the cross-sectional view of the display device, the groove 175 has a region having a first width and a region having a second width. Here, the first width is a width W3 illustrated in FIG. 5C, and the second width is a width W4 illustrated in FIG. 5C. As illustrated in FIG. 5C, the half of the difference between the width W4 and the width W3 is a width W5, and the shortest distance between the end portions of the pixel electrodes 111 that face each other is a distance W6.

It is preferable that the first width be smaller than the distance W6 and that the second width be larger than the first width. In other words, it is preferable that the width W3 be smaller than the distance W6 and that the width W4 be larger than the width W3. Thus, disconnection of the organic layer 112 can be caused.

Note that in the case where the groove 175 has the inverted T shape illustrated in FIG. 5A or the cross shape illustrated in FIG. 5B, there is no particular limitation on whether the width W4 or the distance W6 is larger. The width W4 may be smaller than the distance W6, equal to the distance W6, or larger than the distance W6. In the case where the width W4 is smaller than the distance W6, for example, the groove 175 is not positioned below the pixel electrode 111.

As illustrated in FIG. 5A and FIG. 5B, the insulating layer 105 preferably has a stacked-layer structure of the insulating layer 105*a*, the insulating layer 105*b*, and an insulating layer 105*c*. In addition, the etching rate of a material used for the insulating layer 105*b* is preferably different from that of a material used for the insulating layer 105*a* and the insulating layer 105*c*. With such a structure, the groove 175 with the shape illustrated in FIG. 5A or FIG. 5B can be formed.

With the groove 175 having the above shape, the organic layers 112 can be separated between the adjacent light-emitting elements of different colors without using a shadow mask such as a metal mask. Accordingly, leakage current between the adjacent light-emitting elements of different colors can be prevented. Thus, display with a high contrast can be performed as described above. Furthermore, an improvement in efficiency, a reduction in power consumption, and an improvement in reliability are facilitated.

The width W5 corresponds to the width W2 illustrated in FIG. 2B. Thus, the description of the width W2 illustrated in FIG. 2A can be referred to for the preferable range of the width W5.

In the display device 100E, the thickness of the insulating layer 105*b* is preferably larger than the thickness of the organic layer 112. In the display device 100F, the sum of the thickness of the insulating layer 105*b* and the depth of the groove provided in the insulating layer 105*a* is preferably larger than the thickness of the organic layer 112. This structure can cause disconnection of the organic layer 112.

Although FIG. 5A illustrates the structure in which the thickness of the insulating layer 105*b* is larger than the thickness of the insulating layer 105*c*, there is no particular limitation on whether the thickness of the insulating layer 105*b* or the thickness of the insulating layer 105*c* is larger as long as disconnection of the organic layer 112 is caused. The thickness of the insulating layer 105*b* may be equal to the thickness of the insulating layer 105*c*, or the thickness of the insulating layer 105*b* may be smaller than the thickness of the insulating layer 105*c*. Similarly, there is no particular limitation on whether the thickness of the insulating layer 105*a* or the thickness of the insulating layer 105*c* is larger. Similarly, there is no particular limitation on whether the thickness of the insulating layer 105*a* or the thickness of the insulating layer 105*b* is larger.

Although FIG. 5A and FIG. 5B illustrate the structure in which the insulating layer 105 has the stacked-layer structure of the three layers of the insulating layer 105*a*, the insulating layer 105*b*, and the insulating layer 105*c*, the structure of the insulating layer 105 is not limited thereto. For example, the insulating layer 105 may have a stacked-layer structure of two layers or four or more layers, or any one or more of the insulating layer 105*a*, the insulating layer 105*b*, and the insulating layer 105*c* may have a stacked-layer structure.

[Components]

[Light-Emitting Element]

As a light-emitting element that can be used as the light-emitting element 110, a self-luminous element can be used, and an element whose luminance is controlled by current or voltage is included in the category. For example, an LED, an organic EL element, an inorganic EL element, or the like can be used. In particular, an organic EL element is preferably used.

The light-emitting element has a top-emission structure, a bottom-emission structure, a dual-emission structure, or the like. A conductive film that transmits visible light is used as an electrode through which light is extracted. A conductive film that reflects visible light is used as an electrode through which no light is extracted.

In one embodiment of the present invention, a top-emission light-emitting element in which light is emitted to the opposite side of the formation surface or a dual-emission light-emitting element can be particularly suitably used.

The organic layer 112 includes at least a light-emitting layer. In addition to the light-emitting layer, the organic layer 112 may further include layers containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used for the organic layer 112, and an inorganic compound may be contained. The layers that constitute the organic layer 112 can each be formed by a method such as an evaporation method (including a vacuum evaporation method), a transfer method, a printing method, an inkjet method, or a coating method.

When a voltage higher than the threshold voltage of the light-emitting element 110 is applied between a cathode and an anode, holes are injected to the organic layer 112 from the anode side and electrons are injected to the organic layer 112 from the cathode side. The injected electrons and holes are recombined in the organic layer 112 and a light-emitting substance contained in the organic layer 112 emits light.

In the case where a light-emitting element emitting white light is used as the light-emitting element 110, the organic layer 112 preferably contains two or more kinds of light-emitting substances. For example, white light emission can be obtained by selecting light-emitting substances such that two or more light-emitting substances emit light of complementary colors. For example, it is preferable to contain two or more out of light-emitting substances emitting light of R (red), G (green), B (blue), Y (yellow), O (orange), and the like or light-emitting substances emitting light containing two or more of spectral components of R, G, and B. A light-emitting element whose emission spectrum has two or more peaks in the wavelength range of a visible light region (e.g., 350 nm to 750 nm) is preferably employed. An emission spectrum of a material emitting light having a peak in a yellow wavelength range preferably includes spectral components also in green and red wavelength ranges.

The organic layer 112 preferably has a structure in which a light-emitting layer containing a light-emitting material emitting light of one color and a light-emitting layer containing a light-emitting material emitting light of another color are stacked. For example, the plurality of light-emitting layers in the organic layer 112 may be stacked in contact with each other or may be stacked with a region not containing any light-emitting material therebetween. For example, between a fluorescent light-emitting layer and a phosphorescent light-emitting layer, a region that contains the same material as the fluorescent light-emitting layer or phosphorescent light-emitting layer (for example, a host material or an assist material) and no light-emitting material may be provided. This facilitates the fabrication of the light-emitting element and reduces the drive voltage.

The light-emitting element 110 may be a single element including one EL layer or a tandem element in which a plurality of EL layers are stacked with a charge-generation layer therebetween.

A device having a single structure includes one light-emitting unit between a pair of electrodes, and the light-emitting unit preferably includes one or more light-emitting layers. When white light emission is obtained using two light-emitting layers, the two light-emitting layers are selected such that emission colors of the two light-emitting layers are complementary colors. For example, when an emission color of a first light-emitting layer and an emission color of a second light-emitting layer are complementary colors, the light-emitting element can be configured to emit white light as a whole. When white light emission is obtained using three or more light-emitting layers, the light-emitting element is configured to emit white light as a whole by combining emission colors of the three or more light-emitting layers.

A device having a tandem structure includes two or more light-emitting units between a pair of electrodes, and each light-emitting unit preferably includes one or more light-emitting layers. To obtain white light emission, the structure is made such that light from light-emitting layers of the plurality of light-emitting units can be combined to be white light. Note that a structure for obtaining white light emission is similar to a structure in the case of a single structure. In the device having a tandem structure, it is suitable that an intermediate layer such as a charge-generation layer is provided between the plurality of light-emitting units.

Figure 6A:
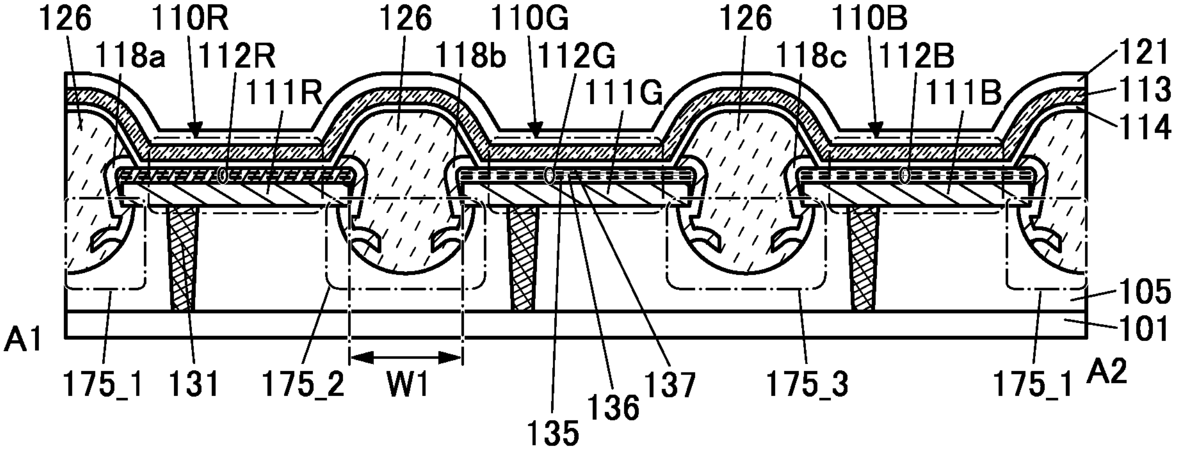
FIG. 6A and FIG. 6B are diagrams illustrating a structure example of a display device.
Figure 6B:
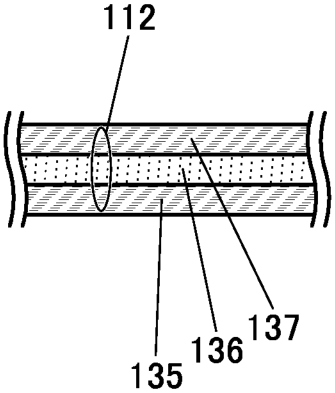

FIG. 6A illustrates an example in which a light-emitting element having a tandem structure (a structure including a plurality of light-emitting units) is used for the display device 100A illustrated in FIG. 1B. FIG. 6B is an enlarged view of the organic layer 112. Each of the light-emitting units includes at least one light-emitting layer. Each of the light-emitting units may also include one or more of a hole-injection layer, a hole-transport layer, a hole-blocking layer, an electron-blocking layer, an electron-transport layer, and an electron-injection layer. A charge-generation layer (also referred to as an intermediate layer) is preferably provided between the light-emitting units.

For example, the organic layer 112R includes a plurality of light-emitting units that emit red light, the organic layer 112G includes a plurality of light-emitting units that emit green light, and the organic layer 112B includes a plurality of light-emitting units that emit blue light.

The organic layer 112R, the organic layer 112G, and the organic layer 112B each include, for example, a first light-emitting unit 135, a charge-generation layer 136 over the first light-emitting unit 135, and a second light-emitting unit 137 over the charge-generation layer 136. The charge-generation layer 136 includes at least a charge-generation region.

The first light-emitting unit 135 preferably includes a carrier-transport layer (an electron-transport layer or a hole-transport layer) and a light-emitting layer over the carrier-transport layer. Alternatively, the first light-emitting unit 135 preferably includes a carrier-blocking layer (a hole-blocking layer or an electron-blocking layer) and a light-emitting layer over the carrier-blocking layer. Alternatively, the first light-emitting unit 135 preferably includes a carrier-transport layer, a carrier-blocking layer over the carrier-transport layer, and a light-emitting layer over the carrier-blocking layer.

The second light-emitting unit 137 preferably includes a light-emitting layer and a carrier-transport layer (an electron-transport layer or a hole-transport layer) over the light-emitting layer. Alternatively, the second light-emitting unit 137 preferably includes a light-emitting layer and a carrier-blocking layer (a hole-blocking layer or an electron-blocking layer) over the light-emitting layer. Alternatively, the second light-emitting unit 137 preferably includes a light-emitting layer, a carrier-blocking layer over the light-emitting layer, and a carrier-transport layer over the carrier-blocking layer. Since the surface of the second light-emitting unit 137 is exposed in the fabrication process of the display device, providing one or both of the carrier-transport layer and the carrier-blocking layer over the light-emitting layer inhibits the light-emitting layer from being exposed on the outermost surface, so that damage to the light-emitting layer can be reduced. As a result, the reliability of the light-emitting element can be improved. Note that in the case where three or more light-emitting units are provided, the uppermost light-emitting unit preferably includes a light-emitting layer and one or both of a carrier-transport layer and a carrier-blocking layer over the light-emitting layer.

The common layer 114 includes, for example, an electron-injection layer or a hole-injection layer. Alternatively, the common layer 114 may include a stack of an electron-transport layer and an electron-injection layer, and may include a stack of a hole-transport layer and a hole-injection layer. The common layer 114 is shared by the light-emitting element 110R, the light-emitting element 110G, and the light-emitting element 110B.

When the white-light-emitting element (having a single structure or a tandem structure) and a light-emitting element having an SBS structure are compared to each other, the light-emitting element having an SBS structure can have lower power consumption than the white-light-emitting element. To reduce power consumption, a light-emitting element having an SBS structure is preferably used. Meanwhile, the white-light-emitting element is preferable in terms of lower manufacturing cost or higher manufacturing yield because the manufacturing process of the white-light-emitting element is simpler than that of a light-emitting element having an SBS structure.

The conductive film that can be used for the pixel electrode 111 or the like and transmits visible light can be formed using, for example, indium oxide, indium tin oxide, indium zinc oxide, zinc oxide, or zinc oxide to which gallium is added. Alternatively, a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like formed thin enough to have a light-transmitting property can be used. A stacked film of any of the above materials can be used for the conductive layer. For example, a stacked film of indium tin oxide and an alloy of silver and magnesium is preferably used, in which case conductivity can be increased. Further alternatively, graphene or the like may be used.

For a portion of the pixel electrode 111 that is positioned on the organic layer 112 side, the conductive film that reflects visible light is preferably used. For the conductive film, for example, a metal material such as aluminum, gold, platinum, silver, nickel, tungsten, chromium, molybdenum, iron, cobalt, copper, or palladium or an alloy containing any of these metal materials can be used. Silver is preferable because of its high reflectance with respect to visible light. In addition, aluminum is preferable because an aluminum electrode is easily etched and thus is easily processed and aluminum has high reflectance with respect to visible light and near-infrared light. Lanthanum, neodymium, germanium, or the like may be added to the above metal material or alloy. Alternatively, an alloy (an aluminum alloy) containing aluminum and titanium, nickel, or neodymium may be used. Alternatively, an alloy containing silver and copper, palladium, or magnesium may be used. An alloy containing silver and copper is preferable because of its high heat resistance.

The pixel electrode 111 may have a structure in which a conductive metal oxide film is stacked over a conductive film that reflects visible light. Such a structure can inhibit oxidation, corrosion, or the like of the conductive film that reflects visible light. For example, when a metal film or a metal oxide film is stacked in contact with an aluminum film or an aluminum alloy film, oxidation can be inhibited. Examples of a material for the metal film or the metal oxide film include titanium and titanium oxide. Alternatively, the above conductive film that transmits visible light and a film containing a metal material may be stacked. For example, a stacked film of silver and indium tin oxide or a stacked film of an alloy of silver and magnesium and indium tin oxide can be used.

When aluminum is used for the pixel electrode 111, the thickness of aluminum is preferably larger than or equal to 40 nm, further preferably larger than or equal to 70 nm, in which case the reflectance with respect to visible light or the like can be sufficiently increased. When silver is used for the pixel electrode 111, the thickness of silver is preferably larger than or equal to 70 nm, further preferably larger than or equal to 100 nm, in which case the reflectance with respect to visible light or the like can be sufficiently increased.

As the conductive film having a light-transmitting property and a reflective property that can be used for the common electrode 113, the conductive film reflecting visible light that is formed to be thin enough to transmit visible light can be used. In addition, with a stacked-layer structure of the conductive film and the conductive film transmitting visible light, the conductivity, the mechanical strength, or the like can be increased.

The conductive film having a light-transmitting property and a reflective property preferably has a reflectance with respect to visible light (e.g., the reflectance with respect to light having a predetermined wavelength within the range of 400 nm to 700 nm) that is higher than or equal to 20% and lower than or equal to 80%, preferably higher than or equal to 40% and lower than or equal to 70%. The conductive film having a reflective property preferably has a reflectance with respect to visible light that is higher than or equal to 40% and lower than or equal to 100%, further preferably higher than or equal to 70% and lower than or equal to 100%. The conductive film having a light-transmitting property preferably has a reflectance with respect to visible light that is higher than or equal to 0% and lower than or equal to 40%, further preferably higher than or equal to 0% and lower than or equal to 30%.

For the pixel electrode 111 functioning as the lower electrode, for example, a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used. This material can be suitably used as a conductive film of the plug 131.

The electrodes constituting the light-emitting elements may each be formed by an evaporation method, a sputtering method, or the like. Alternatively, a discharging method such as an inkjet method, a printing method such as a screen printing method, or a plating method may be used for the formation.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may contain an inorganic compound such as a quantum dot or a high molecular compound (e.g., an oligomer, a dendrimer, or a polymer). For example, when used for the light-emitting layer, the quantum dots can function as a light-emitting material.

Note that as the quantum dot material, a colloidal quantum dot material, an alloyed quantum dot material, a core-shell quantum dot material, a core quantum dot material, or the like can be used. A material containing elements belonging to Group 12 and Group 16, elements belonging to Group 13 and Group 15, or elements belonging to Group 14 and Group 16 may be used. Alternatively, a quantum dot material containing an element such as cadmium, selenium, zinc, sulfur, phosphorus, indium, tellurium, lead, gallium, arsenic, or aluminum may be used.

In each of the light-emitting elements, the optical distance between the surface of the reflective layer reflecting visible light and the common electrode 113 having properties of transmitting and reflecting visible light is preferably adjusted to be $m\times\lambda/2$ (m is an integer greater than or equal to 1) or in the vicinity thereof, where A is the wavelength of light whose intensity is desired to be increased.

To be exact, the above-described optical distance depends on a product of the physical distance between the reflective surface of the reflective layer and the reflective surface of the common electrode 113 having a light-transmitting property and a reflective property and the refractive index of a layer provided therebetween, and thus is difficult to adjust precisely. Thus, it is preferable to adjust the optical distance on the assumption that the surface of the reflective layer and the surface of the common electrode 113 having a light-transmitting property and a reflective property are each the reflective surface.

Examples of a material that can be used for the plug 131 include metals such as aluminum, titanium, chromium, nickel, copper, yttrium, zirconium, molybdenum, gold, silver, platinum, magnesium, iron, cobalt, palladium, tantalum, and tungsten; an alloy containing any of these metal materials; and a nitride of any of these metal materials. As the plug 131, a single layer or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used because it increases controllability of a shape by etching.

[Fabrication Method Example]

An example of a method for fabricating the display device of one embodiment of the present invention will be described with reference to drawings.

Note that thin films that constitute the display device (insulating films, semiconductor films, conductive films, and the like) can be formed by a sputtering method, a CVD method, a vacuum evaporation method, a PLD method, an ALD method, or the like. Examples of the CVD method include a plasma-enhanced chemical vapor deposition (PECVD: Plasma Enhanced CVD) method and a thermal CVD method. An example of the thermal CVD method is a metal organic chemical vapor deposition (MOCVD) method.

Alternatively, thin films that constitute the display device (insulating films, semiconductor films, conductive films, and the like) can be formed by a wet deposition method such as spin coating, dipping, spray coating, ink-jetting, dispensing, screen printing, offset printing, a doctor knife, a slit coater, a roll coater, a curtain coater, or a knife coater.

When the thin films that constitute the display device are processed, a photolithography method or the like can be used for the processing. Besides, a nanoimprinting method, a sandblasting method, a lift-off method, or the like may be used for the processing of the thin films. Alternatively, island-shaped thin films may be directly formed by a deposition method using a shielding mask such as a metal mask.

There are the following two typical examples of a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for light exposure in a photolithography method, it is possible to use light with an i-line (wavelength: 365 nm), light with a g-line (wavelength: 436 nm), light with an h-line (wavelength: 405 nm), or combined light of any of them. Alternatively, ultraviolet light, KrF laser light, ArF laser light, or the like can be used. Light exposure may be performed by liquid immersion exposure technique. As the light used for the light exposure, extreme ultraviolet (EUV) light or X-rays may be used. Furthermore, instead of the light used for the light exposure, an electron beam can also be used. It is preferable to use extreme ultraviolet light, X-rays, or an electron beam because extremely fine processing can be performed. Note that a photomask is not needed when light exposure is performed by scanning with a beam such as an electron beam.

For processing of the thin film, a dry etching method, a wet etching method, a sandblasting method, or the like can be used. Note that the resist mask can be removed by dry etching treatment such as ashing, wet etching treatment, wet etching treatment after dry etching treatment, or dry etching treatment after wet etching treatment.

For the planarization treatment of the thin film, typically, a polishing method such as a chemical mechanical polishing (CMP) method can be suitably used. Alternatively, dry etching treatment or plasma treatment may be used. Note that polishing treatment, dry etching treatment, or plasma treatment may be performed a plurality of times, or these treatments may be performed in combination. In the case where the treatments are performed in combination, the order of steps is not particularly limited and may be set as appropriate depending on the roughness of the surface to be processed.

In order to accurately process the thin film to have a desired thickness, for example, the CMP method is employed. In that case, first, polishing is performed at a constant processing rate until part of the top surface of the thin film is exposed. After that, polishing is performed under a condition with a lower processing rate until the thin film has a desired thickness, so that highly accurate processing can be performed.

Examples of a method for detecting the end of the polishing include an optical method in which the surface to be processed is irradiated with light and a change in the reflected light is detected; a physical method in which a change in the polishing resistance received by the processing apparatus from the surface to be processed is detected; and a method in which a magnetic line is applied to the surface to be processed and a change in the magnetic line due to the generated eddy current is used.

After the top surface of the thin film is exposed, polishing treatment is performed under a condition with a low processing rate while the thickness of the thin film is monitored by an optical method using a laser interferometer or the like, whereby the thickness of the thin film can be controlled with high accuracy. Note that the polishing treatment may be performed a plurality of times until the thin film has a desired thickness, as necessary.

[Fabrication Method Example]

An example of a method for fabricating the display device of one embodiment of the present invention will be described below using the display device 100A exemplified in the above structure example.

{Preparation for Substrate 101}

As the substrate 101, a substrate having at least heat resistance high enough to withstand the following heat treatment can be used. In the case where an insulating substrate is used as the substrate 101, a glass substrate, a quartz substrate, a sapphire substrate, a ceramic substrate, or the like can be used. Alternatively, a single crystal semiconductor substrate or a polycrystalline semiconductor substrate using silicon or silicon carbide as a material, a compound semiconductor substrate of silicon germanium or the like, a semiconductor substrate such as an SOI substrate, or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

In this embodiment, a substrate including at least a pixel circuit is used as the substrate 101.

{Formation of Insulating Layer 105, Plug 131, and Pixel Electrode 111}

The insulating layer 105 is formed over the substrate 101. Next, an opening reaching the substrate 101 is formed in the insulating layer 105 in a position where the plug 131 is to be formed. The opening is preferably an opening reaching an electrode or a wiring provided in the substrate 101. Then, a conductive film is formed to fill the opening and planarization treatment is performed to expose the top surface of the insulating layer 105. In this manner, the plug 131 embedded in the insulating layer 105 can be formed.

Figure 7A:
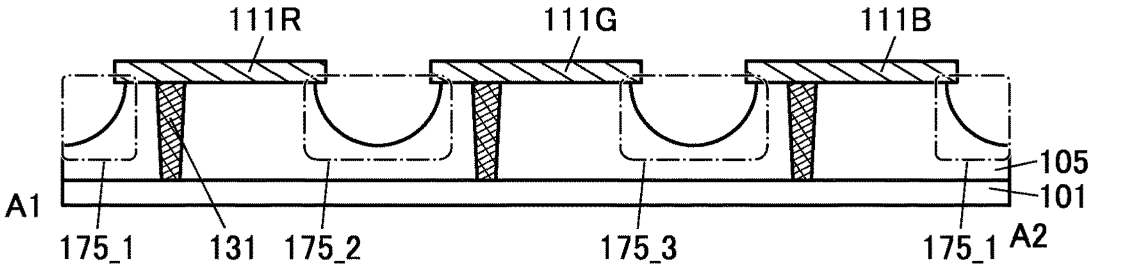
FIG. 7A to FIG. 7D are diagrams illustrating an example of a method for fabricating a display device.

A conductive film is formed over the insulating layer 105 and the plug 131, and an unnecessary portion is removed while a portion overlapping with the plug 131 remains, so that the pixel electrode 111 electrically connected to the plug 131 is formed (see FIG. 7A). An etching method is preferably used for removing the unnecessary portion of the conductive film, for example.

{Formation of Groove 175}

Next, the groove 175 is formed in the insulating layer 105 (see FIG. 7A). The groove 175 can be formed by an isotropic etching method. For example, wet etching treatment or isotropic plasma etching treatment can be used. In particular, in the case where an insulating layer containing an inorganic material is used as the insulating layer 105, wet etching treatment is preferably used. In the case where an insulating layer containing an organic material is used as the insulating layer 105, isotropic dry etching treatment is preferably used. Thus, the groove 175 part of which is positioned below the pixel electrode 111 can be formed.

Note that one groove 175 is provided between light-emitting elements of different colors. As illustrated in FIG. 7A, the groove 175_2 is provided between the pixel electrode 111R and the pixel electrode 111G, the groove 175_3 is provided between the pixel electrode 111G and the pixel electrode 111B, and the groove 175_1 is provided between the pixel electrode 111B and the pixel electrode 111R.

Here, a method for forming the groove 175 included in the display device 100E illustrated in FIG. 5A and the groove 175 included in the display device 100F illustrated in FIG. 5B will be described.

First, a groove having the width W3 is formed in the insulating layer 105*c* and the insulating layer 105*b* to expose the top surface of the insulating layer 105*a*. The groove is preferably formed by an etching method. Note that at the time of forming the groove, part of the top surface of the insulating layer 105*a* in a region overlapping with the groove is removed in some cases.

Next, the side surface of the insulating layer 105*b* exposed in the groove is etched by an isotropic etching method to make the end surface recede (such etching is also referred to as side etching). Thus, the groove in the insulating layer 105*b* extends in the horizontal direction with respect to the substrate surface, so that a region having the width W4 is generated in the groove 175.

In the above manner, the groove 175 included in the display device 100E illustrated in FIG. 5A and the groove 175 included in the display device 100F illustrated in FIG. 5B can be formed.

{Formation of Organic Layer 112R and Insulating Layer 118*a*}

A resist mask 151 is formed over the insulating layer 105, the pixel electrode 111G, and the pixel electrode 111B. At this time, the resist mask 151 is formed in a portion overlapping with part of the groove 175_2, the pixel electrode 111G, the groove 175_3, the pixel electrode 111B, and part of the groove 175_1. The side surface of the resist mask 151 in the groove 175_2 is positioned closer to the pixel electrode 111G side than the middle of the shortest distance between the side surface of the pixel electrode 111R and the side surface of the pixel electrode 111G that face each other; and the side surface of the resist mask 151 in the groove 175_1 is positioned closer to the pixel electrode 111B side than the middle of the shortest distance between the side surface of the pixel electrode 111B and the side surface of the pixel electrode 111R that face each other (see FIG. 7B).

Next, a film containing a first light-emitting compound is formed over the pixel electrode 111R, the insulating layer 105, and the resist mask 151. The film is preferably formed to be positioned inward from the end portion of the groove 175 in the extending direction of the groove 175. In other words, the groove 175 preferably extends beyond the end portion of the film in the extending direction of the groove 175.

The film containing the first light-emitting compound can be formed by, for example, an evaporation method, specifically a vacuum evaporation method. The film may be formed by a method such as a transfer method, a printing method, an inkjet method, or a coating method.

Figure 7B:
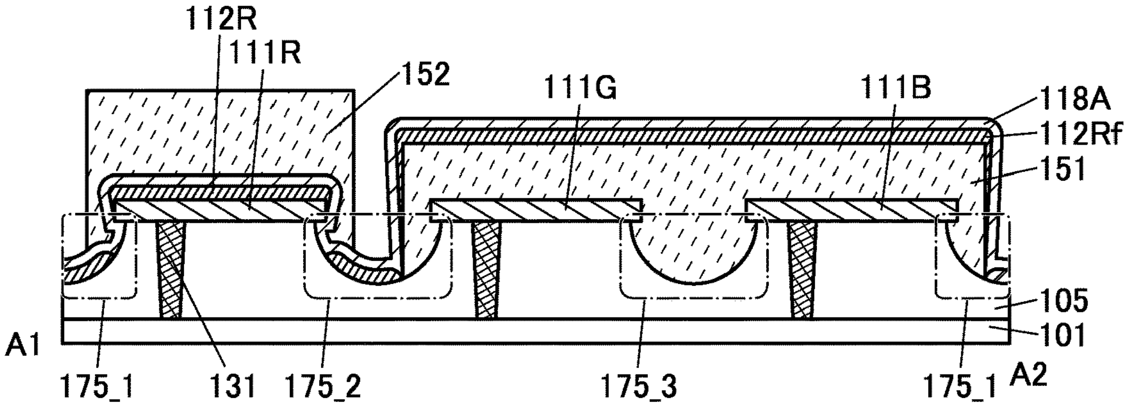

At this time, disconnection of the film containing the first light-emitting compound is caused by the groove in a region not overlapping with the resist mask 151. In FIG. 7B, disconnection of the film is caused by the groove 175_1 and the groove 175_2. As a result, the organic layer 112R is formed over the pixel electrode 111R, and an organic layer 112Rf is formed over the insulating layer 105 and the resist mask 151.

Note that at least the film over the pixel electrode 111R is separated from the film over the groove 175; the film over the resist mask 151 is not necessarily separated from the film over the groove 175. Thus, the end portion of the resist mask 151 is perpendicular to the surface of the substrate 101 in FIG. 7B; however, the shape of the end portion of the resist mask 151 is not limited thereto. The end portion of the resist mask 151 may have a tapered shape or an inverse tapered shape.

Next, an insulating film 118A is formed over the organic layer 112R and the organic layer 112Rf. The insulating film 118A can be formed by a sputtering method, a CVD method, an MBE method, a PLD method, an ALD method, or the like as appropriate. In this embodiment, an aluminum oxide film is formed as the insulating film 118A by an ALD method. It is necessary to form the insulating film 118A to have good coverage on the bottom surface and the side surface of the groove 175 (here, the groove 175_1 and the groove 175_2) provided in the insulating layer 105. By an ALD method, an atomic layer can be deposited one by one on the bottom surface and the side surface of the groove 175, whereby the insulating film 118A can be formed on the groove 175 with good coverage. In addition, deposition damage can be reduced.

For example, in the case where aluminum oxide is deposited by an ALD method, two kinds of gases, $H_2O$ as an oxidizer and a source gas that is obtained by vaporizing liquid containing a solvent and an aluminum precursor compound (trimethylaluminum (TMA, $Al(CH_3)_3$) or the like) are used. Examples of another material include tris(dimethylamide)aluminum, triisobutylaluminum, and aluminum tris(2,2,6,6-tetramethyl-3,5-heptanedionate).

Note that the insulating film 118A may be formed by a sputtering method, a CVD method, or a PECVD method that provides a higher deposition rate than an ALD method. Thus, a highly reliable display device can be fabricated with high productivity.

Then, a resist mask 152 is formed over the insulating film 118A. At this time, the resist mask 152 is formed in a portion overlapping with part of the groove 175_1, the organic layer 112R, and part of the groove 175_2. The side surface of the resist mask 152 in the groove 175_1 is positioned closer to the pixel electrode 111R side than the middle of the shortest distance between the side surface of the pixel electrode 111B and the side surface of the pixel electrode 111R that face each other; and the side surface of the resist mask 152 in the groove 175_2 is positioned closer to the pixel electrode 111R side than the middle of the shortest distance between the side surface of the pixel electrode 111R and the side surface of the pixel electrode 111G that face each other (see FIG. 7B).

The end portion of the resist mask 152 is perpendicular to the surface of the substrate 101 in FIG. 7B; however, the shape of the end portion of the resist mask 152 is not limited thereto. The end portion of the resist mask 152 may have a tapered shape or an inverse tapered shape.

Figure 7C:
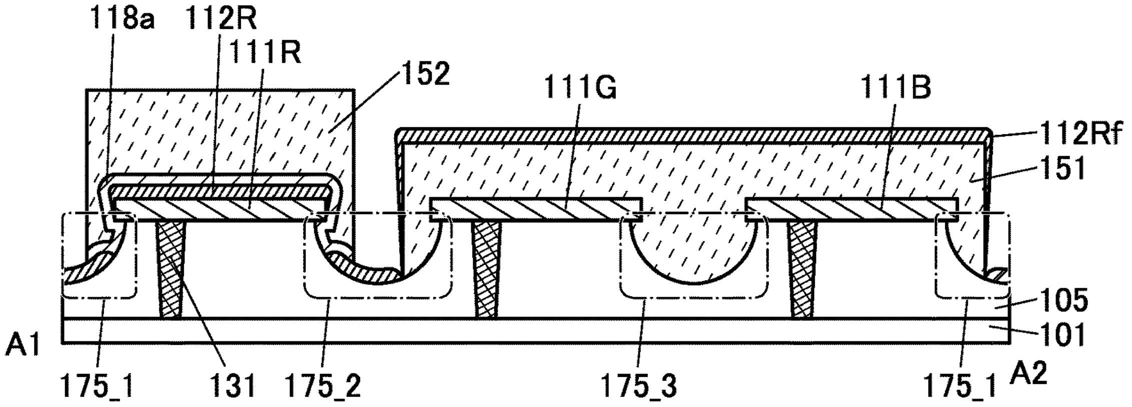

Then, the insulating film 118A in a portion not covered with the resist mask 152 is removed, so that the insulating layer 118*a* can be formed (see FIG. 7C). A dry etching method or a wet etching method can be used for removing part of the insulating film 118A.

Figure 7D:
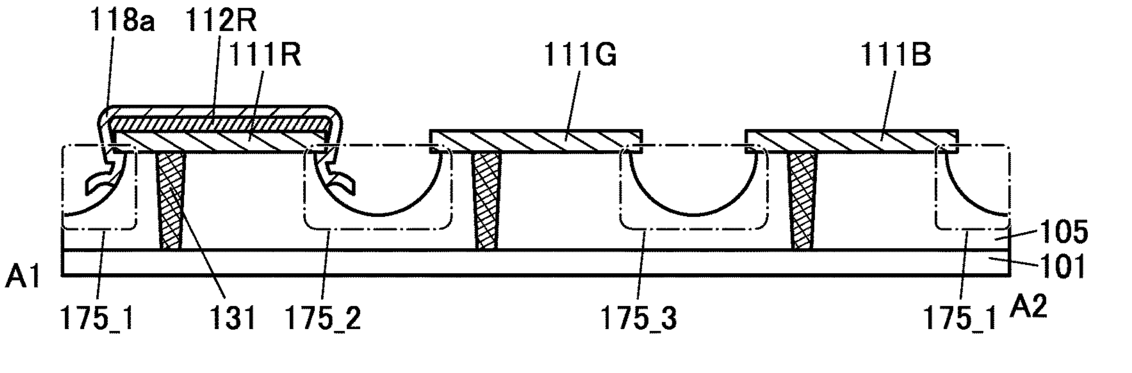

Next, the resist mask 152 and the resist mask 151 are removed (see FIG. 7D). At this time, the organic layer 112Rf is also removed.

In FIG. 7D, the organic layer 112Rf in a portion that overlaps with the resist mask 152 and does not overlap with the pixel electrode 111R is removed. Since the organic layer 112Rf in the portion is separated from the organic layer 112R, the organic layer 112Rf in the portion may remain. In addition, the organic layer 112Rf formed in contact with the insulating layer 105 in the groove 175 may remain.

Accordingly, the insulating layer 118*a* has a region in contact with the insulating layer 105 outside the organic layer 112R and the pixel electrode 111R in the cross-sectional view in the A1-A2 direction. In this specification and the like, a state where a first layer has a region in contact with a second layer outside a structure body is sometimes referred to as a state where the structure body is sealed with the first layer and the second layer. That is, the organic layer 112R and the pixel electrode 111R can be sealed with the insulating layer 105 and the insulating layer 118*a*.

{Formation of Organic Layer 112G and Insulating Layer 118*b*}

The resist mask 151 is formed over the insulating layer 105, the pixel electrode 111B, and the insulating layer 118*a*. At this time, the resist mask 151 is formed in a portion overlapping with part of the groove 175_3, the pixel electrode 111B, the groove 175_1, the insulating layer 118*a*, and part of the groove 175_2. The side surface of the resist mask 151 in the groove 175_3 is positioned closer to the pixel electrode 111B side than the middle of the shortest distance between the side surface of the pixel electrode 111G and the side surface of the pixel electrode 111B that face each other; and the side surface of the resist mask 151 in the groove 175_2 is positioned closer to the pixel electrode 111R side than the middle of the shortest distance between the side surface of the pixel electrode 111R and the side surface of the pixel electrode 111G that face each other (see FIG. 8A).

Next, a film containing a second light-emitting compound is formed over the pixel electrode 111G, the insulating layer 105, and the resist mask 151. The film is preferably formed to be positioned inward from the end portion of the groove 175 in the extending direction of the groove 175. In other words, the groove 175 preferably extends beyond the end portion of the film in the extending direction of the groove 175.

The film containing the second light-emitting compound can be formed by, for example, an evaporation method, specifically a vacuum evaporation method. The film may be formed by a method such as a transfer method, a printing method, an inkjet method, or a coating method.

Figure 8A:
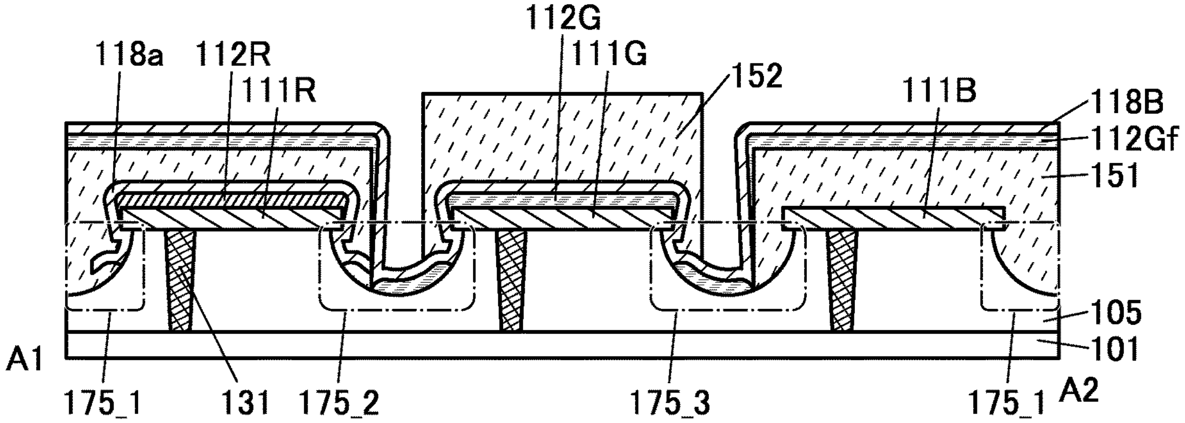
FIG. 8A to FIG. 8C are diagrams illustrating an example of a method for fabricating a display device.

At this time, disconnection of the film containing the second light-emitting compound is caused by the groove in a region not overlapping with the resist mask 151. In FIG. 8A, disconnection of the film is caused by the groove 175_2 and the groove 175_3. As a result, the organic layer 112G is formed over the pixel electrode 111G, and an organic layer 112Gf is formed over the insulating layer 105 and the resist mask 151.

Note that at least the film over the pixel electrode 111G is separated from the film over the groove 175; the film over the resist mask 151 is not necessarily separated from the film over the groove 175. Thus, the end portion of the resist mask 151 is perpendicular to the surface of the substrate 101 in FIG. 8A; however, the shape of the end portion of the resist mask 151 is not limited thereto. The end portion of the resist mask 151 may have a tapered shape or an inverse tapered shape.

Next, an insulating film 118B is formed over the organic layer 112G and the organic layer 112Gf. The insulating film 118B can be formed by a sputtering method, a CVD method, an MBE method, a PLD method, an ALD method, or the like as appropriate. In this embodiment, aluminum oxide is deposited as the insulating film 118B by an ALD method. Accordingly, as described above, the insulating film 118B can be formed to have good coverage on the groove 175 (here, the groove 175_2 and the groove 175_3). For the material and the deposition method that can be used for the insulating film 118B, the description of the insulating film 118A formed over the organic layer 112R can be referred to.

Then, the resist mask 152 is formed over the insulating film 118B. At this time, the resist mask 152 is formed in a portion overlapping with part of the groove 175_2, the organic layer 112G, and part of the groove 175_3. The side surface of the resist mask 152 in the groove 175_2 is positioned closer to the pixel electrode 111G side than the middle of the shortest distance between the side surface of the pixel electrode 111R and the side surface of the pixel electrode 111G that face each other; and the side surface of the resist mask 152 in the groove 175_3 is positioned closer to the pixel electrode 111G side than the middle of the shortest distance between the side surface of the pixel electrode 111G and the side surface of the pixel electrode 111B that face each other (see FIG. 8A).

The end portion of the resist mask 152 is perpendicular to the surface of the substrate 101 in FIG. 8A; however, the shape of the end portion of the resist mask 152 is not limited thereto. The end portion of the resist mask 152 may have a tapered shape or an inverse tapered shape.

Figure 8B:
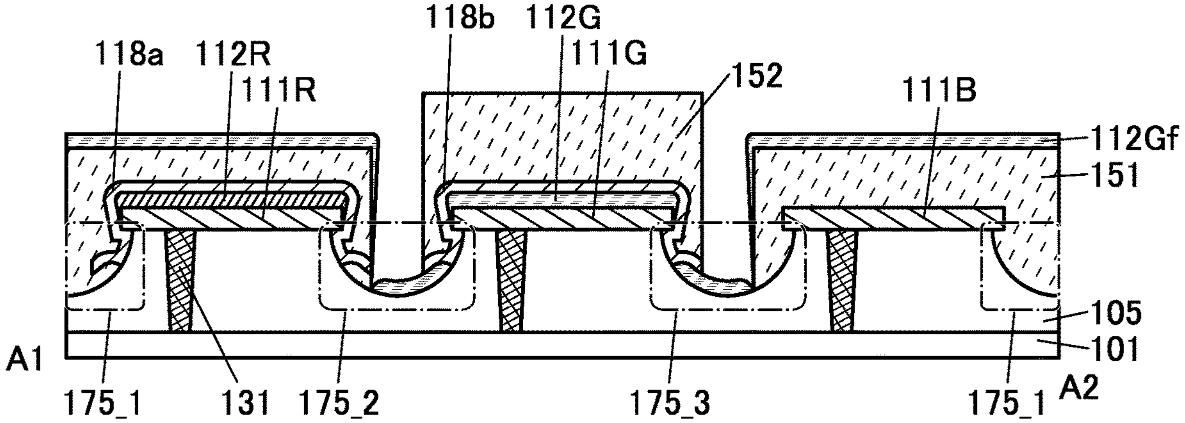

Then, the insulating film 118B in a portion not covered with the resist mask 152 is removed, so that the insulating layer 118*b* can be formed (see FIG. 8B). A dry etching method or a wet etching method can be used for removing part of the insulating film 118B.

Figure 8C:
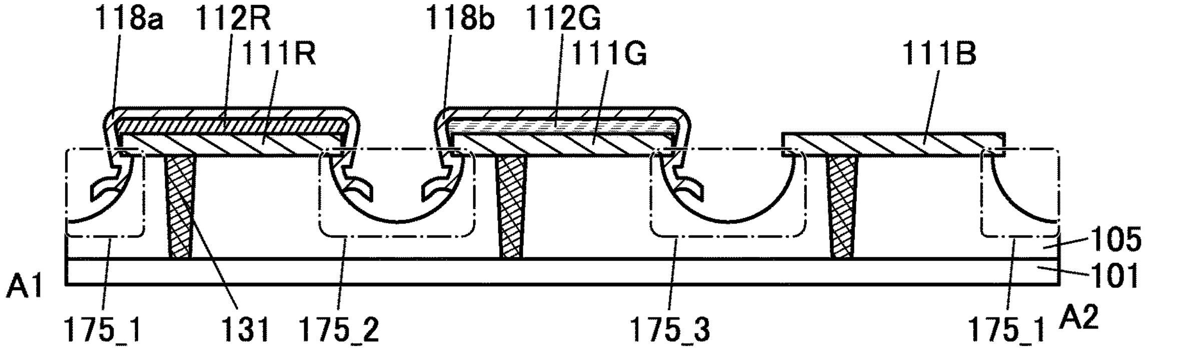

Next, the resist mask 152 and the resist mask 151 are removed (see FIG. 8C). At this time, the organic layer 112Gf is also removed.

In FIG. 8C, the organic layer 112Gf in a portion that overlaps with the resist mask 152 and does not overlap with the pixel electrode 111G is removed. Since the organic layer 112Gf in the portion is separated from the organic layer 112G, the organic layer 112Gf in the portion may remain. In addition, the organic layer 112Gf formed in contact with the insulating layer 105 in the groove 175 may remain.

In the above manner, the organic layer 112G and the pixel electrode 111G can be sealed with the insulating layer 105 and the insulating layer 118*b*.

{Formation of Organic Layer 112B and Insulating Layer 118*c*}

The resist mask 151 is formed over the insulating layer 105, the insulating layer 118*a*, and the insulating layer 118*b*. At this time, the resist mask 151 is formed in a portion overlapping with part of the groove 175_1, the insulating layer 118*a*, the groove 175_2, the insulating layer 118*b*, and part of the groove 175_3. The side surface of the resist mask 151 in the groove 175_1 is positioned closer to the pixel electrode 111R side than the middle of the shortest distance between the side surface of the pixel electrode 111B and the side surface of the pixel electrode 111R that face each other; and the side surface of the resist mask 151 in the groove 175_3 is positioned closer to the pixel electrode 111G side than the middle of the shortest distance between the side surface of the pixel electrode 111G and the side surface of the pixel electrode 111B that face each other (see FIG. 9A).

Next, a film containing a third light-emitting compound is formed over the pixel electrode 111B, the insulating layer 105, and the resist mask 151. The film is preferably formed to be positioned inward from the end portion of the groove 175 in the extending direction of the groove 175. In other words, the groove 175 preferably extends beyond the end portion of the film in the extending direction of the groove 175.

The film containing the third light-emitting compound can be formed by, for example, an evaporation method, specifically a vacuum evaporation method. The film may be formed by a method such as a transfer method, a printing method, an inkjet method, or a coating method.

Figure 9A:
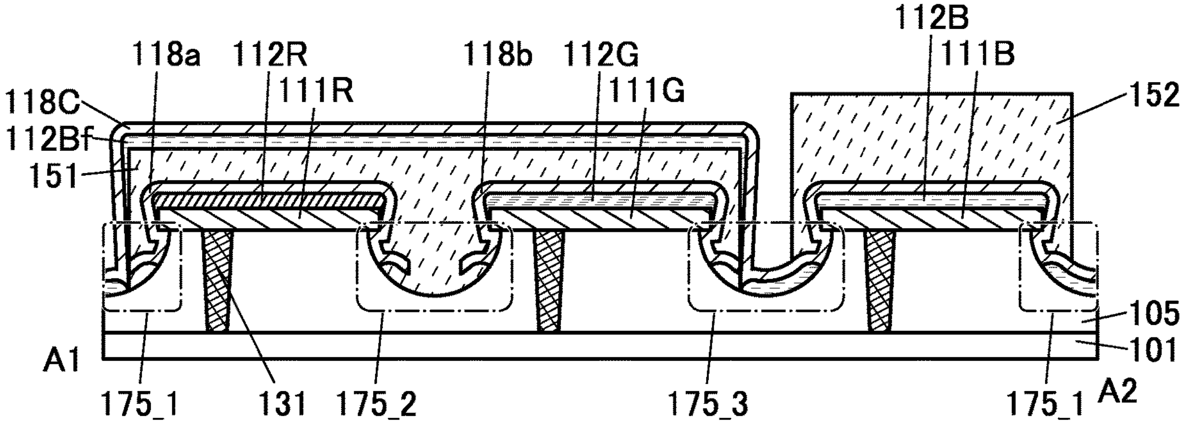
FIG. 9A to FIG. 9C are diagrams illustrating an example of a method for fabricating a display device.

At this time, disconnection of the film containing the third light-emitting compound is caused by the groove in a region not overlapping with the resist mask 151. In FIG. 9A, disconnection of the film is caused by the groove 175_3 and the groove 175_1. As a result, the organic layer 112B is formed over the pixel electrode 111B, and an organic layer 112Bf is formed over the insulating layer 105 and the resist mask 151.

Note that at least the film over the pixel electrode 111B is separated from the film over the groove 175; the film over the resist mask 151 is not necessarily separated from the film over the groove 175. Thus, the end portion of the resist mask 151 is perpendicular to the surface of the substrate 101 in FIG. 9A; however, the shape of the end portion of the resist mask 151 is not limited thereto. The end portion of the resist mask 151 may have a tapered shape or an inverse tapered shape.

Next, an insulating film 118C is formed over the organic layer 112B and the organic layer 112Bf. The insulating film 118C can be formed by a sputtering method, a CVD method, an MBE method, a PLD method, an ALD method, or the like as appropriate. In this embodiment, aluminum oxide is deposited as the insulating film 118C by an ALD method. Accordingly, as described above, the insulating film 118C can be formed to have good coverage on the groove 175 (here, the groove 175_3 and the groove 175_1). For the material and the deposition method that can be used for the insulating film 118C, the description of the insulating film 118A formed over the organic layer 112R can be referred to.

Then, the resist mask 152 is formed over the insulating film 118C. At this time, the resist mask 152 is formed in a portion overlapping with part of the groove 175_3, the organic layer 112B, and part of the groove 175_1. The side surface of the resist mask 152 in the groove 175_3 is positioned closer to the pixel electrode 111B side than the middle of the shortest distance between the side surface of the pixel electrode 111G and the side surface of the pixel electrode 111B that face each other; and the side surface of the resist mask 152 in the groove 175_1 is positioned closer to the pixel electrode 111B side than the middle of the shortest distance between the side surface of the pixel electrode 111B and the side surface of the pixel electrode 111R that face each other (see FIG. 9A).

The end portion of the resist mask 152 is perpendicular to the surface of the substrate 101 in FIG. 9A; however, the shape of the end portion of the resist mask 152 is not limited thereto. The end portion of the resist mask 152 may have a tapered shape or an inverse tapered shape.

Figure 9B:
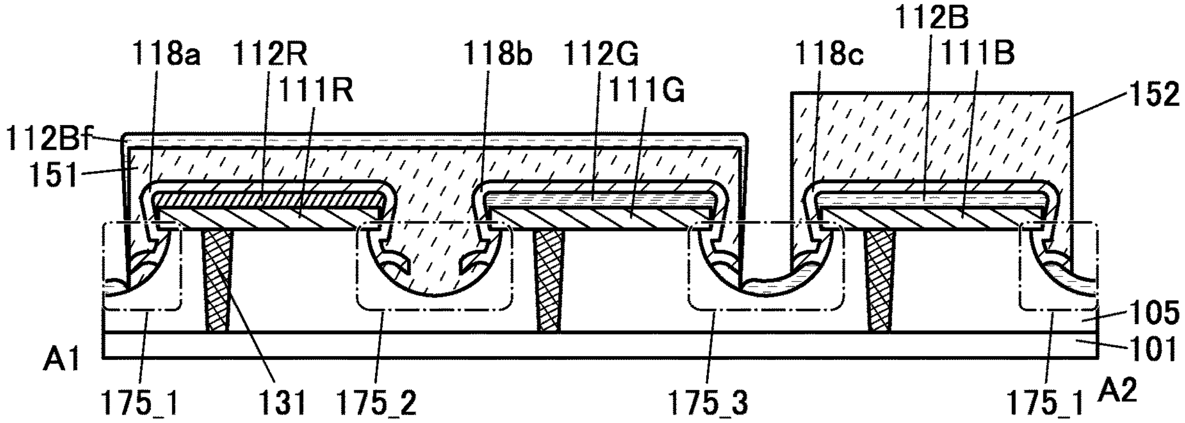

Then, the insulating film 118C in a portion not covered with the resist mask 152 is removed, so that the insulating layer 118*c* can be formed (see FIG. 9B). A dry etching method or a wet etching method can be used for removing part of the insulating film 118C.

Figure 9C:
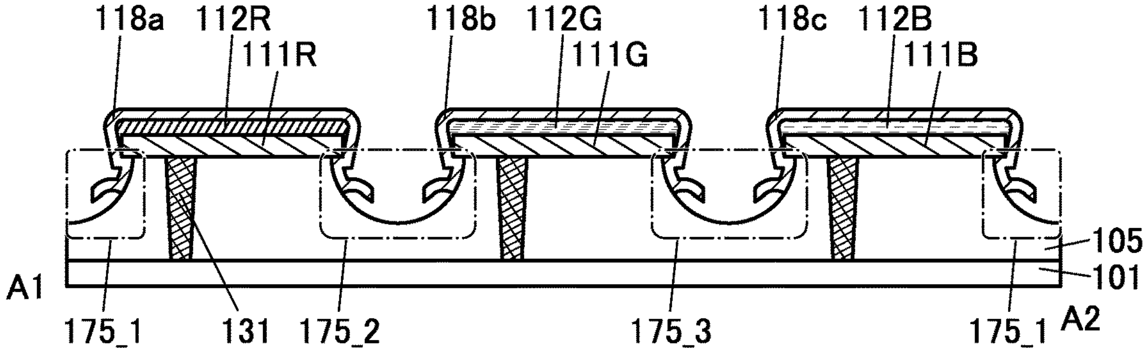

Next, the resist mask 152 and the resist mask 151 are removed (see FIG. 9C). At this time, the organic layer 112Bf is also removed.

In FIG. 9C, the organic layer 112Bf in a portion that overlaps with the resist mask 152 and does not overlap with the pixel electrode 111B is removed. Since the organic layer 112Bf in the portion is separated from the organic layer 112B, the organic layer 112Bf in the portion may remain. In addition, the organic layer 112Bf formed in contact with the insulating layer 105 in the groove 175 may remain.

In the above manner, the organic layer 112B and the pixel electrode 111B can be sealed with the insulating layer 105 and the insulating layer 118*c*.

Since the organic layer 112R is sealed with the insulating layer 105 and the insulating layer 118*a* and the organic layer 112G is sealed with the insulating layer 105 and the insulating layer 118*b*, the step of providing the resist mask 151 may be omitted in some cases in the process of forming the organic layer 112B and the insulating layer 118*c*. When the resist mask 151 is not provided, the fabrication process of the light-emitting element can be simplified and the productivity can be improved.

In the above manner, the organic layer 112R sealed with the insulating layer 105 and the insulating layer 118*a*, the organic layer 112G sealed with the insulating layer 105 and the insulating layer 118*b*, and the organic layer 112B sealed with the insulating layer 105 and the insulating layer 118*c* can be formed. Note that the formation order of the organic layer 112R, the organic layer 112G, and the organic layer 112B is not limited to the above order. For example, the organic layer 112R, the organic layer 112B, and the organic layer 112G may be formed in this order. Alternatively, the organic layer 112G may be formed first, or the organic layer 112B may be formed first.

The fabrication method is preferably adjusted as appropriate depending on the number of colors of light emitted from the light-emitting elements 110 included in the display device 100A. For example, in the case where the number of colors of light emitted from the light-emitting elements 110 included in the display device 100A is two, the resist mask 151 is preferably formed in a portion overlapping with one of two pixel electrodes 111 and grooves provided in the vicinity thereof, and the resist mask 152 is preferably formed in a portion overlapping with the other pixel electrode 111 and grooves provided in the vicinity thereof. Alternatively, in the case where the number of colors of light emitted from the light-emitting elements 110 included in the display device 100A is four, the resist mask 151 is preferably formed in portions overlapping with three pixel electrodes 111 out of four pixel electrodes 111 and grooves provided in the vicinity thereof, and the resist mask 152 is preferably formed in a portion overlapping with the other pixel electrode 111 and grooves provided in the vicinity thereof.

{Formation of Resin Layer 126, Common Layer 114, and Common Electrode 113}

A resin film to be the resin layer 126 is formed over the insulating layer 105, the insulating layer 118*a*, the insulating layer 118*b*, and the insulating layer 118*c*.

The resin film is formed at a temperature lower than the upper temperature limits of the organic layer 112R, the organic layer 112G, and the organic layer 112B. The insulating film is preferably formed at a substrate temperature higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C.

The resin film is preferably formed by the aforementioned wet deposition method. The insulating film is preferably formed by, for example, spin coating using a photosensitive material; more specifically, the insulating film is preferably formed using a photosensitive resin composition containing an acrylic resin.

The resin film is preferably formed using a resin composition containing a polymer, an acid-generating agent, and a solvent, for example. The polymer is formed using one or more kinds of monomers and has a structure in which one or more kinds of structural units (also referred to as building blocks) are repeated regularly or irregularly. As the acid-generating agent, one or both of a compound that generates an acid by light irradiation and a compound that generates an acid by heating can be used. The resin composition may also include one or more of a photosensitizing agent, a sensitizer, a catalyst, an adhesive aid, a surface-active agent, and an antioxidant.

After the resin film is formed, heat treatment (also referred to as prebaking) is preferably performed. The heat treatment is performed at a temperature lower than the upper temperature limits of the organic layer 112R, the organic layer 112G, and the organic layer 112B. The substrate temperature in the heat treatment is preferably higher than or equal to 50° C. and lower than or equal to 200° C., further preferably higher than or equal to 60° C. and lower than or equal to 150° C., still further preferably higher than or equal to 70° C. and lower than or equal to 120° C. Accordingly, a solvent contained in the insulating film can be removed.

Then, light exposure is performed such that part of the resin film is exposed to visible rays or ultraviolet rays. Here, in the case where a positive photosensitive resin composition containing an acrylic resin is used for the insulating film, a region where the resin layer 126 is not formed in a later step is irradiated with visible rays or ultraviolet rays. The resin layer 126 is formed in a region interposed between any two of the pixel electrode 111R, the pixel electrode 111G, and the pixel electrode 111B. Thus, the pixel electrode 111 is irradiated with visible rays or ultraviolet rays. Note that in the case where a negative photosensitive material is used for the resin film, a region where the resin layer 126 is to be formed is irradiated with visible rays or ultraviolet rays.

The width of the resin layer 126 to be formed later can be controlled with the light-exposure region of the resin film. In this embodiment, processing is performed such that the resin layer 126 has a region overlapping with the top surface of the pixel electrode 111.

Light used for light exposure preferably includes the i-line (wavelength: 365 nm). The light used for light exposure may include at least one of the g-line (wavelength: 436 nm) and the h-line (wavelength: 405 nm).

Next, development is performed to remove the light-exposure region of the resin film, whereby the resin layer 126 is formed. The resin layer 126 is formed in a region interposed between any two of the pixel electrode 111R, the pixel electrode 111G, and the pixel electrode 111B. Here, in the case where an acrylic resin is used for the resin film, an alkaline solution is preferably used as a developer, and for example, an aqueous solution of tetramethyl ammonium hydroxide (TMAH) can be used.

Then, a residue (what is called scum) due to the development may be removed. For example, the residue can be removed by ashing using oxygen plasma.

Note that etching may be performed to adjust the surface level of the resin layer 126. The resin layer 126 may be processed by ashing using oxygen plasma, for example. In the case where a non-photosensitive material is used for the resin film to be the resin layer 126, the surface level of the resin film can be adjusted by the ashing, for example.

Figure 10A:
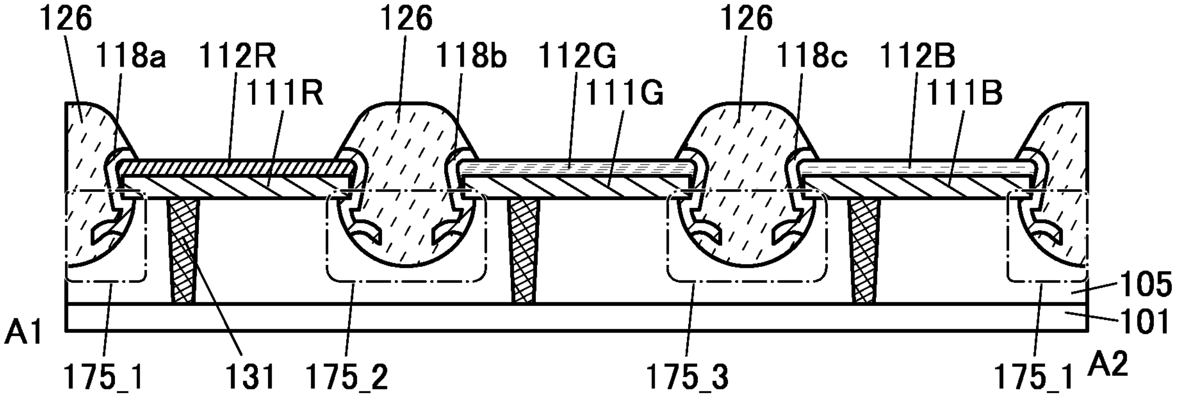
FIG. 10A and FIG. 10B are diagrams illustrating an example of a method for fabricating a display device.

Next, etching treatment is performed using the resin layer 126 as a mask to remove part of the insulating layer 118*a*, part of the insulating layer 118*b*, and part of the insulating layer 118*c*. Thus, an opening portion is formed in the insulating layer 118*a* so that the top surface of the organic layer 112R is exposed. An opening portion is formed in the insulating layer 118*b* so that the top surface of the organic layer 112G is exposed. An opening portion is formed in the insulating layer 118*c* so that the top surface of the organic layer 112B is exposed (see FIG. 10A). In other words, an opening portion reaching the organic layer 112R is provided in the resin layer 126 and the insulating layer 118*a*. An opening portion reaching the organic layer 112G is provided in the resin layer 126 and the insulating layer 118*b*. An opening portion reaching the organic layer 112B is provided in the resin layer 126 and the insulating layer 118*c*.

The etching treatment is performed by wet etching. The use of a wet etching method can reduce damage to the organic layer 112R, the organic layer 112G, and the organic layer 112B as compared with the case of using a dry etching method. The wet etching can be performed using an alkaline solution such as TMAH, for example.

Heat treatment may be performed after the organic layer 112R, the organic layer 112G, and the organic layer 112B are partly exposed. By the heat treatment, water contained in the organic layer 112, water adsorbed on the surface of the organic layer 112, and the like can be removed. For example, heat treatment in an inert gas atmosphere or a reduced-pressure atmosphere can be performed. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case dehydration at a lower temperature is possible. Note that the temperature range of the heat treatment is preferably set as appropriate also in consideration of the upper temperature limit of the organic layer 112. In consideration of the upper temperature limit of the organic layer 112, a temperature higher than or equal to 70° C. and lower than or equal to 120° C. is particularly preferable in the above temperature ranges.

Next, the common layer 114 is formed over the organic layer 112R, the organic layer 112G, the organic layer 112B, and the resin layer 126. The common layer 114 can be formed by a method such as an evaporation method (including a vacuum evaporation method), a transfer method, a printing method, an inkjet method, or a coating method.

Next, the common electrode 113 is formed over the common layer 114. The common electrode 113 can be formed by a sputtering method, a vacuum evaporation method, or the like. Alternatively, the common electrode 113 may be formed by stacking a film formed by an evaporation method and a film formed by a sputtering method.

The common electrode 113 is formed to overlap with the organic layer 112R in the opening portion formed in the resin layer 126 and the insulating layer 118*a*. The common electrode 113 is formed to overlap with the organic layer 112G in the opening portion formed in the resin layer 126 and the insulating layer 118*b*. The common electrode 113 is formed to overlap with the organic layer 112B in the opening portion formed in the resin layer 126 and the insulating layer 118*c*.

In the above manner, the light-emitting element 110R, the light-emitting element 110G, and the light-emitting element 110B can be formed.

Figure 10B:
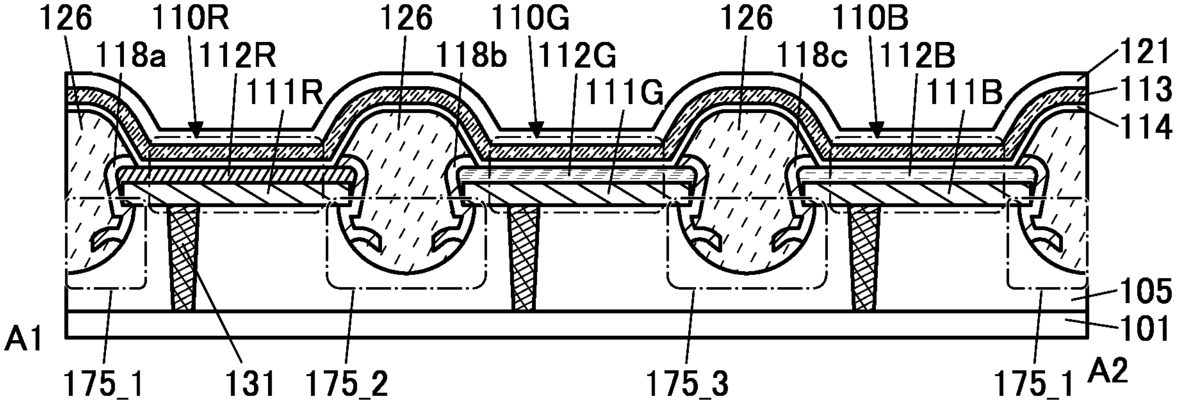

Next, the protective layer 121 is formed over the common electrode 113 (see FIG. 10B). The protective layer 121 can be formed by a method such as a vacuum evaporation method, a sputtering method, a CVD method, or an ALD method.

Through the above steps, the display device 100A having the structure illustrated in FIG. 1B can be fabricated.

According to the above fabrication method example, when being sealed with the insulating layer 105 and the insulating layer 118, the organic layer 112 is not exposed to a chemical solution or the like used in removing the resist mask. Thus, the light-emitting element 110 can be formed without using a metal mask for forming the organic layer 112.

According to the above fabrication method example, a wet etching method can be used for all the etching treatments performed in the steps after the formation of the pixel electrode 111; thus, manufacturing cost of the display device 100A can be reduced.

According to the above fabrication method example, the difference in the optical distance between the pixel electrode 111 and the common electrode 113 can be precisely controlled by the thickness of the organic layer 112. Thus, chromaticity deviation or the like in the light-emitting elements is unlikely to occur, so that a display device having excellent color reproducibility and extremely high display quality can be fabricated easily.

The light-emitting element 110 can be formed over the insulating layer 105 with a planarized top surface. Furthermore, the lower electrode (the pixel electrode 111) of the light-emitting element 110 can be electrically connected to a pixel circuit or the like on the substrate 101 through the plug 131, so that an extremely fine pixel can be formed and accordingly a display device with extremely high resolution can be achieved. Since the light-emitting element 110 can be placed to overlap with a pixel circuit or a driver circuit, a display device with a high aperture ratio (effective light-emitting area ratio) can be achieved.

The resin layer 126 having a tapered end portion and being provided between adjacent island-shaped organic layers 112 can inhibit occurrence of disconnection and formation of a locally thinned portion in the common electrode 113 at the time of forming the common electrode 113. Thus, poor connection due to a disconnected portion and an increase in electric resistance due to a locally thinned portion can be inhibited from being caused in the common layer 114 and the common electrode 113. Accordingly, the display device of one embodiment of the present invention achieves both high resolution and high display quality.

Note that in the display device of one embodiment of the present invention or the method for fabricating the display device, there is no particular limitation on the screen ratio (aspect ratio) of a display portion in the display device. For example, the display device is compatible with a variety of screen ratios such as 1:1 (a square), 3:4, 16:9, and 16:10.

Modification Example

A modification example whose structure is partly different from that of the above display device will be described below.

Note that in the description below, the above description is referred to for portions similar to those described in Structure example 1, and the portions are not described in some cases.

Modification Example 1

Figure 11A:
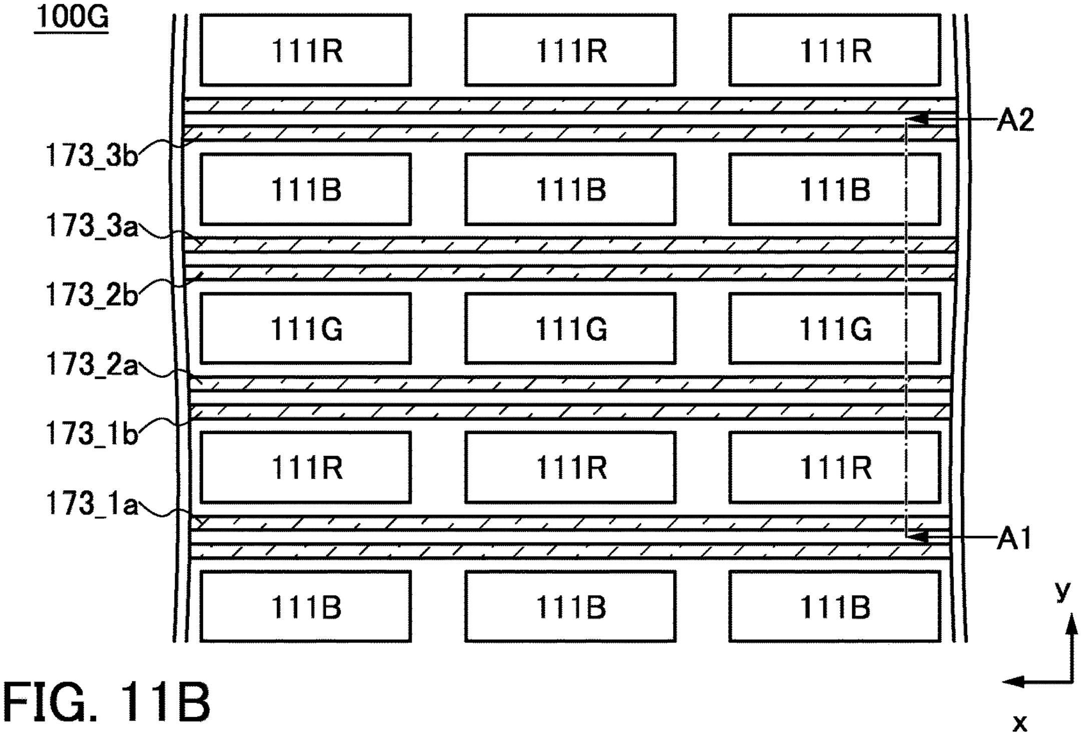
FIG. 11A to FIG. 11C are diagrams illustrating a structure example of a display device.
Figure 11B:
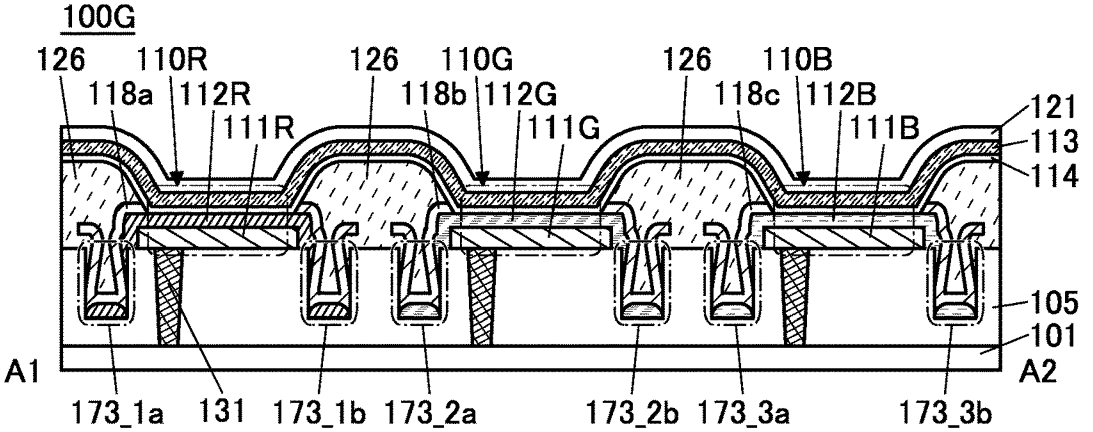

FIG. 11A and FIG. 11B are diagrams illustrating a display device of one embodiment of the present invention. FIG. 11A is a schematic top view of a display device 100G, and FIG. 11B is a schematic cross-sectional view of the display device 100G. Here, FIG. 11B is a cross-sectional view of a portion indicated by the dashed-dotted line A1-A2 in FIG. 11A. Note that for clarity of the drawing, some components are omitted in the top view of FIG. 11A.

The display device 100G differs from the display device 100A mainly in that the number of grooves provided between adjacent light-emitting elements of different colors is two.

Two grooves are provided in the insulating layer 105 in a region positioned between two pixel electrodes 111 adjacent to each other in the A1-A2 direction illustrated in FIG. 11A. As illustrated in FIG. 11A and FIG. 11B, of two grooves provided between the light-emitting element 110R and the light-emitting element 110G, the groove on the light-emitting element 110R side is referred to as a groove 173_1*b*, and the groove on the light-emitting element 110G side is referred to as a groove 173_2*a*. Furthermore, of two grooves provided between the light-emitting element 110G and the light-emitting element 110B, the groove on the light-emitting element 110G side is referred to as a groove 173_2*b*, and the groove on the light-emitting element 110B side is referred to as a groove 173_3*a*. Furthermore, of two grooves provided between the light-emitting element 110B and the light-emitting element 110R, the groove on the light-emitting element 110B side is referred to as a groove 173_3*b*, and the groove on the light-emitting element 110R side is referred to as a groove 173_1*a*.

Note that in the following description common to the groove 173_1*a*, the groove 173_1*b*, the groove 173_2*a*, the groove 173_2*b*, the groove 173_3*a*, and the groove 173_3*b*, the alphabets are omitted from the reference numerals and the term "groove 173" is used in some cases. In addition, in the following description common to the groove 173_1*a*, the groove 173_2*a*, and the groove 173_3*a*, some reference numerals are omitted and the term "groove 173_*a*" is used in some cases. In addition, in the following description common to the groove 173_1*b*, the groove 173_2*b*, and the groove 173_3*b*, some reference numerals are omitted and the term "groove 173_*b*" is used in some cases.

In the display device 100G, the organic layer 112 is divided by the groove 173 between the adjacent light-emitting elements of different colors. Thus, current (also referred to as leakage current) flowing between the adjacent light-emitting elements of different colors through the organic layer 112 can be prevented. Accordingly, light emission caused by the leakage current can be inhibited, so that display with a high contrast can be achieved. Furthermore, even in the case where the resolution is increased, the range of choices for materials can be widened since the organic layer 112 can be formed using a material with high conductivity, which facilitates an improvement in efficiency, a reduction in power consumption, and an improvement in reliability.

Figure 11C:
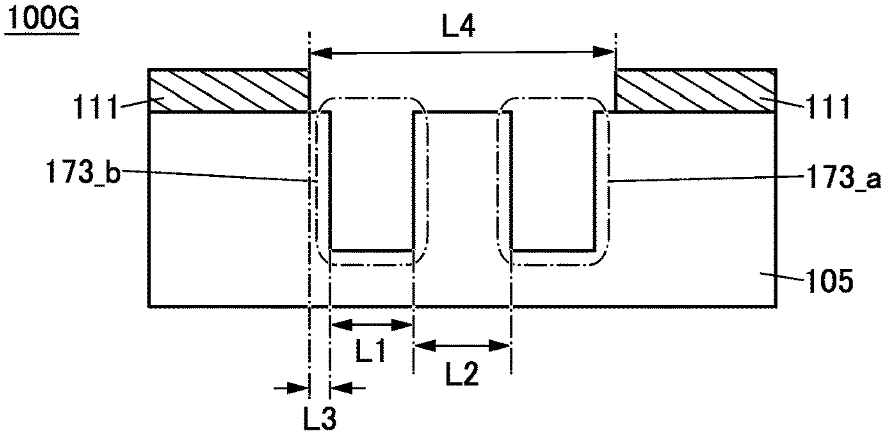

FIG. 11C is a schematic cross-sectional view of the groove 173 and its vicinity in the display device 100G. Note that for clarity of the drawing, some components are omitted in the cross-sectional view of FIG. 11C.

A width L1 illustrated in FIG. 11C is a width of the groove 173 in the A1-A2 direction. The width L1 is preferably twice or more the thickness of the organic layer 112. In the case where the thickness of the organic layer 112 is 100 nm, for example, the width L1 is greater than 200 nm and less than or equal to 500 nm, preferably greater than 200 nm and less than or equal to 400 nm, further preferably greater than 200 nm and less than or equal to 300 nm, specifically 250 nm. This enables the groove 173 to cause disconnection of the organic layer 112 so that the organic layer 112 can be formed over the pixel electrode 111. In that case, the organic layer 112 is placed to cover the side surface and the top surface of the pixel electrode 111 as illustrated in FIG. 11B. In other words, in the cross-sectional view of the display device 100G, the end portions of the organic layer 112 are positioned outward from the end portions of the pixel electrode 111. In other words, the end portions of the organic layer 112 cover the end portions of the pixel electrode 111. The organic layer 112 has a region in contact with the insulating layer 105.

A distance L2 illustrated in FIG. 11C is a distance between the adjacent grooves. In other words, the distance L2 is the shortest distance between the end portions of the adjacent grooves. A distance L3 illustrated in FIG. 11C is a distance between the pixel electrode 111 and the groove adjacent to the pixel electrode 111. In other words, the distance L3 is the shortest distance between the end portion of the pixel electrode 111 and the end portion of the groove adjacent to the pixel electrode 111.

The distance L2 and the distance L3 are preferably adjusted as appropriate in accordance with the processing accuracy in the case of using a photolithography method, the thickness of the organic layer 112, the thickness of the insulating layer 118, or the like. For example, the distance L2 is greater than or equal to 200 nm and less than or equal to 800 nm, preferably greater than or equal to 250 nm and less than or equal to 700 nm, further preferably greater than or equal to 350 nm and less than or equal to 600 nm. For example, the distance L3 is greater than or equal to 50 nm and less than or equal to 400 nm, preferably greater than or equal to 50 nm and less than or equal to 200 nm, further preferably greater than or equal to 50 nm and less than or equal to 150 nm.

A distance L4 illustrated in FIG. 11C is the shortest distance between the pixel electrodes 111 included in the two adjacent light-emitting elements of different colors. The distance L4 depends on the width L1, the distance L2, and the distance L3. With the above structure, the distance L4 is greater than or equal to 700 nm and less than or equal to 2000 nm, preferably greater than or equal to 900 nm and less than or equal to 1600 nm, further preferably greater than or equal to 1000 nm and less than or equal to 1400 nm.

Accordingly, it is possible to achieve an extremely high-resolution display device in which pixels including one or more light-emitting elements are arranged with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

The insulating layer 118 has a region in contact with at least part of the top surface of the organic layer 112 and a region in contact with the side surface of the organic layer 112.

The insulating layer 118 is provided to overlap with two grooves near the organic layer 112 covered with the insulating layer 118. As illustrated in FIG. 11B, the insulating layer 118*a* over the organic layer 112R is provided to overlap with the groove 173_1*a* and the groove 173_1*b*, the insulating layer 118*b* over the organic layer 112G is provided to overlap with the groove 173_2*a* and the groove 173_2*b*, and the insulating layer 118*c* over the organic layer 112B is provided to overlap with the groove 173_3*a* and the groove 173_3*b*.

The insulating layer 118 has a region in contact with the insulating layer 105 outside the pixel electrode 111 and the organic layer 112 in the cross-sectional view in the A1-A2 direction. Specifically, the insulating layer 118 has a region in contact with the sidewall of the groove 173. More specifically, the insulating layer 118*a* has a region in contact with the sidewall of the groove 173_1*a* and a region in contact with the sidewall of the groove 173_1*b*, the insulating layer 118*b* has a region in contact with the sidewall of the groove 173_2*a* and a region in contact with the sidewall of the groove 173_2*b*, and the insulating layer 118*c* has a region in contact with the sidewall of the groove 173_3*a* and a region in contact with the sidewall of the groove 173_3*b*. That is, in the display device 100G, the pixel electrode 111 and the organic layer 112 are sealed with the insulating layer 105 and the insulating layer 118. The insulating layer 118 functions as a protective layer that prevents diffusion of impurities such as water into the pixel electrode 111 and the organic layer 112. This structure can prevent diffusion of impurities such as water into the pixel electrode 111 and the organic layer 112.

Note that a layer is positioned between the insulating layer 118 and the insulating layer 105 inside the groove 173. The layer is formed of the same material as the organic layer 112 covered with the insulating layer 118. For example, a layer formed of the same material as the organic layer 112R is positioned between the insulating layer 118*a* and the insulating layer 105 inside each of the groove 173_1*a* and the groove 173_1*b*. A layer formed of the same material as the organic layer 112G is positioned between the insulating layer 118*b* and the insulating layer 105 inside each of the groove 173_2*a* and the groove 173_2*b*. A layer formed of the same material as the organic layer 112B is positioned between the insulating layer 118*c* and the insulating layer 105 inside each of the groove 173_3*a* and the groove 173_3*b*.

Between the adjacent light-emitting elements of different colors, the side surfaces of the organic layers 112 face each other with the resin layer 126 therebetween. The resin layer 126 is positioned between the adjacent light-emitting elements of different colors and is provided to fill a region between the end portions of the organic layers 112 and a region between the two organic layers 112. The resin layer 126 is provided to fill the groove 173.

Figure 12A:
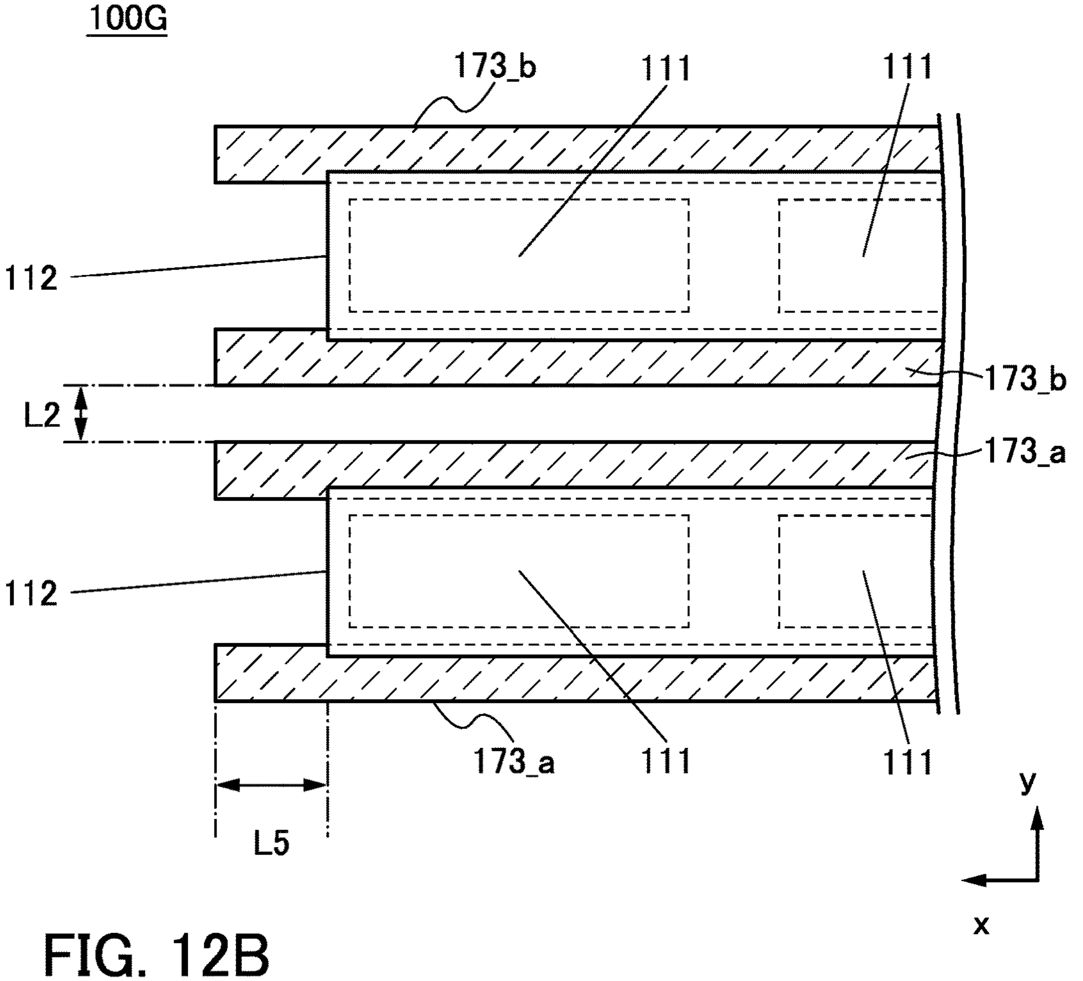
FIG. 12A and FIG. 12B are diagrams illustrating a structure example of a display device.

FIG. 12A is a schematic top view of the end portion of the groove 173 and its vicinity. Note that for clarity of the drawing, some components are omitted in the top view of FIG. 12A. The groove 173_*a* and the groove 173_*b* preferably extend beyond the end portion of the organic layer 112 in the x direction. In FIG. 12A, the distance between the end portions of the groove 173_*a* and the groove 173_*b* and the end portion of the organic layer 112 is denoted by the distance L5. With such a structure, the organic layers adjacent in the y direction can be separated from each other.

Although not illustrated in FIG. 12A, the common electrode 113 preferably extends beyond the end portion of the groove 173 in the x direction. In other words, the end portion of the groove 173 is preferably positioned inward from the end portion of the common electrode 113 in the x direction.

Figure 12B:
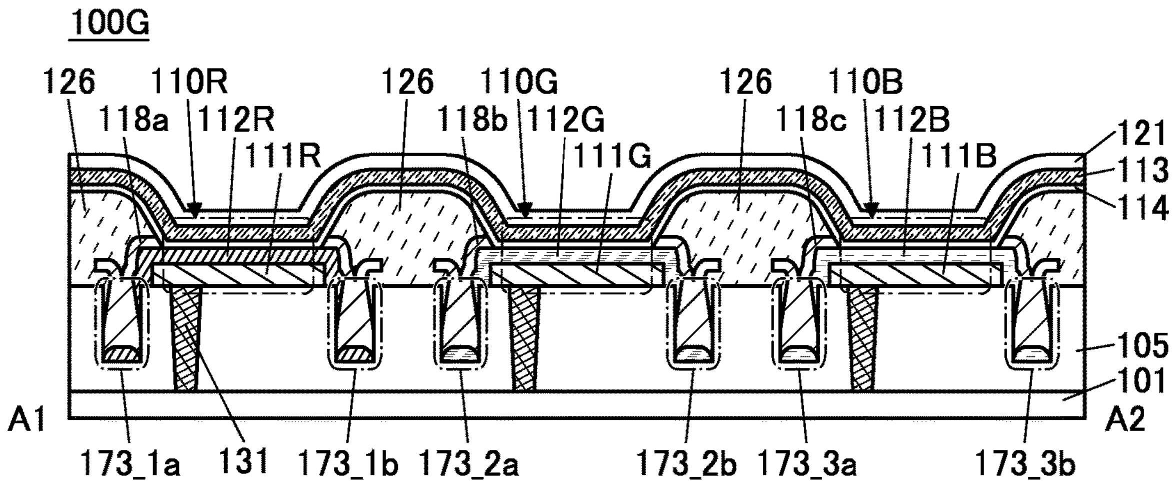

Depending on the thickness of the insulating layer 118, the width L1, the distance L3, and the like, the insulating layer 118 is provided to fill two grooves near the organic layer 112 covered with the insulating layer 118, as illustrated in FIG. 12B. For example, the insulating layer 118*a* over the organic layer 112R is provided to fill the groove 173_1*a* and the groove 173_1*b*, the insulating layer 118*b* over the organic layer 112G is provided to fill the groove 173_2*a* and the groove 173_2*b*, and the insulating layer 118*c* over the organic layer 112B is provided to fill the groove 173_3*a* and the groove 173_3*b*. In that case, the resin layer 126 is provided over the insulating layer 118 and the insulating layer 105.

Although the sidewall of the groove 173 is perpendicular to the surface of the substrate 101 in FIG. 11B, the shape of the sidewall of the groove 173 is not limited thereto as long as disconnection of the organic layer 112 is caused. The sidewall of the groove 173 may have a tapered shape or an inverse tapered shape. The sidewall of the groove 173 may have a curve or a step.

Note that the number of grooves provided in the insulating layer 105 in a region positioned between two pixel electrodes 111 adjacent in the y direction is preferably one or two but may be three or more.

Figure 13A:
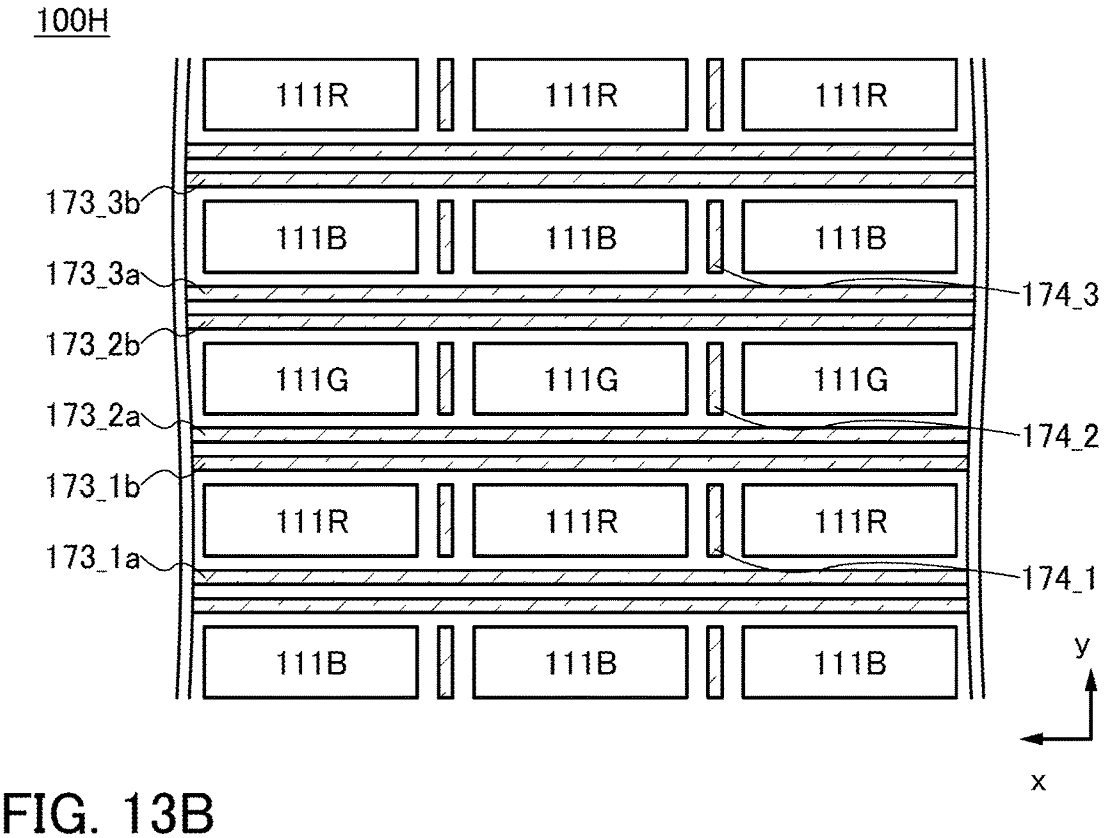
FIG. 13A and FIG. 13B are diagrams illustrating structure examples of display devices.

As in a display device 100H in FIG. 13A, a groove may be provided between the light-emitting elements of the same color. For example, as illustrated in FIG. 13A, a groove 1741 may be provided between two pixel electrodes 111R (light-emitting elements 110R) adjacent in the x direction, a groove 1742 may be provided between two pixel electrodes 111G (light-emitting elements 110G) adjacent in the x direction, and a groove 1743 may be provided between two pixel electrodes 111B (light-emitting elements 110B) adjacent in the x direction.

FIG. 13A illustrates a structure in which the groove 174_1 intersects with (is connected to) neither the groove 173_1*a* nor the groove 173_1*b*, the groove 174_2 intersects with (is connected to) neither the groove 173_2*a* nor the groove 173_2*b*, and the groove 174_3 intersects with (is connected to) neither the groove 173_3*a* nor the groove 173_3*b*. Note that the present invention is not limited thereto, and the groove 174_1 may intersect with (be connected to) the groove 173_1*a* and the groove 173_1*b*. The groove 174_2 may intersect with (be connected to) the groove 173_2*a* and the groove 173_2*b*. The groove 174_3 may intersect with (be connected to) the groove 173_3*a* and the groove 173_3*b*.

Figure 13B:
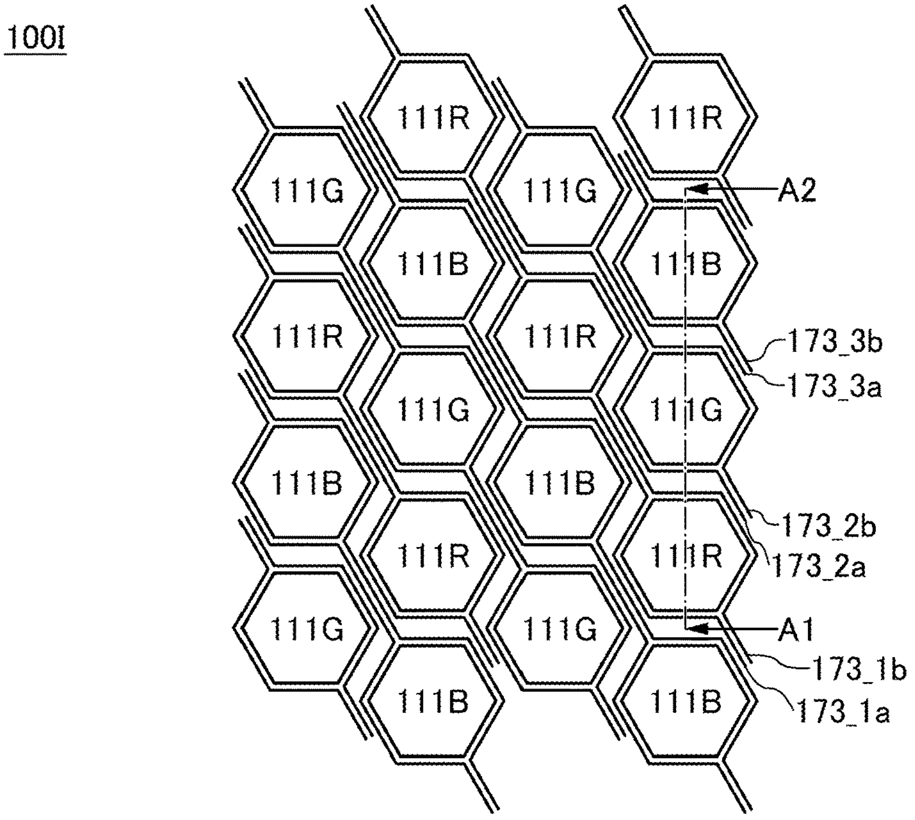

Although the preferable arrangement of the light-emitting elements 110 (the pixel electrodes 111) is stripe arrangement, arrangement other than the stripe arrangement may be employed. Examples of the arrangement of the light-emitting elements 110 (the pixel electrodes 111) include delta arrangement and mosaic arrangement. A display device 100I in FIG. 13B includes the pixel electrodes 111 (the light-emitting elements 110) employing delta arrangement. For example, when the groove 173 illustrated in FIG. 13B is provided, the light-emitting elements 110 of different colors can be separated from each other.

Modification Example 2

Figure 14A:
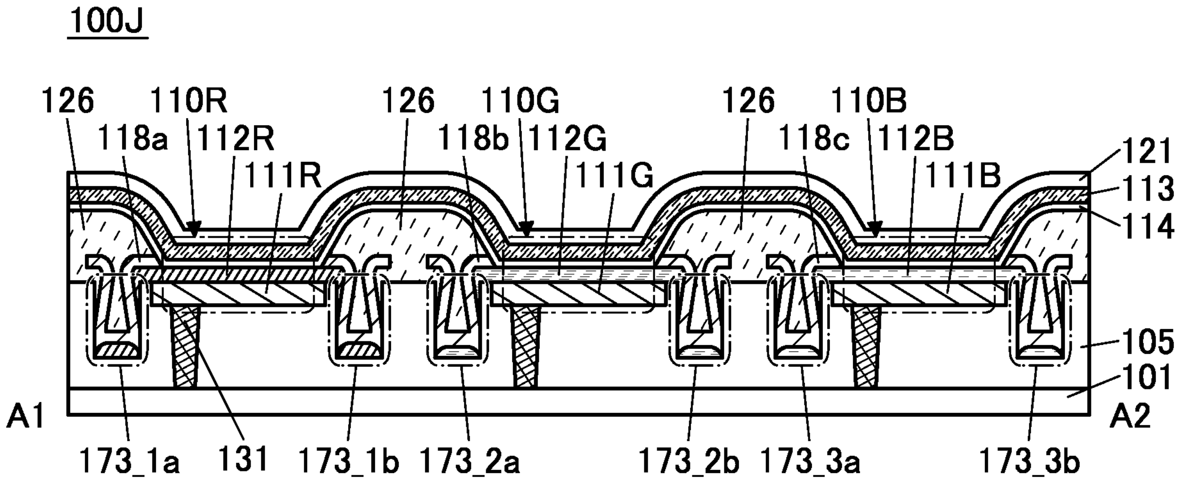
FIG. 14A and FIG. 14B are diagrams illustrating a structure example of a display device.
Figure 14B:
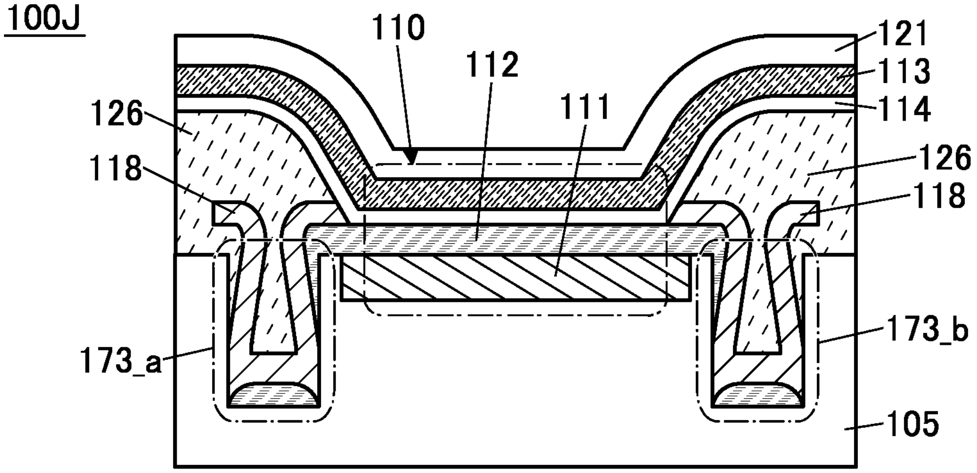

FIG. 14A is a schematic cross-sectional view of a display device 100J. The display device 100J differs from the display device 100G in the position of the pixel electrode 111. FIG. 14B is an enlarged view of the pixel electrode 111 and its vicinity. Note that for clarity of the drawing, some components are omitted in the enlarged view of FIG. 14B.

In the display device 100J, the pixel electrode 111 is formed to be embedded in an opening provided in the insulating layer 105. That is, the top surface of the pixel electrode 111 is substantially level with the top surface of the insulating layer 105. With such a structure, the organic layer 112 can be formed on a flat surface. Although FIG. 14A and FIG. 14B illustrate a structure in which the insulating layer 105 has a single-layer structure, the present invention is not limited thereto. For example, the insulating layer 105 may have a stacked-layer structure of two layers as illustrated in FIG. 4A and FIG. 4B. In that case, it is preferable to select, as a lower layer of the insulating layer 105, an insulator that functions as an etching stopper film at the time of forming an opening in which the pixel electrode 111 is embedded in an upper layer of the insulating layer 105.

Since the organic layer 112 is formed on a flat surface, the display device 100J has a structure in which the organic layer 112 does not cover the end portion of the pixel electrode 111. Thus, a reduction in the thickness of the organic layer 112 can be prevented, which can prevent the occurrence of a short circuit between the upper electrode (the common electrode 113) and the lower electrode (the pixel electrode 111) of the light-emitting element 110.

The above is the description of the modification examples.

[Pixel Layout]

Pixel layouts different from that in FIG. 1A will be mainly described below. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Top surface shapes of subpixels illustrated in FIG. 15A to FIG. 15G and FIG. 16A to FIG. 16I correspond to top surface shapes of light-emitting regions.

Examples of the top surface shapes of the subpixels include polygons such as a triangle, a tetragon (including a rectangle and a square), and a pentagon; polygons with rounded corners; an ellipse; and a circle.

The range of the circuit layout for forming the subpixels is not limited to the range of the subpixels illustrated in a diagram and may be placed outside the subpixels.

Figure 15A:
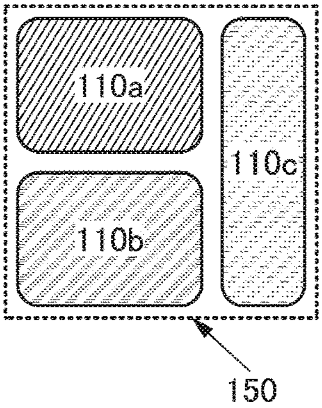
FIG. 15A to FIG. 15G are diagrams illustrating examples of pixels.

A pixel 150 illustrated in FIG. 15A employs S-stripe arrangement. The pixel 150 illustrated in FIG. 15A consists of three subpixels: a subpixel 110*a*, a subpixel 110*b*, and a subpixel 10*c*.

Figure 15B:
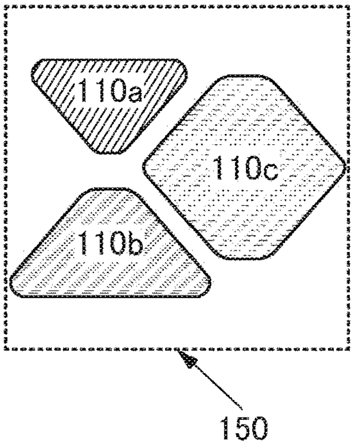

The pixel 150 illustrated in FIG. 15B includes the subpixel 110*a* whose top surface has a rough trapezoidal shape with rounded corners, the subpixel 110*b* whose top surface has a rough triangle shape with rounded corners, and the subpixel 110*c* whose top surface has a rough tetragonal or rough hexagonal shape with rounded corners. The subpixel 110*b* has a larger light-emitting area than the subpixel 110*a*. In this manner, the shapes and sizes of the subpixels can be determined independently. For example, the size of a subpixel including a light-emitting element with higher reliability can be smaller.

Figure 15C:
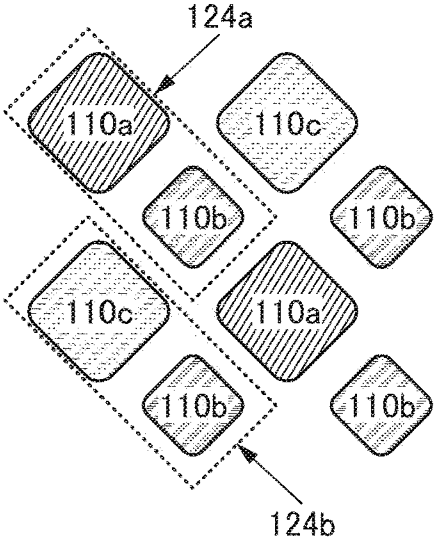

Pixels 124*a* and pixels 124*b* illustrated in FIG. 15C employ pentile arrangement. FIG. 15C illustrates an example in which the pixels 124*a* each including the subpixel 110*a* and the subpixel 110*b* and the pixels 124*b* each including the subpixel 110*b* and the subpixel 110*c* are alternately arranged.

Figure 15D:
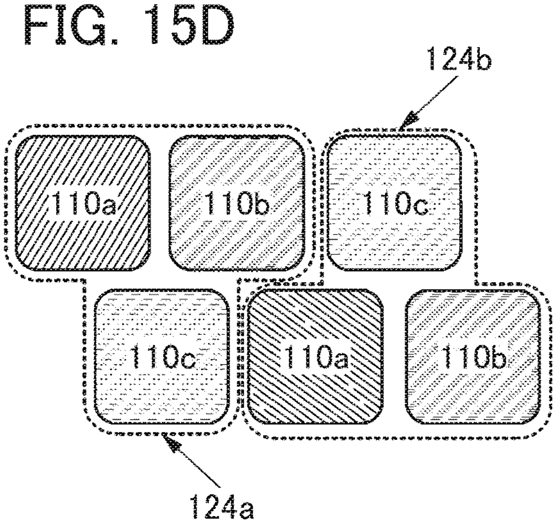
Figure 15E:
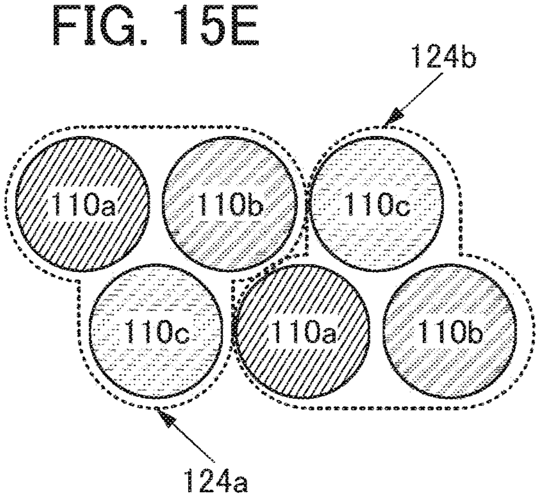
Figure 15F:
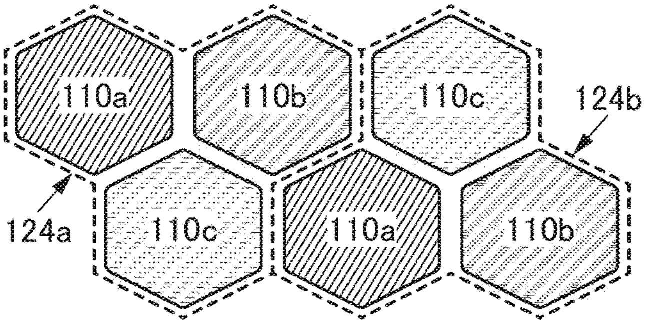

The pixels 124*a* and the pixels 124*b* illustrated in FIG. 15D to FIG. 15F employ delta arrangement. The pixels 124*a* each include two subpixels (the subpixel 110*a* and the subpixel 110*b*) in the upper row (first row) and one subpixel (the subpixel 110*c*) in the lower row (second row). The pixels 124*b* each include one subpixel (the subpixel 110*c*) in the upper row (first row) and two subpixels (the subpixel 110*a* and the subpixel 110*b*) in the lower row (second row).

FIG. 15D illustrates an example in which the top surface of each subpixel has a rough tetragonal shape with rounded corners, FIG. 15E illustrates an example in which the top surface of each subpixel has a circular shape, and FIG. 15F illustrates an example in which the top surface of each subpixel has a rough hexagonal shape with rounded corners.

In FIG. 15F, the subpixels are placed inside the respective hexagonal regions that are arranged densely. Focusing on one of the subpixels, the subpixel is placed so as to be surrounded by six subpixels. The subpixels are arranged such that subpixels that emit light of the same color are not adjacent to each other. For example, focusing on the subpixel 110*a*, the subpixel 110*a* is surrounded by three subpixels 110*b* and three subpixels 110*c* that are alternately arranged.

Figure 15G:
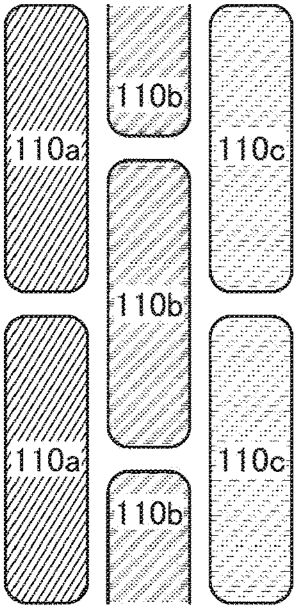

FIG. 15G illustrates an example in which subpixels of different colors are arranged in a zigzag manner. Specifically, the positions of the top sides of two subpixels arranged in the column direction (e.g., the subpixel 110*a* and the subpixel 110*b*, or the subpixel 110*b* and the subpixel 110*c*) are not aligned in the top view.

For example, in each pixel illustrated in FIG. 15A to FIG. 15G, it is preferable that the subpixel 110*a* be a subpixel R emitting red light, the subpixel 110*b* be a subpixel G emitting green light, and the subpixel 110*c* be a subpixel B emitting blue light. Note that the structure of the subpixels is not limited thereto, and the colors and arrangement order of the subpixels can be determined as appropriate. For example, the subpixel 110*b* may be the subpixel R emitting red light and the subpixel 110*a* may be the subpixel G emitting green light.

In a photolithography method, as a pattern to be processed becomes finer, the influence of light diffraction becomes more difficult to ignore; accordingly, fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface shape of a subpixel is sometimes a polygonal shape with rounded corners, an elliptical shape, a circular shape, or the like.

Furthermore, in the method for fabricating the display device of one embodiment of the present invention, an EL layer is processed into an island shape with the use of a resist mask. A resist film formed over the EL layer needs to be cured at a temperature lower than the upper temperature limit of the EL layer. Thus, the resist film is insufficiently cured in some cases depending on the upper temperature limit of the material of the EL layer and the curing temperature of a resist material. An insufficiently cured resist film might have a shape different from a desired shape at the time of processing. As a result, the top surface shape of the EL layer becomes a polygonal shape with rounded corners, an elliptical shape, a circular shape, or the like in some cases. For example, when a resist mask with a square top surface shape is intended to be formed, a resist mask with a circular top surface shape might be formed and the top surface shape of the EL layer might be circular.

Note that to obtain a desired top surface shape of the EL layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

As illustrated in FIG. 16A to FIG. 16I, the pixel can include four types of subpixels.

Figure 16A:
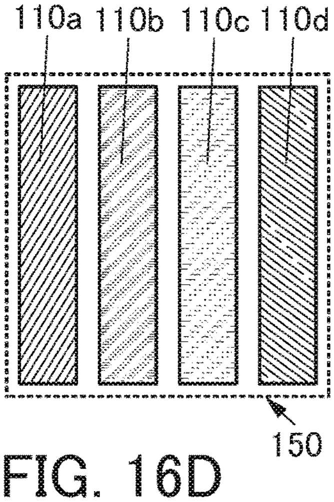
FIG. 16A to FIG. 16I are diagrams illustrating examples of pixels.
Figure 16B:
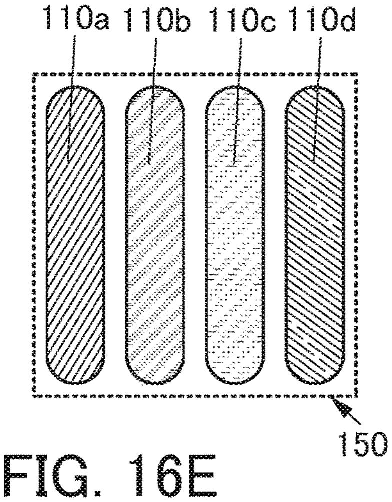
Figure 16C:
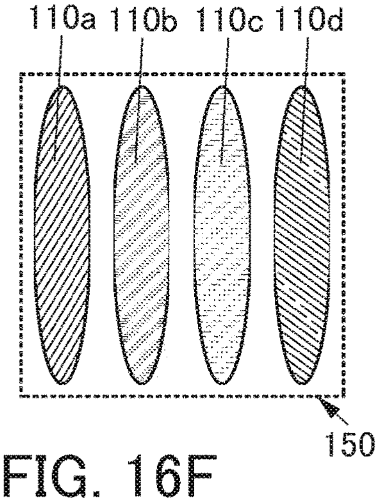

The pixels 150 illustrated in FIG. 16A to FIG. 16C employ stripe arrangement.

FIG. 16A illustrates an example in which each subpixel has a rectangular top surface shape, FIG. 16B illustrates an example in which each subpixel has a top surface shape formed by combining two half circles and a rectangle, and FIG. 16C illustrates an example in which each subpixel has an elliptical top surface shape.

Figure 16D:
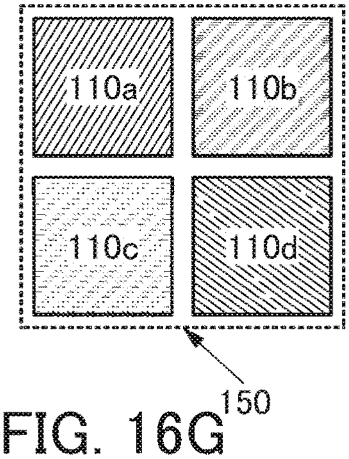
Figure 16E:
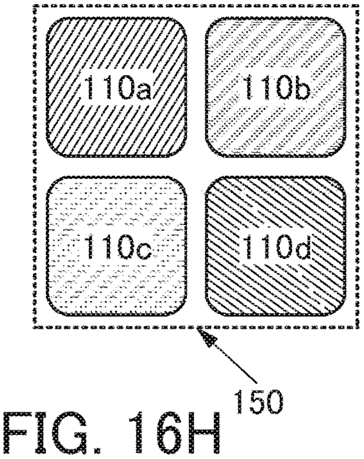
Figure 16F:
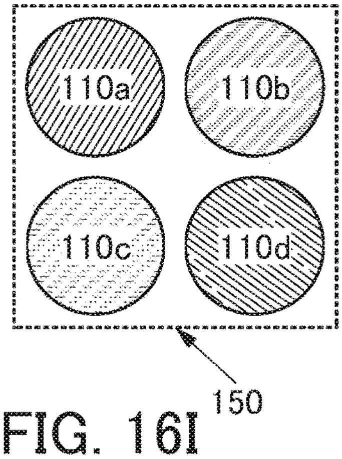

The pixels 150 illustrated in FIG. 16D to FIG. 16F employ matrix arrangement.

FIG. 16D illustrates an example in which each subpixel has a square top surface shape, FIG. 16E illustrates an example in which each subpixel has a rough square top surface shape with rounded corners, and FIG. 16F illustrates an example in which each subpixel has a circular top surface shape.

Figure 16G:
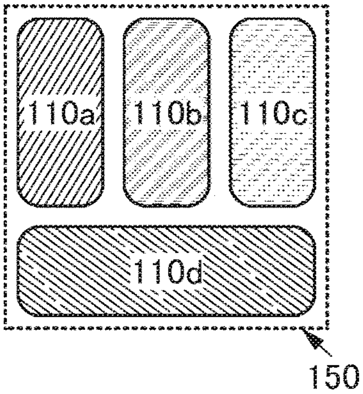
Figure 16H:
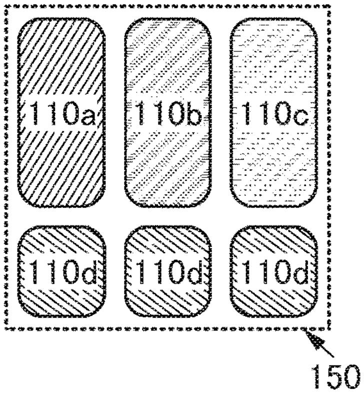

FIG. 16G and FIG. 16H each illustrate an example in which one pixel 150 is composed of two rows and three columns.

The pixel 150 illustrated in FIG. 16G includes three subpixels (the subpixel 110*a*, the subpixel 110*b*, and the subpixel 110*c*) in the upper row (first row) and one subpixel (a subpixel 110*d*) in the lower row (second row). In other words, the pixel 150 includes the subpixel 110*a* in the left column (first column), the subpixel 110*b* in the center column (second column), the subpixel 110*c* in the right column (third column), and the subpixel 110*d* across these three columns.

The pixel 150 illustrated in FIG. 16H includes three subpixels (the subpixel 110*a*, the subpixel 110*b*, and the subpixel 110*c*) in the upper row (first row) and three subpixels 110*d* in the lower row (second row). In other words, the pixel 150 includes the subpixel 110*a* and the subpixel 110*d* in the left column (first column), the subpixel 110*b* and another subpixel 110*d* in the center column (second column), and the subpixel 110*c* and another subpixel 110*d* in the right column (third column). Matching the positions of the subpixels in the upper row and the lower row as illustrated in FIG. 16H enables efficient removal of dust and the like that would be produced in the manufacturing process. Thus, a display device with high display quality can be provided.

Figure 16I:
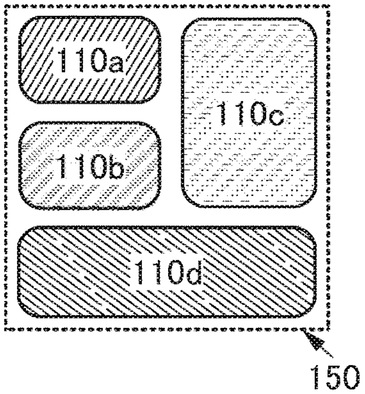

FIG. 16I illustrates an example in which one pixel 150 is composed of three rows and two columns.

The pixel 150 illustrated in FIG. 16I includes the subpixel 110*a* in the upper row (first row), the subpixel 110*b* in the center row (second row), the subpixel 110*c* across the first and second rows, and one subpixel (the subpixel 110*d*) in the lower row (third row). In other words, the pixel 150 includes the subpixel 110*a* and the subpixel 110*b* in the left column (first column), the subpixel 110*c* in the right column (second column), and the subpixel 110*d* across these two columns.

The pixels 150 illustrated in FIG. 16A to FIG. 16I each consist of four subpixels: the subpixel 110*a*, the subpixel 110*b*, the subpixel 110*c*, and the subpixel 110*d*.

The subpixel 110*a*, the subpixel 110*b*, the subpixel 110*c*, and the subpixel 110*d* can include light-emitting elements that emit light of different colors. The subpixel 110*a*, the subpixel 110*b*, the subpixel 110*c*, and the subpixel 110*d* can be subpixels of four colors of R, G, B, and white (W), subpixels of four colors of R, G, B, and Y, or subpixels of R, G, B, and infrared light (IR), for example.

In each of the pixels 150 illustrated in FIG. 16A to FIG. 16I, it is preferable that the subpixel 110*a* be the subpixel R emitting red light, the subpixel 110*b* be the subpixel G emitting green light, the subpixel 110*c* be the subpixel B emitting blue light, and the subpixel 110*d* be any of a subpixel W emitting white light, a subpixel Y emitting yellow light, and a subpixel IR emitting near-infrared light, for example. In the case of such a structure, stripe arrangement is employed as the layout of R, G, and B in the pixels 150 illustrated in FIG. 16G and FIG. 16H, leading to higher display quality. In addition, what is called S-stripe arrangement is employed as the layout of R, G, and B in the pixel 150 illustrated in FIG. 16I, leading to higher display quality.

As described above, the pixel composed of the subpixels each including the light-emitting element can employ any of a variety of layouts in the display device of one embodiment of the present invention.

This embodiment can be combined with the other embodiments as appropriate.

Embodiment 2

In this embodiment, other structure examples of the display device (display panel) described above in one embodiment of the present invention will be described. Display devices (display panels) described below as examples can be used as the display device 100A and the like in Embodiment 1. The display devices (display panels) described below as examples each include a transistor.

Display devices in this embodiment can be high-resolution display devices. For example, display devices of one embodiment of the present invention can be used for display portions of information terminal devices (wearable devices) such as wristwatch-type and bracelet-type information terminal devices and display portions of wearable devices that can be worn on a head, such as VR devices like head-mounted displays and glasses-type AR devices.

[Display Module]

Figure 17A:
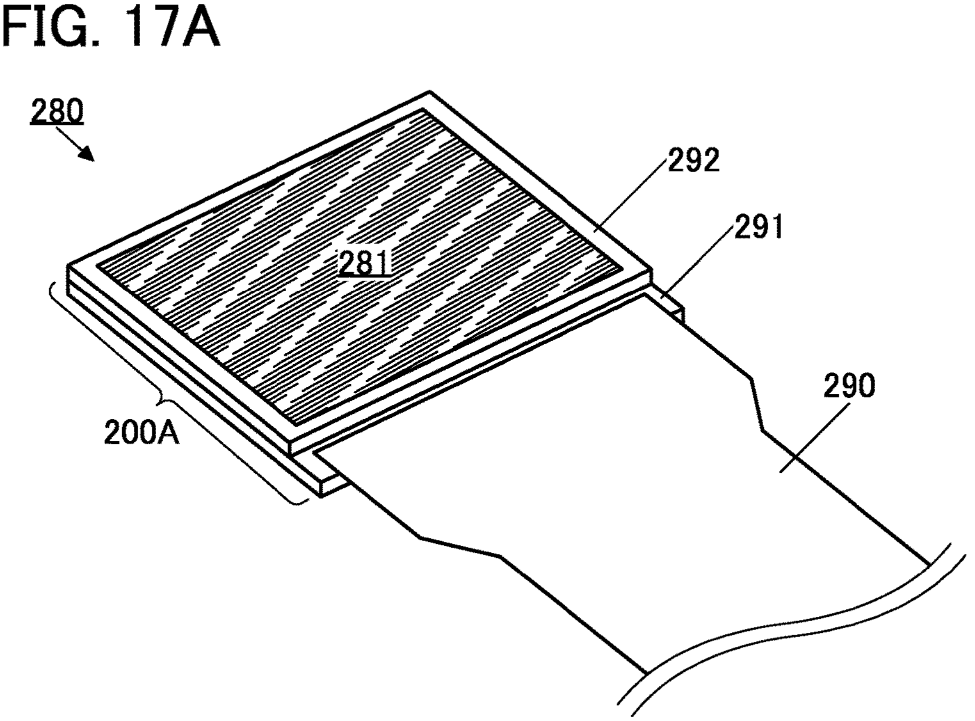
FIG. 17A and FIG. 17B are diagrams illustrating a structure example of a display device.

FIG. 17A is a perspective view of a display module 280. The display module 280 includes a display device 200A and an FPC 290. Note that a display panel included in the display module 280 is not limited to the display device 200A and may be any of a display device 200B to a display device 200G described later.

The display module 280 includes a substrate 291 and a substrate 292. The display module 280 includes a display portion 281. The display portion 281 is a region where an image is displayed.

Figure 17B:
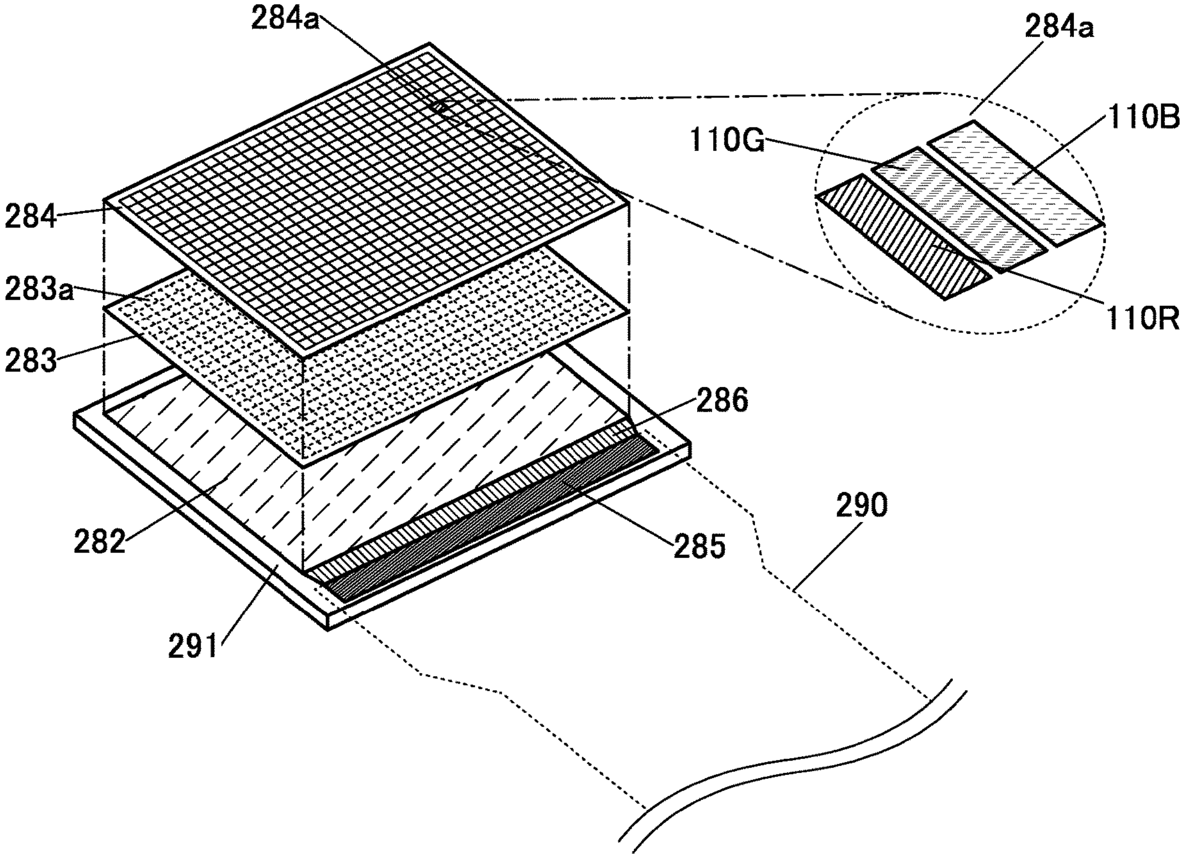

FIG. 17B is a perspective view schematically illustrating a structure on the substrate 291 side. Over the substrate 291, a circuit portion 282, a pixel circuit portion 283 over the circuit portion 282, and a pixel portion 284 over the pixel circuit portion 283 are stacked. In addition, a terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side in FIG. 17B. The pixel 284*a* includes the light-emitting element 110R that emits red light, the light-emitting element 110G that emits green light, and the light-emitting element 110B that emits blue light.

The pixel circuit portion 283 includes a plurality of pixel circuits 283*a* arranged periodically. One pixel circuit 283*a* is a circuit for controlling light emission of three light-emitting elements included in one pixel 284*a*. One pixel circuit 283*a* may be provided with three circuits for controlling light emission of one light-emitting element. For example, the pixel circuit 283*a* can include at least one selection transistor, one current control transistor (driving transistor), and a capacitor for one light-emitting element. In that case, a gate signal is input to a gate of the selection transistor, and a source signal is input to a source of the selection transistor. Thus, an active-matrix display panel is achieved.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may further include at least one of an arithmetic circuit, a memory circuit, a power supply circuit, and the like. In addition, a transistor provided in the circuit portion 282 may constitute part of the pixel circuit 283*a*. That is, the pixel circuit 283*a* may be constituted by a transistor included in the pixel circuit portion 283 and a transistor included in the circuit portion 282.

The FPC 290 functions as a wiring for supplying a video signal, a power supply potential, and the like to the circuit portion 282 from the outside. In addition, an IC may be mounted on the FPC 290.

The display module 280 can have a structure in which one or both of the pixel circuit portion 283 and the circuit portion 282 are stacked below the pixel portion 284; thus, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284*a* are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head-mounted display or a glasses-type AR device. For example, even in the case of a structure in which the display portion of the display module 280 is seen through a lens, pixels of the extremely-high-resolution display portion 281 included in the display module 280 are not seen even when the display portion is enlarged by the lens, so that display providing a high sense of immersion can be performed. Without being limited thereto, the display module 280 can also be suitably used for an electronic device having a comparatively small display portion. For example, the display module 280 can be suitably used for a display portion of a wearable electronic device such as a wristwatch.

[Display Device 200A]

Figure 18:
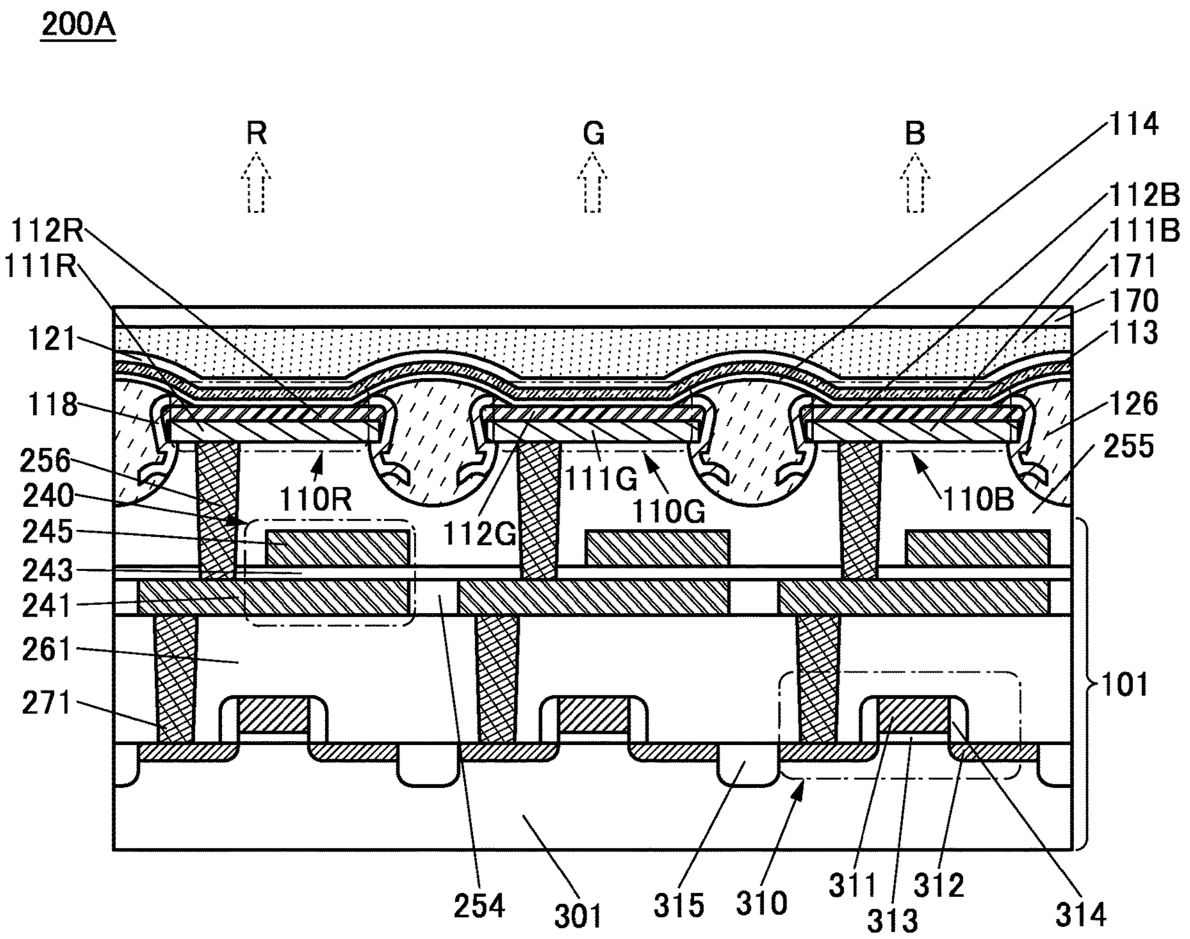
FIG. 18 is a diagram illustrating a structure example of a display device.

The display device 200A illustrated in FIG. 18 includes a substrate 301, the light-emitting element 110R, the light-emitting element 110G, the light-emitting element 110B, a capacitor 240, and a transistor 310.

The substrate 301 corresponds to the substrate 291 in FIG. 17A and FIG. 17B. A stacked-layer structure including the substrate 301 and the components thereover up to the capacitor 240 corresponds to the substrate 101 in Embodiment 1.

The transistor 310 is a transistor that includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311 and functions as an insulating layer.

In addition, an element isolation layer 315 is provided between two adjacent transistors 310 to be embedded in the substrate 301.

Furthermore, an insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 240.

An inorganic insulating film can be suitably used as the insulating layer 255. For example, a silicon oxide film, a silicon nitride film, or the like can be used as the insulating layer 255. In this embodiment, an example in which a depression is formed by etching of part of the insulating layer 255 will be described.

Note that the insulating layer 255 may have a stacked-layer structure of three layers of a first insulating layer, a second insulating layer over the first insulating layer, and a third insulating layer over the second insulating layer. An inorganic insulating film can be suitably used as each of the first insulating layer, the second insulating layer, and the third insulating layer. For example, it is preferable to use a silicon oxide film as each of the first insulating layer and the third insulating layer and to use a silicon nitride film as the second insulating layer. This enables the second insulating layer to function as an etching protective film.

The insulating layer 255 corresponds to the insulating layer 105 in FIG. 1B. In the case where the insulating layer 255 has a stacked-layer structure, one or more of a plurality of layers included in the insulating layer 255 correspond to the insulating layer 105 in FIG. 1B.

The light-emitting element 110R, the light-emitting element 110G, and the light-emitting element 110B are provided over the insulating layer 255. Embodiment 1 can be referred to for the structures of the light-emitting element 110R, the light-emitting element 110G, and the light-emitting element 110B.

In the display device 200A, the light-emitting elements of different colors are separately formed; thus, a change in chromaticity between light emission at low luminance and light emission at high luminance is small. Furthermore, since the organic layer 112R, the organic layer 112G, and the organic layer 112B are separated from each other, crosstalk generated between adjacent subpixels can be inhibited while the display panel has high resolution. It is thus possible to achieve a display panel that has high resolution and high display quality.

In a region between adjacent light-emitting elements, the insulating layer 118 and the resin layer 126 are provided.

The pixel electrode 111R, the pixel electrode 111G, and the pixel electrode 111B of the light-emitting elements are electrically connected to one of the source and the drain of the transistor 310 through a plug 256 embedded in the insulating layer 255, the conductive layer 241 embedded in the insulating layer 254, and the plug 271 embedded in the insulating layer 261. The top surface of the insulating layer 255 and the top surface of the plug 256 are level with or substantially level with each other. A variety of conductive materials can be used for the plugs.

The plug 256 corresponds to the plug 131 in FIG. 1B.

The protective layer 121 is provided over the light-emitting element 110R, the light-emitting element 110G, and the light-emitting element 110B. A substrate 170 is attached onto the protective layer 121 with an adhesive layer 171.

An insulating layer covering an end portion of the top surface of the pixel electrode 111 is not provided between two adjacent pixel electrodes 111. Thus, the distance between adjacent light-emitting elements can be extremely narrow. Accordingly, the display device can have high resolution or high definition.

[Display Device 200B]

Figure 19:
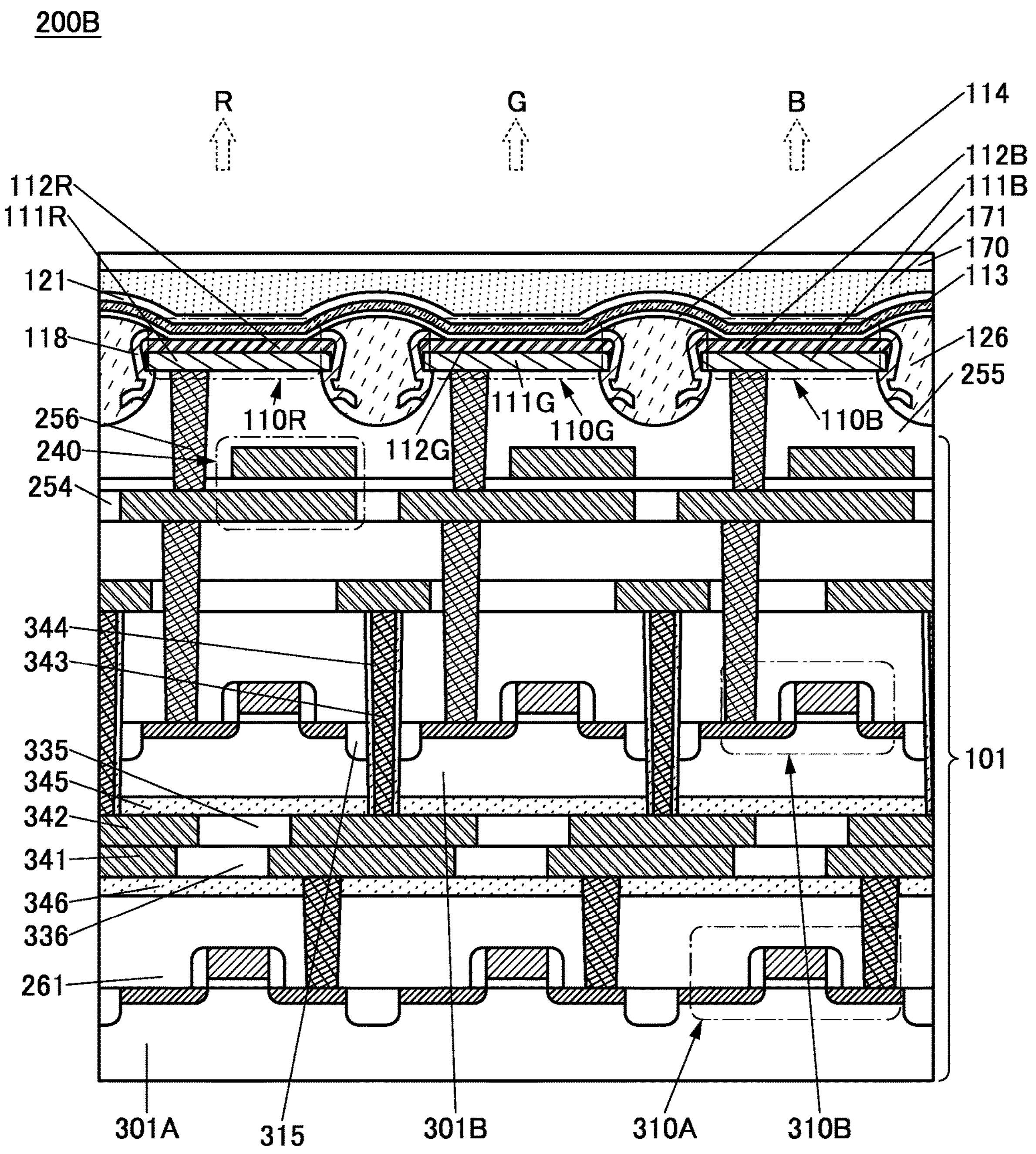
FIG. 19 is a diagram illustrating a structure example of a display device.

The display device 200B illustrated in FIG. 19 has a structure in which a transistor 310A and a transistor 310B in each of which a channel is formed in a semiconductor substrate are stacked. Note that in the following description of the display panel, the description of portions similar to those of the above display panel is omitted in some cases.

The display device 200B has a structure in which a substrate 301B provided with the transistor 310B, the capacitor 240, and the light-emitting elements is attached to a substrate 301A provided with the transistor 310A.

Here, an insulating layer 345 is provided on the bottom surface of the substrate 301B, and an insulating layer 346 is provided over the insulating layer 261 provided over the substrate 301A. The insulating layer 345 and the insulating layer 346 are insulating layers functioning as protective layers and can inhibit diffusion of impurities into the substrate 301B and the substrate 301A. For the insulating layer 345 and the insulating layer 346, an inorganic insulating film that can be used for the protective layer 121 or an insulating layer 332 can be used.

The substrate 301B is provided with a plug 343 that penetrates the substrate 301B and the insulating layer 345. Here, an insulating layer 344 functioning as a protective layer is preferably provided to cover the side surface of the plug 343.

A conductive layer 342 is provided under the insulating layer 345 on the substrate 301B. The conductive layer 342 is embedded in an insulating layer 335, and the bottom surfaces of the conductive layer 342 and the insulating layer 335 are planarized. The conductive layer 342 is electrically connected to the plug 343.

Meanwhile, a conductive layer 341 is provided over the insulating layer 346 over the substrate 301A. The conductive layer 341 is embedded in an insulating layer 336, and the top surfaces of the conductive layer 341 and the insulating layer 336 are planarized.

The same conductive material is preferably used for the conductive layer 341 and the conductive layer 342. A metal film containing an element selected from Al, Cr, Cu, Ta, Ti, Mo, and W, a metal nitride film containing the above element as a component (a titanium nitride film, a molybdenum nitride film, or a tungsten nitride film), or the like can be used, for example. Copper is particularly preferably used for the conductive layer 341 and the conductive layer 342. Accordingly, it is possible to employ a Cu-to-Cu (copper-to-copper) direct bonding technique (a technique for achieving electrical continuity by connecting Cu (copper) pads to each other).

[Display Device 200C]

Figure 20:
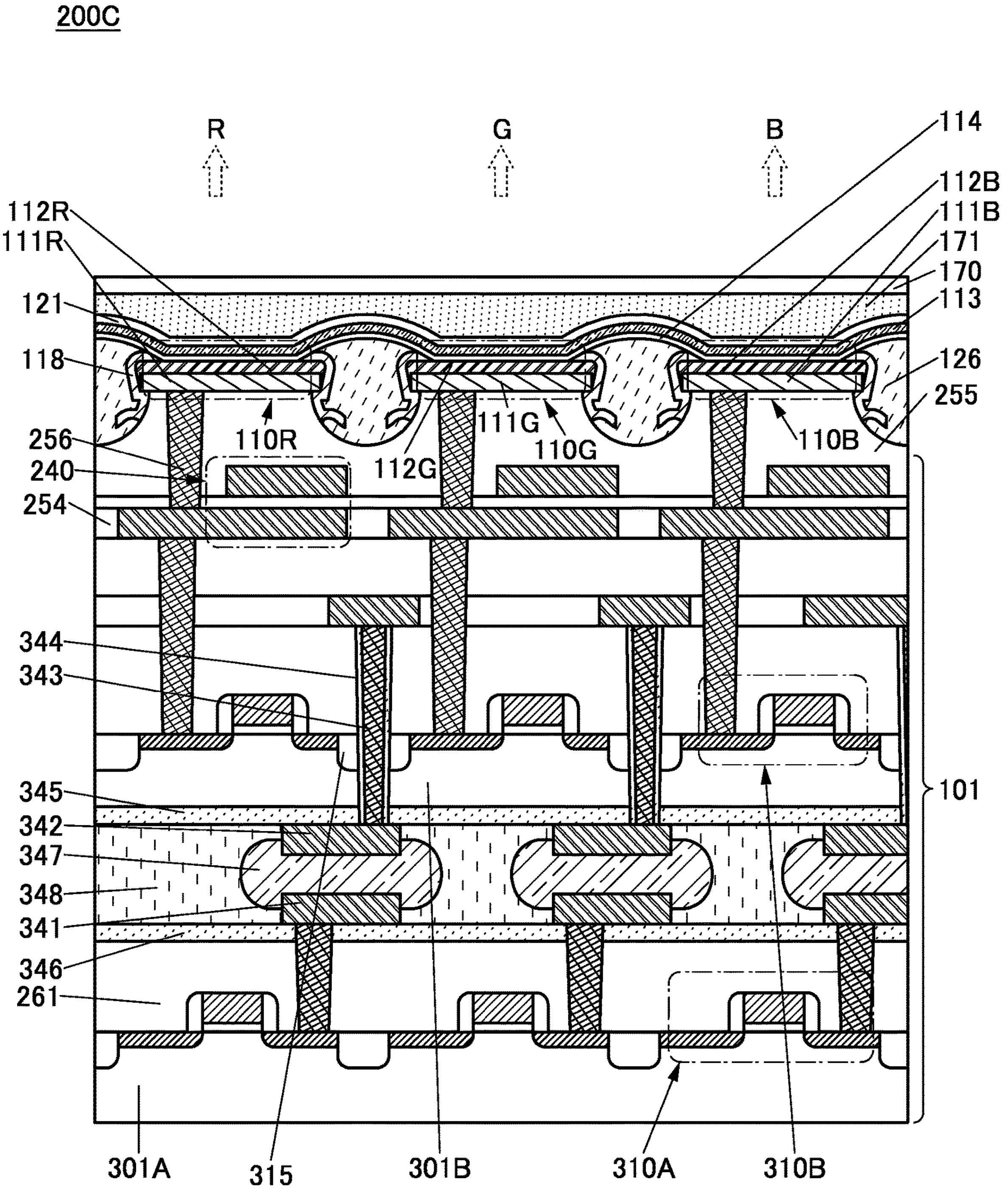
FIG. 20 is a diagram illustrating a structure example of a display device.

The display device 200C illustrated in FIG. 20 has a structure in which the conductive layer 341 and the conductive layer 342 are bonded to each other with a bump 347.

As illustrated in FIG. 20, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. For another example, solder is used for the bump 347 in some cases. In addition, an adhesive layer 348 may be provided between the insulating layer 345 and the insulating layer 346. In the case where the bump 347 is provided, a structure without the insulating layer 335 and the insulating layer 336 may be employed.

[Display Device 200D]

Figure 21:
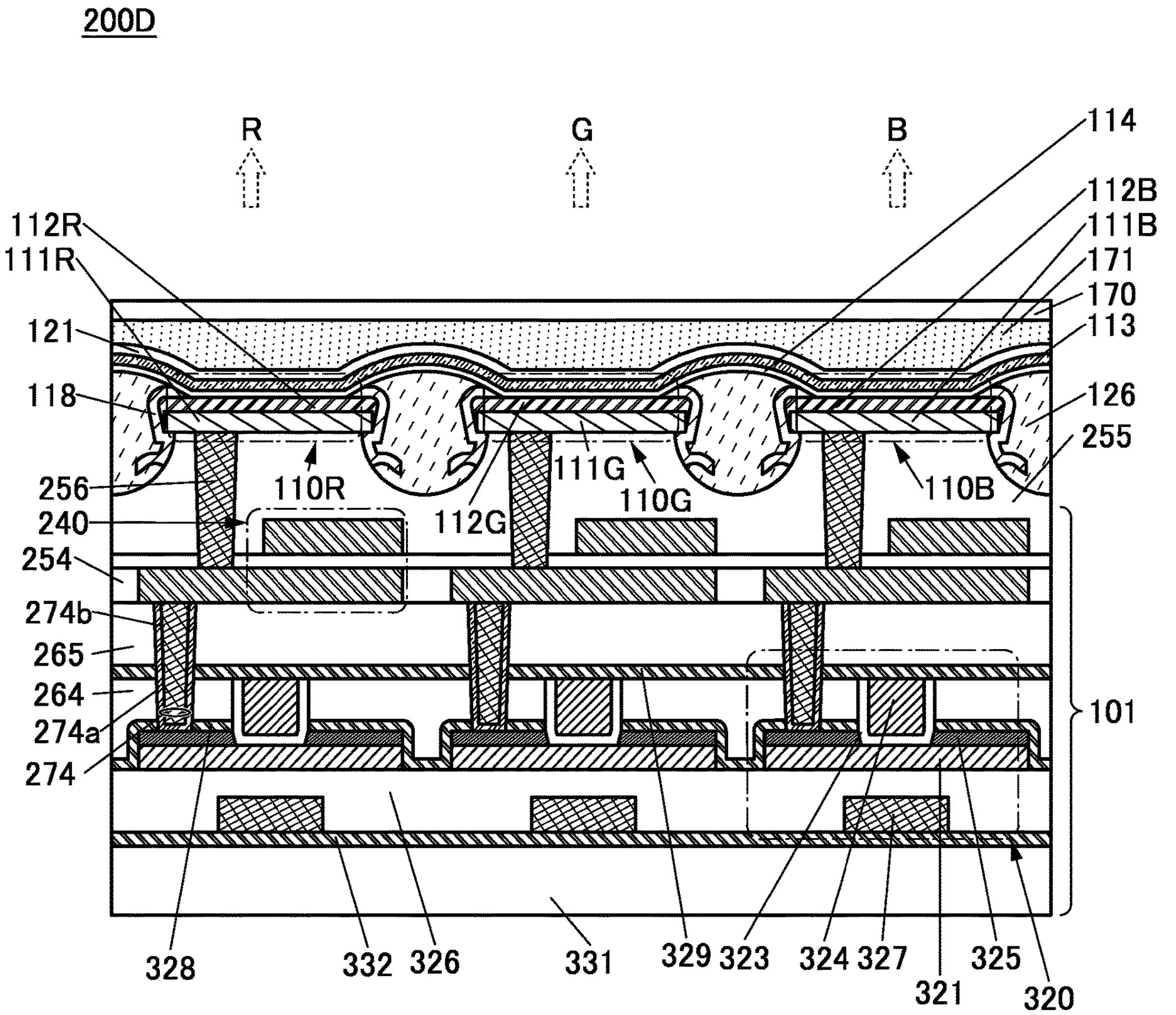
FIG. 21 is a diagram illustrating a structure example of a display device.

The display device 200D illustrated in FIG. 21 differs from the display device 200A mainly in a transistor structure.

A transistor 320 is a transistor (an OS transistor) in which a metal oxide (also referred to as an oxide semiconductor) is used in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 17A and FIG. 17B.

The insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used for at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film exhibiting semiconductor characteristics. The pair of conductive layers 325 are provided over and in contact with the semiconductor layer 321, and function as a source electrode and a drain electrode.

An insulating layer 328 is provided to cover the top surfaces and side surfaces of the pair of conductive layers 325, the side surfaces of the semiconductor layer 321, and the like, and an insulating layer 264 is provided over the insulating layer 328. The insulating layer 328 functions as a barrier layer that prevents diffusion of impurities such as water and hydrogen from the insulating layer 264 or the like into the semiconductor layer 321 and release of oxygen from the semiconductor layer 321. For the insulating layer 328, an insulating film similar to the insulating layer 332 can be used.

An opening reaching the semiconductor layer 321 is provided in the insulating layer 328 and the insulating layer 264. The conductive layer 324 and the insulating layer 323 that is in contact with the top surface of the semiconductor layer 321 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are subjected to planarization treatment so that they are level with or substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 or the like into the transistor 320. For the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers the side surface of an opening in the insulating layer 265, the insulating layer 329, the insulating layer 264, and the insulating layer 328 and part of the top surface of the conductive layer 325, and a conductive layer 274*b* in contact with the top surface of the conductive layer 274*a*. In that case, a conductive material in which hydrogen and oxygen are less likely to diffuse is preferably used for the conductive layer 274*a*.

[Display Device 200E]

Figure 22:
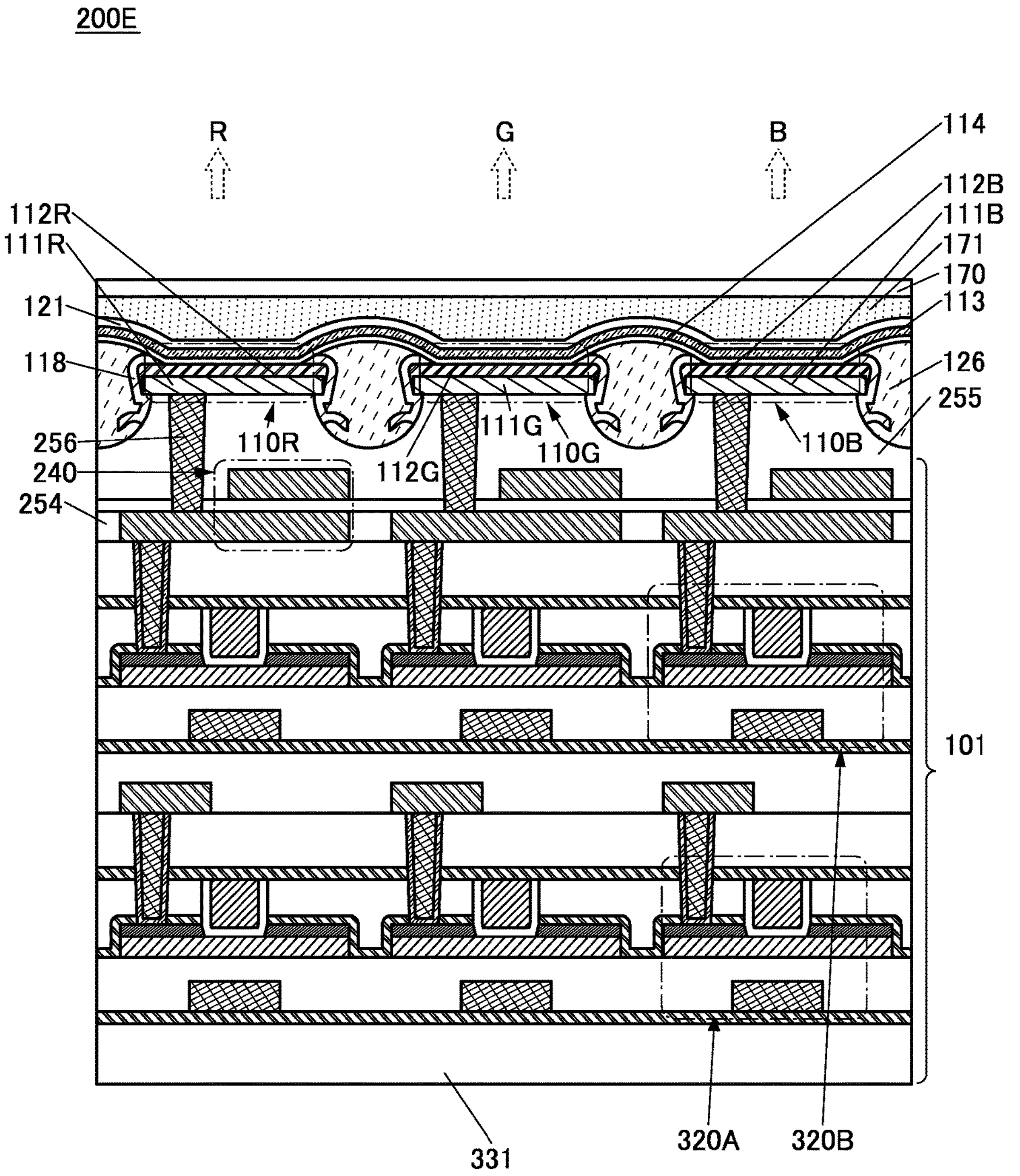
FIG. 22 is a diagram illustrating a structure example of a display device.

The display device 200E illustrated in FIG. 22 has a structure in which a transistor 320A and a transistor 320B each including an oxide semiconductor in a semiconductor where a channel is formed are stacked.

The above description of the display device 200D can be referred to for the transistor 320A, the transistor 320B, and the components around them.

Although the structure in which two transistors including an oxide semiconductor are stacked is described here, the present invention is not limited thereto. For example, a structure may be employed in which three or more transistors are stacked.

[Display Device 200F]

Figure 23:
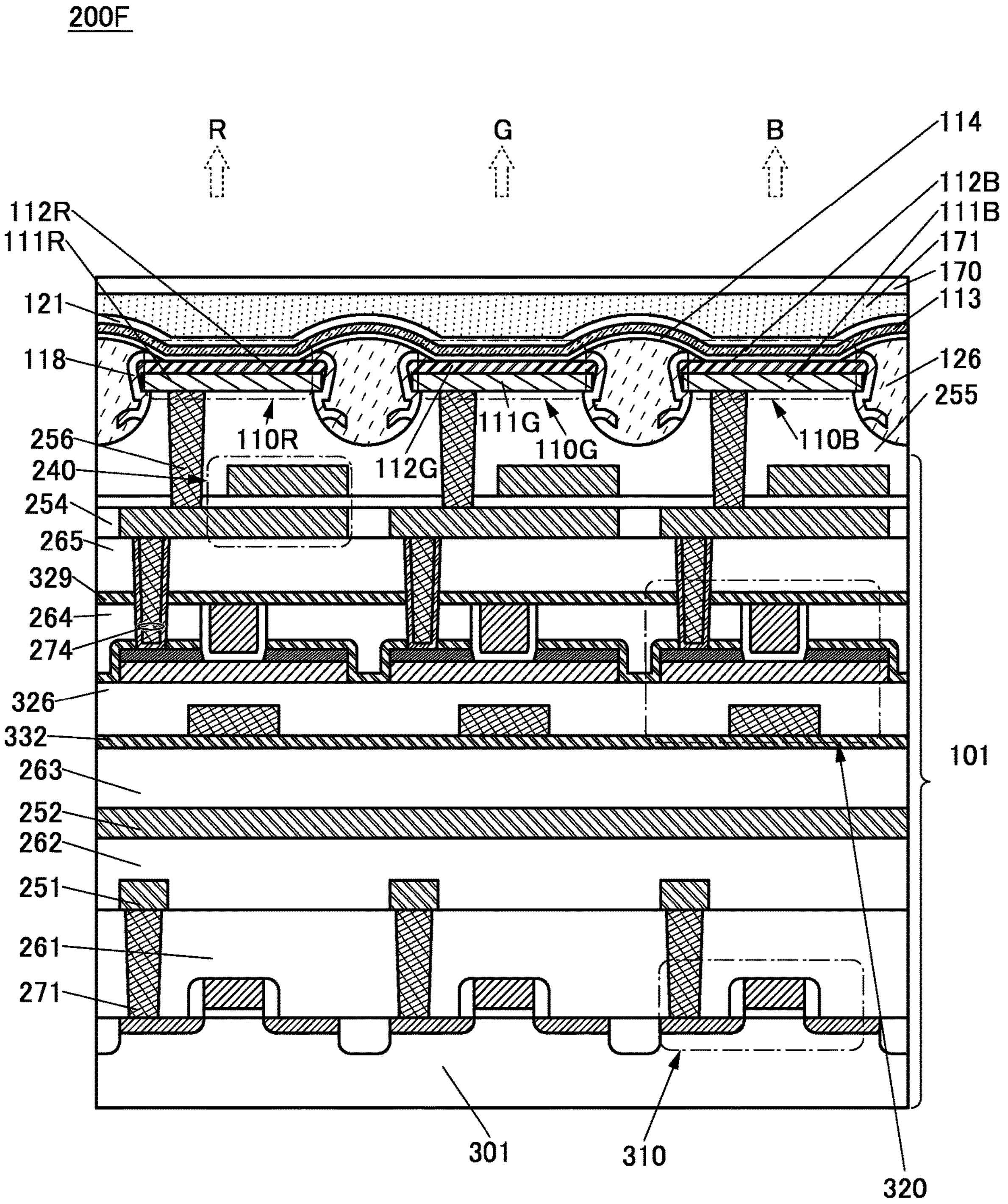
FIG. 23 is a diagram illustrating a structure example of a display device.

The display device 200F illustrated in FIG. 23 has a structure in which the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in a pixel circuit. The transistor 310 can be used as a transistor included in a pixel circuit or a transistor included in a driver circuit (a gate line driver circuit or a source line driver circuit) for driving the pixel circuit. Furthermore, the transistor 310 and the transistor 320 can be used as transistors included in a variety of circuits such as an arithmetic circuit and a memory circuit.

With such a structure, not only the pixel circuit but also the driver circuit and the like can be formed directly under the light-emitting elements; thus, the display panel can be downsized as compared with the case where the driver circuit is provided around a display region.

[Display Device 200G]

Figure 24:
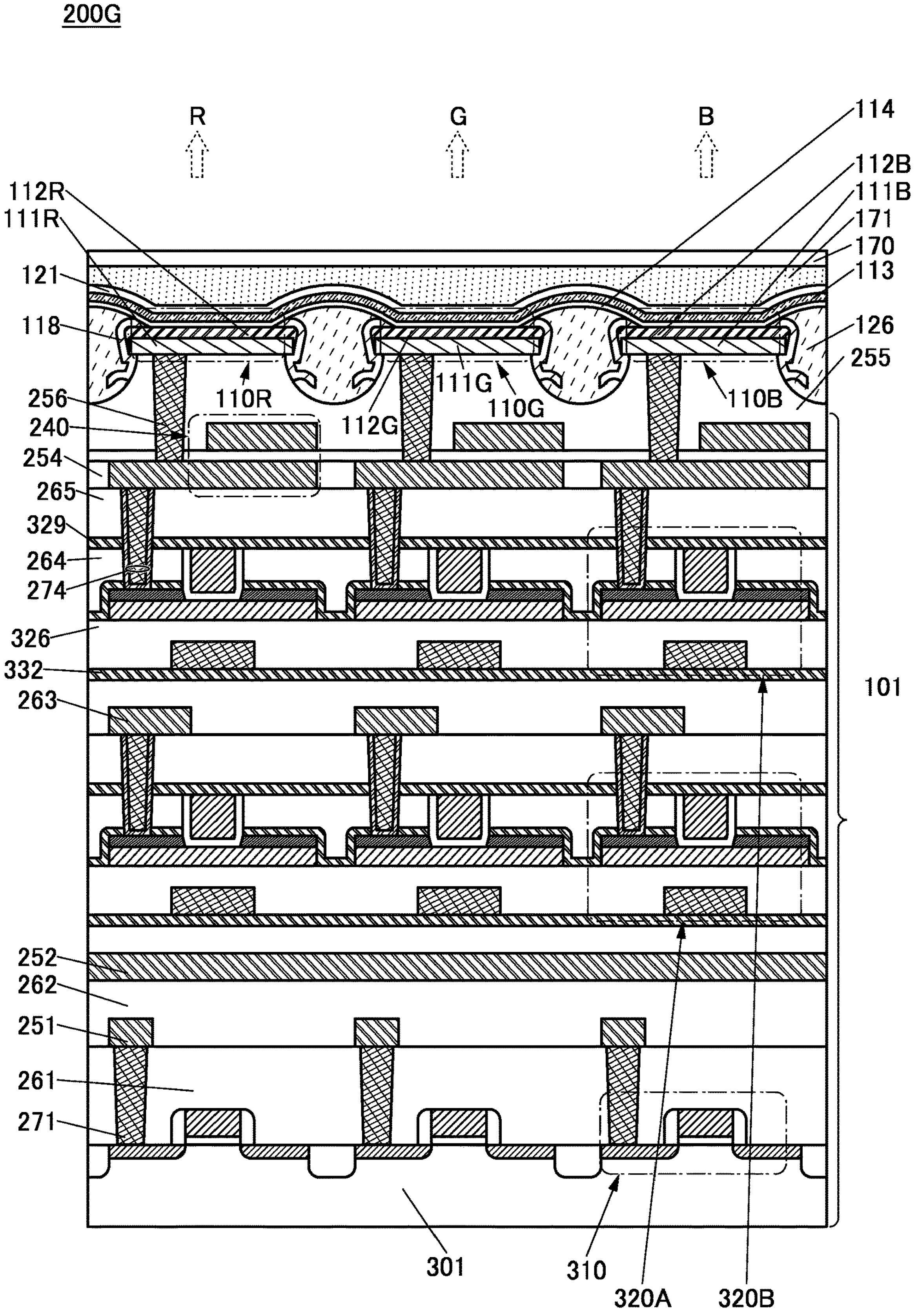
FIG. 24 is a diagram illustrating a structure example of a display device.

The display device 200G illustrated in FIG. 24 has a structure in which the transistor 310 whose channel is formed in the substrate 301 and the transistor 320A and the transistor 320B each including a metal oxide in the semiconductor layer where the channel is formed are stacked.

The transistor 320A can be used as a transistor included in a pixel circuit. The transistor 310 can be used as a transistor included in a pixel circuit or a transistor included in a driver circuit (a gate line driver circuit or a source line driver circuit) for driving the pixel circuit. The transistor 320B may be used as a transistor included in a pixel circuit or the transistor included in the driver circuit. The transistor 310, the transistor 320A, and the transistor 320B can also be used as transistors included in a variety of circuits such as an arithmetic circuit and a memory circuit.

Components such as a transistor that can be used for the display device will be described below.

[Transistor]

The transistors each include a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device of one embodiment of the present invention. For example, a planar transistor, a staggered transistor, or an inverted staggered transistor may be used. A top-gate or bottom-gate transistor structure may be employed. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case degradation of the transistor characteristics can be inhibited.

In particular, a transistor that uses a metal oxide film for a semiconductor layer where a channel is formed will be described below.

As a semiconductor material used for the transistors, a metal oxide whose energy gap is greater than or equal to 2 eV, preferably greater than or equal to 2.5 eV, further preferably greater than or equal to 3 eV can be used. A typical example is a metal oxide containing indium, and a CAC-OS described later can be used, for example.

A transistor using a metal oxide having a wider band gap and a lower carrier concentration than silicon has a low off-state current; thus, charges accumulated in a capacitor that is connected in series with the transistor can be held for a long time.

The semiconductor layer can be, for example, a film represented by an In-M-Zn oxide that contains indium, zinc, and M (M is a metal such as aluminum, titanium, gallium, germanium, yttrium, zirconium, lanthanum, cerium, tin, neodymium, or hafnium).

In the case where the metal oxide contained in the semiconductor layer is an In-M-Zn oxide, the atomic ratio of the metal elements of a sputtering target used for forming a film of the In-M-Zn oxide preferably satisfies In M and Zn M. The atomic ratio of the metal elements of such a sputtering target is preferably In:M:Zn=1:1:1, In:M:Zn=1:1:1.2, In:M:Zn=1:1:2, In:M:Zn=3:1:2, In:M:Zn=4:2:3, In:M:Zn=4:2:4.1, In:M:Zn=5:1:6, In:M:Zn=5:1:7, or In:M:Zn=5:1:8, for example. Note that the atomic ratio in the formed semiconductor layer varies from the atomic ratio of the metal elements contained in the sputtering target in a range of ±40%.

A metal oxide film with a low carrier concentration is used for the semiconductor layer. For example, for the semiconductor layer, a metal oxide whose carrier concentration is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, even further preferably lower than $1\times10^{10}$ $cm^{-3}$, and higher than or equal to $1\times10^{-9}$ $cm^{-3}$ can be used. Such a metal oxide is referred to as a highly purified intrinsic or substantially highly purified intrinsic metal oxide. The oxide semiconductor has a low density of defect states and can be regarded as a metal oxide having stable characteristics.

Note that the composition is not limited to those, and an oxide semiconductor having an appropriate composition may be used depending on required semiconductor characteristics and electrical characteristics (field-effect mobility, threshold voltage, and the like) of the transistor. In addition, to obtain the required semiconductor characteristics of the transistor, it is preferable that the carrier concentration, impurity concentration, defect density, atomic ratio between a metal element and oxygen, interatomic distance, density, and the like of the semiconductor layer be set to be appropriate.

When silicon or carbon, which is one of Group 14 elements, is contained in the metal oxide contained in the semiconductor layer, oxygen vacancies are increased in the semiconductor layer, and the semiconductor layer becomes n-type. Thus, the concentration (concentration obtained by secondary ion mass spectrometry) of silicon or carbon in the semiconductor layer is set lower than or equal to $2\times10^{18}$ atoms/$cm^3$, preferably lower than or equal to $2\times10^{17}$ atoms/$cm^3$.

Alkali metal and alkaline earth metal might generate carriers when bonded to a metal oxide, in which case the off-state current of the transistor might be increased. Thus, the concentration of alkali metal or alkaline earth metal in the semiconductor layer that is obtained by secondary ion mass spectrometry is set lower than or equal to $1\times10^{18}$ atoms/$cm^3$, preferably lower than or equal to $2\times10^{16}$ atoms/$cm^3$.

When nitrogen is contained in the metal oxide contained in the semiconductor layer, electrons serving as carriers are generated and the carrier concentration is increased, so that the semiconductor layer easily becomes n-type. As a result, a transistor using a metal oxide containing nitrogen easily has normally-on characteristics. Thus, the nitrogen concentration in the semiconductor layer that is obtained by secondary ion mass spectrometry is preferably set lower than or equal to $5\times10^{18}$ atoms/$cm^3$.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

A CAC-OS (cloud-aligned composite oxide semiconductor) may be used for the semiconductor layer of the transistor disclosed in one embodiment of the present invention.

Note that the non-single-crystal oxide semiconductor can be suitably used for the semiconductor layer of the transistor disclosed in one embodiment of the present invention. As the non-single-crystal oxide semiconductor, the nc-OS, the CAAC-OS, or the CAC-OS can be suitably used.

The semiconductor layer may be a mixed film including two or more kinds of a region of a CAAC-OS, a region of a polycrystalline oxide semiconductor, a region of an nc-OS, a region of a CAC-OS, a region of an amorphous-like oxide semiconductor, and a region of an amorphous oxide semiconductor. For example, the mixed film sometimes has a single-layer structure or a stacked-layer structure including two or more kinds of the above regions.

Unlike a transistor using low-temperature polysilicon, the transistor including a metal oxide film in the semiconductor layer does not need a laser crystallization step. Thus, the manufacturing cost of a display device can be reduced even when the display device is formed using a large area substrate. Furthermore, the transistor including a CAC-OS in the semiconductor layer is preferably used for a driver circuit and a display portion in a large display device having high resolution such as ultra-high definition ("4K definition", "4K2K", or "4K") or super high definition ("8K definition", "8K4K", or "8K"), in which case writing can be performed in a short time and display defects can be reduced.

Alternatively, silicon may be used for a semiconductor where a channel of a transistor is formed. As the silicon, amorphous silicon may be used but silicon having crystallinity is particularly preferably used. For example, microcrystalline silicon, polycrystalline silicon, or single crystal silicon is preferably used. In particular, polycrystalline silicon can be formed at a temperature lower than that for single crystal silicon and has higher field-effect mobility and higher reliability than amorphous silicon.

[Conductive Layer]

Examples of materials that can be used for conductive layers of a variety of wirings and electrodes and the like included in the display device in addition to a gate, a source, and a drain of a transistor include metals such as aluminum, titanium, chromium, nickel, copper, yttrium, zirconium, molybdenum, silver, tantalum, and tungsten and an alloy containing such a metal as its main component. Alternatively, a single layer or a stacked-layer structure including a film containing these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, and a three-layer structure in which an aluminum film or a copper film is stacked over a molybdenum film or a molybdenum nitride film and a molybdenum film or a molybdenum nitride film is formed thereover can be given. Note that an oxide such as indium oxide, tin oxide, or zinc oxide may be used. Copper containing manganese is preferably used because it increases controllability of a shape by etching.

[Insulating Layer]

As an insulating material that can be used for each insulating layer, for example, an inorganic insulating material such as silicon oxide, silicon oxynitride, silicon nitride oxide, silicon nitride, or aluminum oxide, in addition to a resin such as an acrylic resin or an epoxy resin and a resin having a siloxane bond, such as silicone, can be used.

The light-emitting element is preferably provided between a pair of insulating films with low water permeability. In that case, impurities such as water can be inhibited from entering the light-emitting element; thus, a decrease in device reliability can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

At least part of this embodiment can be implemented in combination with the other embodiments described in this specification as appropriate.

Embodiment 3

In this embodiment, a light-emitting element that can be used in the display device of one embodiment of the present invention will be described.

Figure 25A:
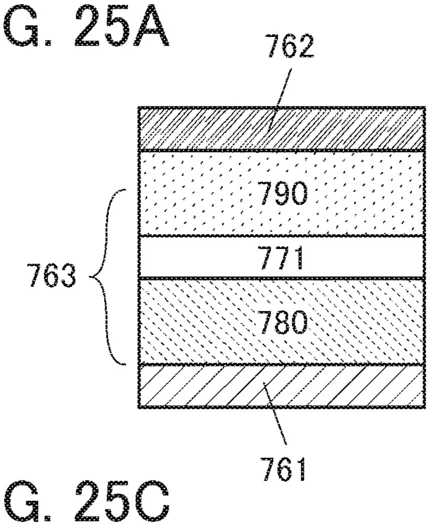
FIG. 25A to FIG. 25F are diagrams illustrating structure examples of a light-emitting element.

As illustrated in FIG. 25A, the light-emitting element includes an EL layer 763 between a pair of electrodes (a lower electrode 761 and an upper electrode 762). The EL layer 763 can be formed using a plurality of layers such as a layer 780, a light-emitting layer 771, and a layer 790.

The light-emitting layer 771 contains at least a light-emitting substance (also referred to as a light-emitting material).

In the case where the lower electrode 761 is an anode and the upper electrode 762 is a cathode, the layer 780 includes one or more of a layer containing a substance with a high hole-injection property (a hole-injection layer), a layer containing a substance with a high hole-transport property (a hole-transport layer), and a layer containing a substance with a high electron-blocking property (an electron-blocking layer). Furthermore, the layer 790 includes one or more of a layer containing a substance with a high electron-injection property (an electron-injection layer), a layer containing a substance with a high electron-transport property (an electron-transport layer), and a layer containing a substance with a high hole-blocking property (a hole-blocking layer). In the case where the lower electrode 761 is a cathode and the upper electrode 762 is an anode, the structures of the layer 780 and the layer 790 are interchanged.

The structure including the layer 780, the light-emitting layer 771, and the layer 790 that is provided between the pair of electrodes can function as a single light-emitting unit, and the structure in FIG. 25A is referred to as a single structure in this specification.

Figure 25B:
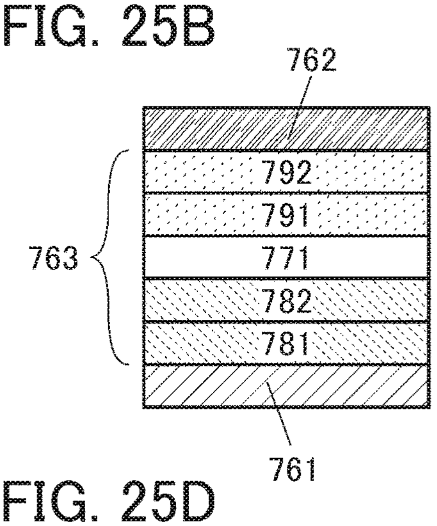

FIG. 25B is a modification example of the EL layer 763 included in the light-emitting element illustrated in FIG. 25A. Specifically, the light-emitting element illustrated in FIG. 25B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. Alternatively, in the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layer structure, carriers can be efficiently injected to the light-emitting layer 771, and the efficiency of recombination of carriers in the light-emitting layer 771 can be increased.

Figure 25C:
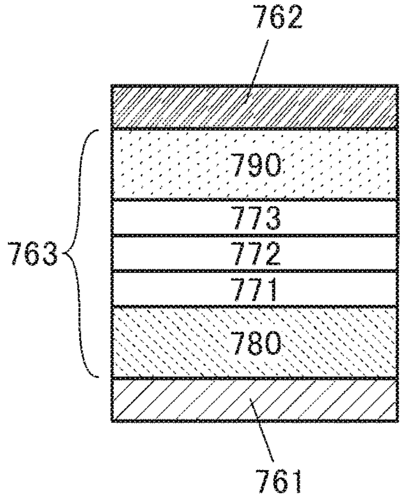
Figure 25D:
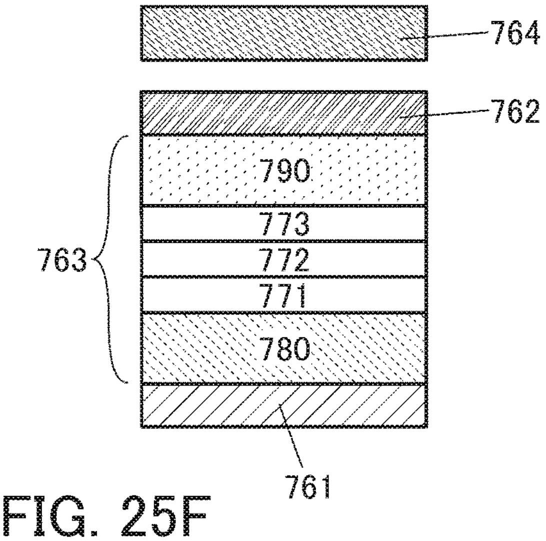

Note that structures in which a plurality of light-emitting layers (the light-emitting layer 771, a light-emitting layer 772, and a light-emitting layer 773) are provided between the layer 780 and the layer 790 as illustrated in FIG. 25C and FIG. 25D are other variations of the single structure. Although FIG. 25C and FIG. 25D each illustrate the example in which three light-emitting layers are included, the light-emitting element having the single structure may include two light-emitting layers or four or more light-emitting layers. In addition, the light-emitting element having the single structure may include a buffer layer between two light-emitting layers.

Figure 25E:
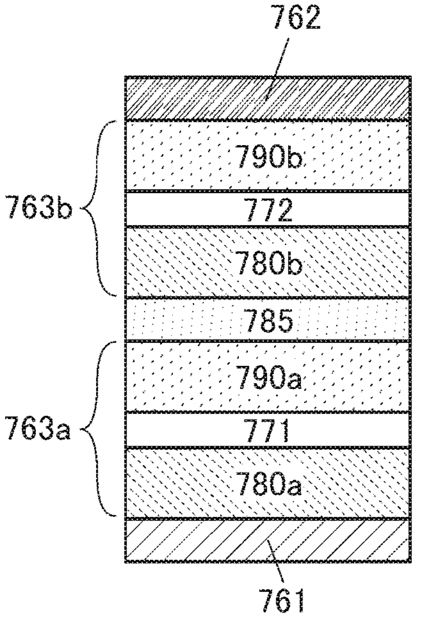
Figure 25F:
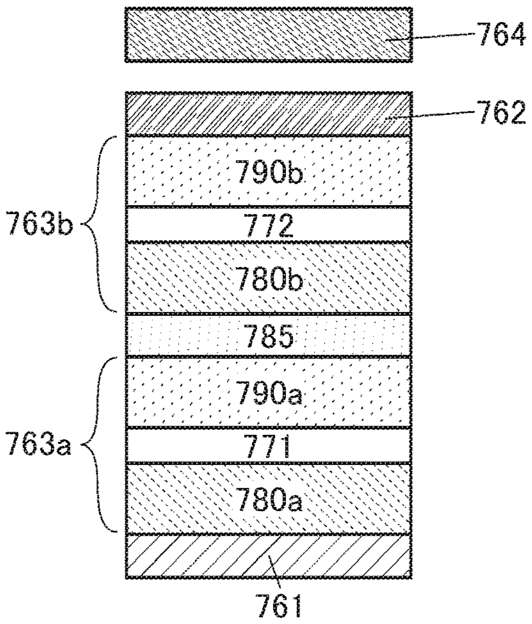

In addition, a structure in which a plurality of light-emitting units (a light-emitting unit 763*a* and a light-emitting unit 763*b*) are connected in series with a charge-generation layer 785 (also referred to as an intermediate layer) therebetween as illustrated in FIG. 25E and FIG. 25F is referred to as a tandem structure in this specification. Note that the tandem structure may be referred to as a stack structure. The tandem structure enables a light-emitting element to emit light at high luminance. Furthermore, the tandem structure can reduce the amount of current needed for obtaining the same luminance as compared with the single structure, and thus can increase the reliability.

Note that FIG. 25D and FIG. 25F each illustrate an example in which the display device includes a layer 764 overlapping with the light-emitting element. FIG. 25D illustrates an example in which the layer 764 overlaps with the light-emitting element illustrated in FIG. 25C, and FIG. 25F illustrates an example in which the layer 764 overlaps with the light-emitting element illustrated in FIG. 25E. In FIG. 25D and FIG. 25F, a conductive film transmitting visible light is used for the upper electrode 762 to extract light from the upper electrode 762 side.

One or both of a color conversion layer and a color filter (a coloring layer) can be used as the layer 764.

In the case where the light-emitting element having the single structure includes three light-emitting layers, for example, a light-emitting layer containing a light-emitting substance that emits red (R) light, a light-emitting layer containing a light-emitting substance that emits green (G) light, and a light-emitting layer containing a light-emitting substance that emits blue (B) light are preferably included. The stacking order of the light-emitting layers can be R, G, and B from the anode side or R, B, and G from the anode side, for example. In that case, a buffer layer may be provided between R and G or between R and B.

In the case where the light-emitting element having the single structure includes two light-emitting layers, for example, a light-emitting layer containing a light-emitting substance that emits blue (B) light and a light-emitting layer containing a light-emitting substance that emits yellow (Y) light are preferably included. Such a structure is sometimes referred to as a BY single structure.

A light-emitting element that emits white light preferably contains two or more kinds of light-emitting substances. To obtain white light emission, two or more light-emitting substances are selected such that their emission colors are complementary colors. For example, when the emission color of a first light-emitting layer and the emission color of a second light-emitting layer are complementary colors, the light-emitting element can be configured to emit white light as a whole. The same applies to a light-emitting element including three or more light-emitting layers.

Note that also in FIG. 25C and FIG. 25D, the layer 780 and the layer 790 may each independently have a stacked-layer structure of two or more layers as illustrated in FIG. 25B.

In the case where the light-emitting element having the structure illustrated in FIG. 25E or FIG. 25F is used for the subpixels that emit light of the respective colors, the subpixels may use different light-emitting substances. Specifically, in the light-emitting element included in the subpixel that emits red light, a light-emitting substance that emits red light may be used for each of the light-emitting layer 771 and the light-emitting layer 772. Similarly, in the light-emitting element included in the subpixel that emits green light, a light-emitting substance that emits green light may be used for each of the light-emitting layer 771 and the light-emitting layer 772. In the light-emitting element included in the subpixel that emits blue light, a light-emitting substance that emits blue light may be used for each of the light-emitting layer 771 and the light-emitting layer 772. A display device having such a structure can be regarded as employing a light-emitting element with the tandem structure and the SBS structure. Thus, the display device can have both the advantage of a tandem structure and the advantage of an SBS structure. Accordingly, a light-emitting element capable of emitting light at high luminance and having high reliability can be achieved.

Although FIG. 25E and FIG. 25F each illustrate an example in which the light-emitting unit 763*a* includes one light-emitting layer 771 and the light-emitting unit 763*b* includes one light-emitting layer 772, one embodiment of the present invention is not limited thereto. Each of the light-emitting unit 763*a* and the light-emitting unit 763*b* may include two or more light-emitting layers.

Although FIG. 25E and FIG. 25F each illustrate the example of the light-emitting element including two light-emitting units, one embodiment of the present invention is not limited thereto. The light-emitting element may include three or more light-emitting units. Note that a structure including two light-emitting units may be referred to as a two-unit tandem structure, and a structure including three light-emitting units may be referred to as a three-unit tandem structure.

In FIG. 25E and FIG. 25F, the light-emitting unit 763*a* includes a layer 780*a*, the light-emitting layer 771, and a layer 790*a*, and the light-emitting unit 763*b* includes a layer 780*b*, the light-emitting layer 772, and a layer 790*b*.

In the case where the lower electrode 761 is an anode and the upper electrode 762 is a cathode, the layer 780*a* and the layer 780*b* each include one or more of a hole-injection layer, a hole-transport layer, and an electron-blocking layer. The layer 790*a* and the layer 790*b* each include one or more of an electron-injection layer, an electron-transport layer, and a hole-blocking layer. In the case where the lower electrode 761 is a cathode and the upper electrode 762 is an anode, the structures of the layer 780*a* and the layer 790*a* are interchanged, and the structures of the layer 780*b* and the layer 790*b* are also interchanged.

In the case where the lower electrode 761 is an anode and the upper electrode 762 is a cathode, for example, the layer 780*a* includes a hole-injection layer and a hole-transport layer over the hole-injection layer, and may further include an electron-blocking layer over the hole-transport layer. The layer 790*a* includes an electron-transport layer, and may further include a hole-blocking layer between the light-emitting layer 771 and the electron-transport layer. The layer 780*b* includes a hole-transport layer, and may further include an electron-blocking layer over the hole-transport layer. The layer 790*b* includes an electron-transport layer and an electron-injection layer over the electron-transport layer, and may further include a hole-blocking layer between the light-emitting layer 772 and the electron-transport layer. In the case where the lower electrode 761 is a cathode and the upper electrode 762 is an anode, for example, the layer 780*a* includes an electron-injection layer and an electron-transport layer over the electron-injection layer, and may further include a hole-blocking layer over the electron-transport layer. The layer 790*a* includes a hole-transport layer, and may further include an electron-blocking layer between the light-emitting layer 771 and the hole-transport layer. The layer 780*b* includes an electron-transport layer, and may further include a hole-blocking layer over the electron-transport layer. The layer 790*b* includes a hole-transport layer and a hole-injection layer over the hole-transport layer, and may further include an electron-blocking layer between the light-emitting layer 772 and the hole-transport layer.

In the case of fabricating the light-emitting element having the tandem structure, two light-emitting units are stacked with the charge-generation layer 785 therebetween. The charge-generation layer 785 includes at least a charge-generation region. The charge-generation layer 785 has a function of injecting electrons into one of the two light-emitting units and injecting holes into the other when voltage is applied between the pair of electrodes.

Figure 26A:
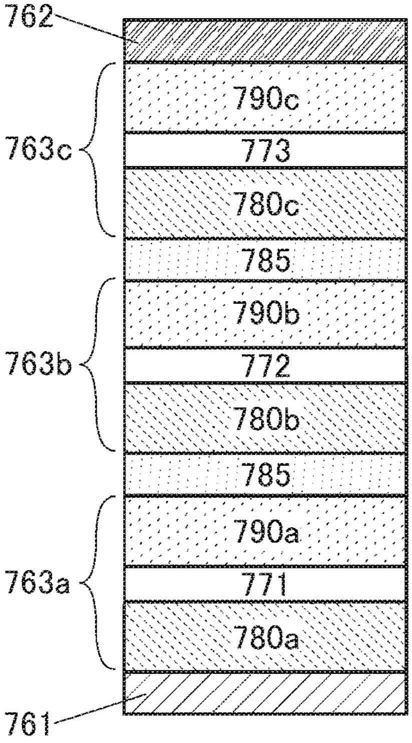
FIG. 26A to FIG. 26C are diagrams illustrating structure examples of a light-emitting element.
Figure 26B:
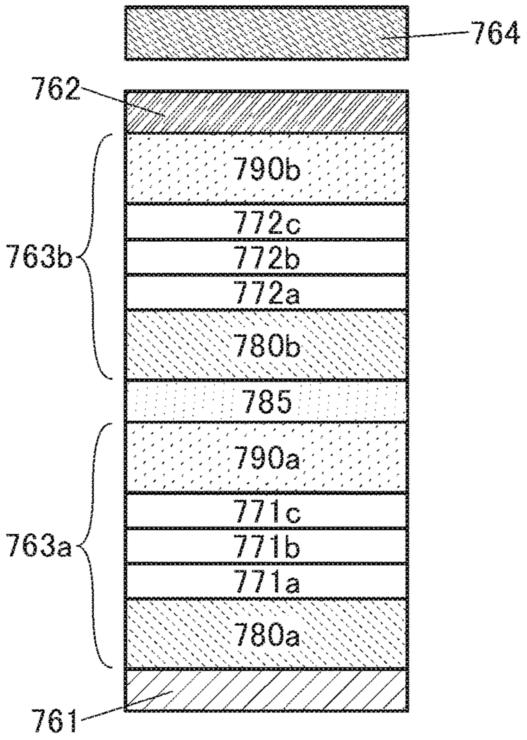
Figure 26C:
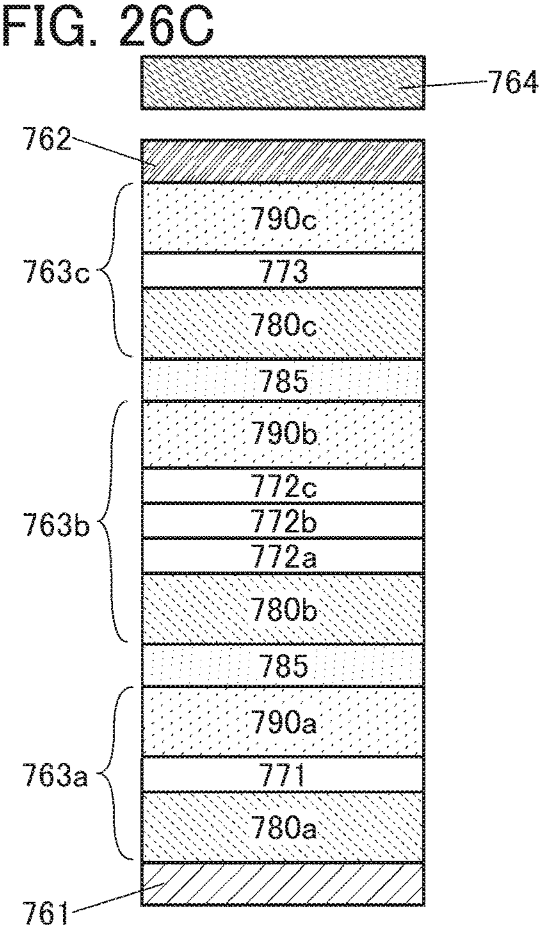

Examples of the light-emitting element having the tandem structure include structures illustrated in FIG. 26A to FIG. 26C.

FIG. 26A illustrates a structure including three light-emitting units. In FIG. 26A, a plurality of light-emitting units (the light-emitting unit 763*a*, the light-emitting unit 763*b*, and a light-emitting unit 763*c*) are connected in series through the charge-generation layers 785. The light-emitting unit 763*a* includes the layer 780*a*, the light-emitting layer 771, and the layer 790*a*. The light-emitting unit 763*b* includes the layer 780*b*, the light-emitting layer 772, and the layer 790*b*. The light-emitting unit 763*c* includes a layer 780*c*, the light-emitting layer 773, and a layer 790*c*. Note that the layer 780*c* can have a structure applicable to the layer 780*a* and the layer 780*b*, and the layer 790*c* can have a structure applicable to the layer 790*a* and the layer 790*b*.

In FIG. 26A, the light-emitting layer 771, the light-emitting layer 772, and the light-emitting layer 773 preferably contain light-emitting substances that emit light of the same color. Specifically, a structure in which the light-emitting layer 771, the light-emitting layer 772, and the light-emitting layer 773 each contain a red (R) light-emitting substance (what is called a three-unit tandem structure of R\R\R), a structure in which the light-emitting layer 771, the light-emitting layer 772, and the light-emitting layer 773 each contain a green (G) light-emitting substance (what is called a three-unit tandem structure of G\GG\), or a structure in which the light-emitting layer 771, the light-emitting layer 772, and the light-emitting layer 773 each contain a blue (B) light-emitting substance (what is called a three-unit tandem structure of B\BB\) can be employed. Note that "a\b" means that a light-emitting unit containing a light-emitting substance that emits light of b is provided over a light-emitting unit containing a light-emitting substance that emits light of a with a charge-generation layer therebetween, where a and b represent colors.

In FIG. 26A, light-emitting substances that emit light of different colors may be used for some or all of the light-emitting layer 771, the light-emitting layer 772, and the light-emitting layer 773. Examples of a combination of emission colors for the light-emitting layer 771, the light-emitting layer 772, and the light-emitting layer 773 include blue (B) for two of them and yellow (Y) for the other; and red (R) for one of them, green (G) for another, and blue (B) for the other.

Note that the structures of the light-emitting substances that emit light of the same color are not limited to the above structures. For example, a light-emitting element having a tandem structure may be employed in which light-emitting units each including a plurality of light-emitting layers are stacked as illustrated in FIG. 26B. FIG. 26B illustrates a structure in which two light-emitting units (the light-emitting unit 763*a* and the light-emitting unit 763*b*) are connected in series with the charge-generation layer 785 therebetween. The light-emitting unit 763*a* includes the layer 780*a*, a light-emitting layer 771*a*, a light-emitting layer 771*b*, a light-emitting layer 771*c*, and the layer 790*a*. The light-emitting unit 763*b* includes the layer 780*b*, a light-emitting layer 772*a*, a light-emitting layer 772*b*, a light-emitting layer 772*c*, and the layer 790*b*.

In FIG. 26B, the light-emitting unit 763*a* is configured to emit white light (W) by selecting light-emitting substances for the light-emitting layer 771*a*, the light-emitting layer 771*b*, and the light-emitting layer 771*c* such that their emission colors are complementary colors. Furthermore, the light-emitting unit 763*b* is configured to emit white light (W) by selecting light-emitting substances for the light-emitting layer 772*a*, the light-emitting layer 772*b*, and the light-emitting layer 772*c* such that their emission colors are complementary colors. That is, the structure illustrated in FIG. 26B is a two-unit tandem structure of W\W. Note that there is no particular limitation on the stacking order of the light-emitting substances having complementary emission colors. The practitioner can select the optimal stacking order as appropriate. Although not illustrated, a three-unit tandem structure of W\W\W or a tandem structure with four or more units may be employed.

In the case of using the light-emitting element having the tandem structure, the following structure can be given, for example: a two-unit tandem structure of B\Y or Y\B including a light-emitting unit that emits yellow (Y) light and a light-emitting unit that emits blue (B) light; a two-unit tandem structure of R·G\B or B\R·G including a light-emitting unit that emits red (R) and green (G) light and a light-emitting unit that emits blue (B) light; a three-unit tandem structure of B\Y\B including a light-emitting unit that emits blue (B) light, a light-emitting unit that emits yellow (Y) light, and a light-emitting unit that emits blue (B) light in this order; a three-unit tandem structure of B\YG\B including a light-emitting unit that emits blue (B) light, a light-emitting unit that emits yellowish-green (YG) light, and a light-emitting unit that emits blue (B) light in this order; and a three-unit tandem structure of B\G\B including a light-emitting unit that emits blue (B) light, a light-emitting unit that emits green (G) light, and a light-emitting unit that emits blue (B) light in this order. Note that "a-b" means that one light-emitting unit contains a light-emitting substance that emits light of a and a light-emitting substance that emits light of b.

As illustrated in FIG. 26C, a light-emitting unit including one light-emitting layer and a light-emitting unit including a plurality of light-emitting layers may be used in combination.

Specifically, in the structure illustrated in FIG. 26C, a plurality of light-emitting units (the light-emitting unit 763*a*, the light-emitting unit 763*b*, and the light-emitting unit 763*c*) are connected in series with the charge-generation layers 785 therebetween. The light-emitting unit 763*a* includes the layer 780*a*, the light-emitting layer 771, and the layer 790*a*. The light-emitting unit 763*b* includes the layer 780*b*, the light-emitting layer 772*a*, the light-emitting layer 772*b*, the light-emitting layer 772*c*, and the layer 790*b*. The light-emitting unit 763*c* includes the layer 780*c*, the light-emitting layer 773, and the layer 790*c*.

In the structure illustrated in FIG. 26C, for example, a three-unit B\R·G·YG\B tandem structure in which the light-emitting unit 763*a* is a light-emitting unit that emits blue (B) light, the light-emitting unit 763*b* is a light-emitting unit that emits red (R), green (G), and yellowish-green (YG) light, and the light-emitting unit 763*c* is a light-emitting unit that emits blue (B) light can be employed.

Examples of the number of stacked light-emitting units and the order of colors from the anode side include a two-unit structure of B and Y, a two-unit structure of B and a light-emitting unit X, a three-unit structure of B, Y, and B, and a three-unit structure of B, X, and B. Examples of the number of light-emitting layers stacked in the light-emitting unit X and the order of colors from the anode side include a two-layer structure of R and Y, a two-layer structure of R and G, a two-layer structure of G and R, a three-layer structure of G, R, and G, and a three-layer structure of R, G, and R. Another layer may be provided between two light-emitting layers.

Next, materials that can be used for the light-emitting element will be described.

A conductive film that transmits visible light is used for the electrode through which light is extracted, which is either the lower electrode 761 or the upper electrode 762. A conductive film that reflects visible light is preferably used for the electrode through which light is not extracted. In the case where the display device includes a light-emitting element that emits infrared light, it is preferable that a conductive film that transmits visible light and infrared light be used as the electrode through which light is extracted and that a conductive film that reflects visible light and infrared light be used as the electrode through which light is not extracted.

A conductive film that transmits visible light may be used also for the electrode through which light is not extracted. In that case, the electrode is preferably placed between a reflective layer and the EL layer 763. That is, light emitted from the EL layer 763 may be reflected by the reflective layer to be extracted from the display device.

As a material that forms the pair of electrodes of the light-emitting element, a metal, an alloy, an electrically conductive compound, a mixture thereof, or the like can be used as appropriate. Specific examples of the material include metals such as aluminum, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing an appropriate combination of these metals. Other examples of the material include indium tin oxide (also referred to as In—Sn oxide or ITO), an In—Si—Sn oxide (also referred to as ITSO), indium zinc oxide (an In—Zn oxide), and an In—W—Zn oxide. Other examples of the material include an alloy containing aluminum (an aluminum alloy) such as an alloy of aluminum, nickel, and lanthanum (Al—Ni—La), and an alloy of silver, palladium, and copper (Ag—Pd—Cu, also referred to as APC). Other examples of the material include an element that belongs to Group 1 or Group 2 of the periodic table, which is not described above (e.g., lithium, cesium, calcium, or strontium), a rare earth metal such as europium or ytterbium, an alloy containing an appropriate combination of these elements, and graphene.

The light-emitting element preferably employs a microcavity structure. Therefore, one of the pair of electrodes of the light-emitting element preferably includes an electrode having properties of transmitting and reflecting visible light (a transflective electrode), and the other preferably includes an electrode having a property of reflecting visible light (a reflective electrode). When the light-emitting element has a microcavity structure, light obtained from the light-emitting layer can be resonated between the electrodes, so that light emitted from the light-emitting element can be intensified.

The transparent electrode has a light transmittance higher than or equal to 40%. For example, an electrode having a visible light (light at a wavelength greater than or equal to 400 nm and less than 750 nm) transmittance higher than or equal to 40% is preferably used as the transparent electrode in the light-emitting element. The visible light reflectance of the transflective electrode is higher than or equal to 10% and lower than or equal to 95%, preferably higher than or equal to 30% and lower than or equal to 80%. The visible light reflectance of the reflective electrode is higher than or equal to 40% and lower than or equal to 100%, preferably higher than or equal to 70% and lower than or equal to 100%. These electrodes preferably have a resistivity lower than or equal to $1\times10^{-2}$ Ωcm.

The light-emitting element includes at least a light-emitting layer. The light-emitting element may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like. For example, the light-emitting element can include one or more of a hole-injection layer, a hole-transport layer, a hole-blocking layer, a charge-generation layer, an electron-blocking layer, an electron-transport layer, and an electron-injection layer in addition to the light-emitting layer.

Either a low molecular compound or a high molecular compound can be used in the light-emitting element, and an inorganic compound may be contained. Each layer included in the light-emitting element can be formed by a method such as an evaporation method (including a vacuum evaporation method), a transfer method, a printing method, an inkjet method, or a coating method.

The light-emitting layer contains one or more kinds of light-emitting substances. As the light-emitting substance, a substance that exhibits an emission color of blue, violet, bluish violet, green, yellowish green, yellow, orange, red, or the like is used as appropriate. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (a host material, an assist material, and the like) in addition to the light-emitting substance (guest material). As one or more kinds of organic compounds, one or both of a substance with a high hole-transport property (a hole-transport material) and a substance with a high electron-transport property (an electron-transport material) can be used. As the hole-transport material, it is possible to use a material with a high hole-transport property that can be used for the hole-transport layer and will be described later. As the electron-transport material, it is possible to use a material with a high electron-transport property that can be used for the electron-transport layer and will be described later. As one or more kinds of organic compounds, a bipolar material or a TADF material may be used.

The light-emitting layer preferably includes a phosphorescent material and a combination of a hole-transport material and an electron-transport material that easily forms an exciplex, for example. Such a structure makes it possible to efficiently obtain light emission using ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of the lowest-energy-side absorption band of the light-emitting substance, energy can be smoothly transferred and light emission can be efficiently obtained. With this structure, high efficiency, low-voltage driving, and a long lifetime of the light-emitting element can be achieved at the same time.

The hole-injection layer is a layer injecting holes from an anode to the hole-transport layer and a layer containing a material with a high hole-injection property. Examples of the material with a high hole-injection property include an aromatic amine compound and a composite material containing a hole-transport material and an acceptor material (an electron-accepting material).

As the hole-transport material, it is possible to use a material with a high hole-transport property that can be used for the hole-transport layer and will be described later.

As the acceptor material, an oxide of a metal that belongs to Group 4 to Group 8 of the periodic table can be used, for example. Specific examples include molybdenum oxide, vanadium oxide, niobium oxide, tantalum oxide, chromium oxide, tungsten oxide, manganese oxide, and rhenium oxide. Among these, molybdenum oxide is particularly preferable because it is stable in the air, has a low hygroscopic property, and is easy to handle. Alternatively, an organic acceptor material containing fluorine can be used. Alternatively, an organic acceptor material such as a quinodimethane derivative, a chloranil derivative, or a hexaazatriphenylene derivative can be used.

As the material with a high hole-injection property, a material that contains a hole-transport material and the above-described oxide of a metal that belongs to Group 4 to Group 8 of the periodic table (typically, molybdenum oxide) may be used, for example.

The hole-transport layer is a layer transporting holes, which are injected from the anode by the hole-injection layer, to the light-emitting layer. The hole-transport layer is a layer containing a hole-transport material. For the hole-transport material, a substance having a hole mobility higher than or equal to $1\times10^{-6}$ $cm^2/Vs$ is preferable. Note that other substances can also be used as long as they have a property of transporting more holes than electrons. As the hole-transport material, a material with a high hole-transport property, such as a Tc-electron rich heteroaromatic compound (e.g., a carbazole derivative, a thiophene derivative, a furan derivative, or the like) or an aromatic amine (a compound having an aromatic amine skeleton), is preferable.

The electron-blocking layer is provided in contact with the light-emitting layer. The electron-blocking layer has a hole-transport property and contains a material capable of blocking electrons. The materials with an electron-blocking property among the above hole-transport materials can be used for the electron-blocking layer.

The electron-blocking layer has a hole-transport property and thus can also be referred to as a hole-transport layer. A layer having an electron-blocking property among the hole-transport layers can also be referred to as an electron-blocking layer.

The electron-transport layer is a layer transporting electrons, which are injected from the cathode by the electron-injection layer, to the light-emitting layer. The electron-transport layer is a layer containing an electron-transport material. As the electron-transport material, a substance having an electron mobility higher than or equal to $1\times10^{-6}$ $cm^2/Vs$ is preferable. Note that other substances can also be used as long as they have a property of transporting more electrons than holes. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The hole-blocking layer is provided in contact with the light-emitting layer. The hole-blocking layer has an electron-transport property and contains a material capable of blocking holes. The materials with a hole-blocking property among the above electron-transport materials can be used for the hole-blocking layer.

The hole-blocking layer has an electron-transport property and thus can also be referred to as an electron-transport layer. A layer having a hole-blocking property among the electron-transport layers can also be referred to as a hole-blocking layer.

The electron-injection layer is a layer injecting electrons from the cathode to the electron-transport layer and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (an electron-donating material) can also be used.

The difference between the LUMO level of the material with a high electron-injection property and the work function value of the material used for the cathode is preferably small (specifically, smaller than or equal to 0.5 eV).

For the electron-injection layer, an alkali metal, an alkaline earth metal, or a compound thereof, such as lithium, cesium, ytterbium, lithium fluoride (LiF), cesium fluoride (CsF), calcium fluoride ($CaF_X$, where X is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide ($LiO_x$), or cesium carbonate can be used, for example. The electron-injection layer may have a stacked-layer structure of two or more layers. As an example of the stacked-layer structure, a structure in which lithium fluoride is used for a first layer and ytterbium is provided for a second layer can be given.

The electron-injection layer may include an electron-transport material. For example, a compound having an unshared electron pair and a π-electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) level of the organic compound having an unshared electron pair is preferably higher than or equal to −3.6 eV and lower than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

As described above, the charge-generation layer includes at least a charge-generation region. The charge-generation region preferably contains an acceptor material, and for example, preferably contains a hole-transport material and an acceptor material that can be used for the hole-injection layer.

The charge-generation layer preferably includes a layer containing a material with a high electron-injection property. The layer can also be referred to as an electron-injection buffer layer. The electron-injection buffer layer is preferably provided between the charge-generation region and the electron-transport layer. By providing the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (lithium oxide ($Li_2O$) or the like). Alternatively, a material that can be used for the electron-injection layer can be suitably used for the electron-injection buffer layer.

The charge-generation layer preferably includes a layer containing a material with a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper(II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other on the basis of the cross-sectional shapes, characteristics, or the like in some cases.

Note that the charge-generation layer may contain a donor material instead of an acceptor material. For example, the charge-generation layer may include a layer containing an electron-transport material and a donor material that can be used for the electron-injection layer.

When the light-emitting units are stacked, provision of a charge-generation layer between two light-emitting units can inhibit an increase in drive voltage.

This embodiment can be combined with the other embodiments as appropriate.

Embodiment 4

In this embodiment, electronic devices of one embodiment of the present invention will be described.

Electronic devices in this embodiment each include the display device of one embodiment of the present invention in a display portion. The display device of one embodiment of the present invention can be easily increased in resolution and definition. Thus, the display device of one embodiment of the present invention can be used for display portions of a variety of electronic devices.

Examples of the electronic devices include a digital camera, a digital video camera, a digital photo frame, a mobile phone, a portable game machine, a portable information terminal, and an audio reproducing device, in addition to electronic devices with a relatively large screen, such as a television device, a desktop or laptop personal computer, a monitor of a computer, digital signage, and a large game machine such as a pachinko machine.

In particular, the display device of one embodiment of the present invention can have high resolution, and thus can be suitably used for an electronic device having a comparatively small display portion. Examples of such an electronic device include wristwatch-type and bracelet-type information terminal devices (wearable devices) and wearable devices that can be worn on a head, such as a VR device like a head-mounted display, a glasses-type AR device, and an MR device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the definition is preferably 4K, 8K, or higher. The pixel density (resolution) of the display device of one embodiment of the present invention is preferably greater than or equal to 100 ppi, further preferably greater than or equal to 300 ppi, still further preferably greater than or equal to 500 ppi, yet further preferably greater than or equal to 1000 ppi, yet still further preferably greater than or equal to 2000 ppi, yet still further preferably greater than or equal to 3000 ppi, yet still further preferably greater than or equal to 5000 ppi, yet still further preferably greater than or equal to 7000 ppi. By using such a display device having one or both of high definition and high resolution, the electronic device can have more improved realistic sensation, sense of depth, and the like in personal use such as portable use and home use. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, or the like, a function of executing a variety of software (programs), a wireless communication function, and a function of reading out a program or data stored in a recording medium.

Examples of a wearable device that can be worn on a head will be described with reference to FIG. 27A to FIG. 27D. These wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables a user to feel a higher sense of immersion.

Figure 27A:
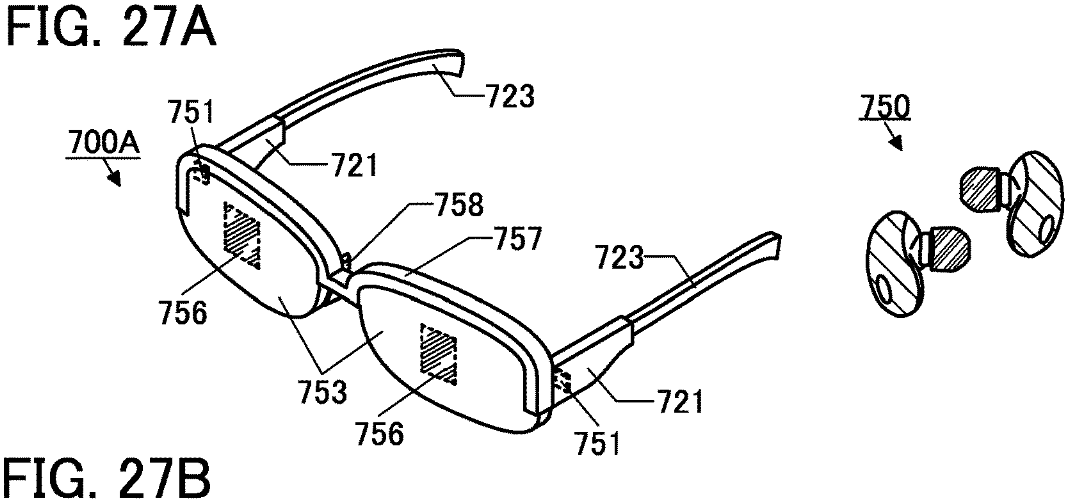
FIG. 27A to FIG. 27D are diagrams illustrating examples of electronic devices.
Figure 27B:
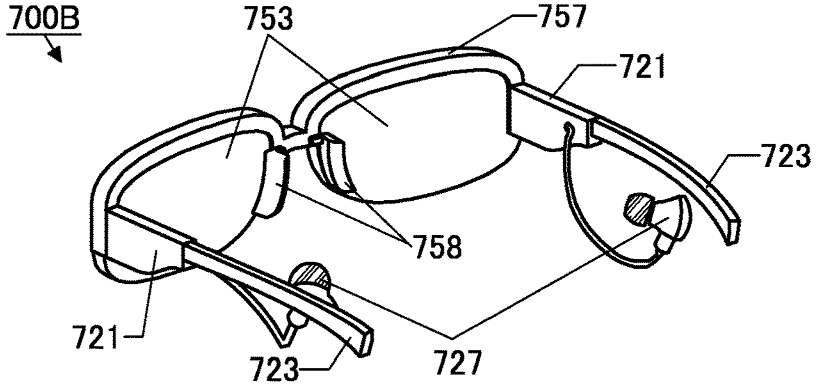

An electronic device 700A illustrated in FIG. 27A and an electronic device 700B illustrated in FIG. 27B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display device of one embodiment of the present invention can be used for the display panels 751. Thus, the electronic devices can have extremely high resolution.

The electronic device 700A and the electronic device 700B can each project images displayed on the display panels 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In each of the electronic device 700A and the electronic device 700B, a camera capable of capturing images of the front side may be provided as the image capturing portion. Furthermore, when the electronic device 700A and the electronic device 700B are each provided with an acceleration sensor such as a gyroscope sensor, the orientation of the user's head can be sensed and an image corresponding to the orientation can be displayed on the display regions 756.

The communication portion includes a wireless communication device, and a video signal can be supplied by the wireless communication device, for example. Note that instead of the wireless communication device or in addition to the wireless communication device, a connector to which a cable for supplying a video signal and a power supply potential can be connected may be provided.

The electronic device 700A and the electronic device 700B are each provided with a battery so that they can be charged wirelessly and/or by wire.

A touch sensor module may be provided in the housing 721. The touch sensor module has a function of detecting touch on the outer surface of the housing 721. A tap operation or a slide operation, for example, by the user can be detected with the touch sensor module, whereby a variety of processing can be executed. For example, processing such as a pause or a restart of a moving image can be executed by a tap operation, and processing such as fast forward and fast rewind can be executed by a slide operation. The touch sensor module is provided in each of the two housings 721, whereby the range of the operation can be increased.

A variety of touch sensors can be used for the touch sensor module. For example, any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module.

In the case of using an optical touch sensor, a photoelectric conversion element (also referred to as a photoelectric conversion device) can be used as a light-receiving element. One or both of an inorganic semiconductor and an organic semiconductor can be used for an active layer of the photoelectric conversion element.

Figure 27C:
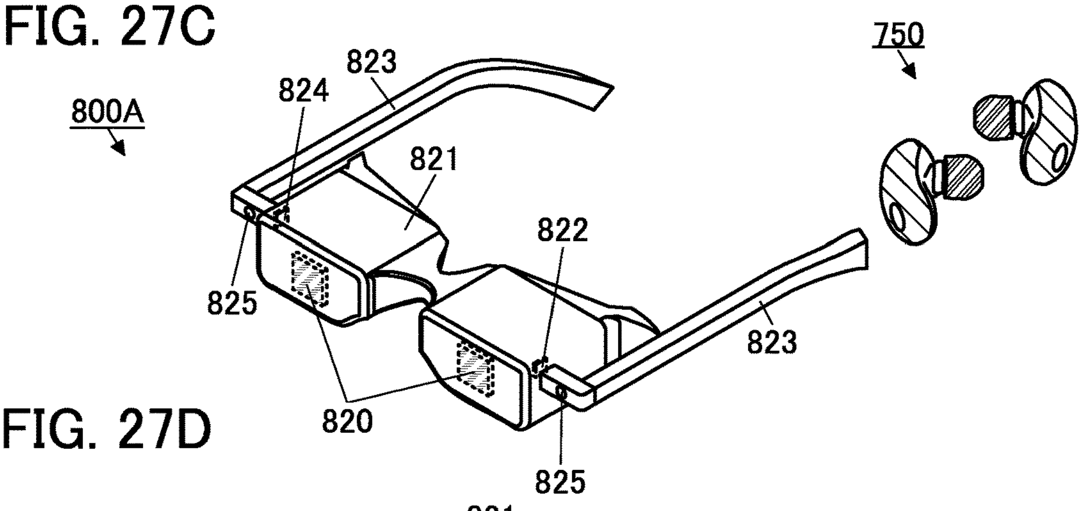
Figure 27D:
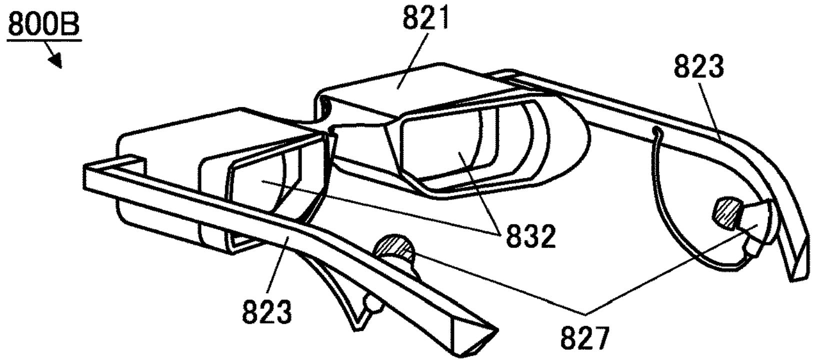

An electronic device 800A illustrated in FIG. 27C and an electronic device 800B illustrated in FIG. 27D each include a pair of display portions 820, a housing 821, a communication portion 822, a pair of wearing portions 823, a control portion 824, a pair of image capturing portions 825, and a pair of lenses 832.

The display device of one embodiment of the present invention can be used for the display portions 820. Thus, the electronic devices can have extremely high resolution.

The display portions 820 are provided at a position inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B each preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B each preferably include a mechanism for adjusting focus by changing the distance between the lenses 832 and the display portions 820.

The electronic device 800A or the electronic device 800B can be worn on the user's head with the wearing portions 823. FIG. 27C illustrates an example in which the wearing portion 823 has a shape like a temple (also referred to as a joint or the like) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to cover a plurality of fields of view, such as a telescope field of view and a wide field of view.

Although an example of including the image capturing portion 825 is described here, a range sensor (also referred to as a sensing portion) that is capable of measuring a distance from an object may be provided. That is, the image capturing portion 825 is one embodiment of the sensing portion. As the sensing portion, an image sensor or a distance image sensor such as LIDAR (Light Detection and Ranging) can be used, for example. With the use of images obtained by the camera and images obtained by the distance image sensor, more pieces of information can be obtained and a gesture operation with higher accuracy is possible.

The electronic device 800A may include a vibration mechanism that functions as bone-conduction earphones. For example, a structure including the vibration mechanism can be employed for any one or more of the display portion 820, the housing 821, and the wearing portion 823. Thus, without additionally requiring an audio device such as headphones, earphones, or a speaker, the user can enjoy videos and sounds only by wearing the electronic device 800A.

The electronic device 800A and the electronic device 800B may each include an input terminal. To the input terminal, a cable for supplying a video signal from a video output device or the like, electric power for charging a battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A illustrated in FIG. 27A has a function of transmitting information to the earphones 750 with the wireless communication function. For another example, the electronic device 800A illustrated in FIG. 27C has a function of transmitting information to the earphones 750 with the wireless communication function.

The electronic device may include an earphone portion. The electronic device 700B illustrated in FIG. 27B includes earphone portions 727. For example, the earphone portion 727 and the control portion can be connected to each other by wire. Part of a wiring that connects the earphone portion 727 and the control portion may be positioned inside the housing 721 or the wearing portion 723.

Similarly, the electronic device 800B illustrated in FIG. 27D includes earphone portions 827. For example, the earphone portion 827 and the control portion 824 can be connected to each other by wire. Part of a wiring that connects the earphone portion 827 and the control portion 824 may be positioned inside the housing 821 or the wearing portion 823. The earphone portions 827 and the wearing portions 823 may include magnets. This is preferable because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of what is called a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 28A:
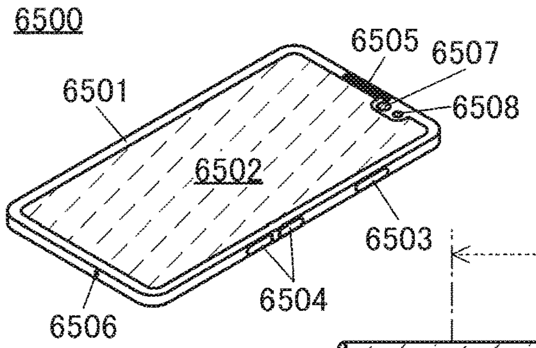
FIG. 28A to FIG. 28F are diagrams illustrating examples of electronic devices.

An electronic device 6500 illustrated in FIG. 28A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used for the display portion 6502. Thus, the electronic device can have extremely high resolution.

Figure 28B:
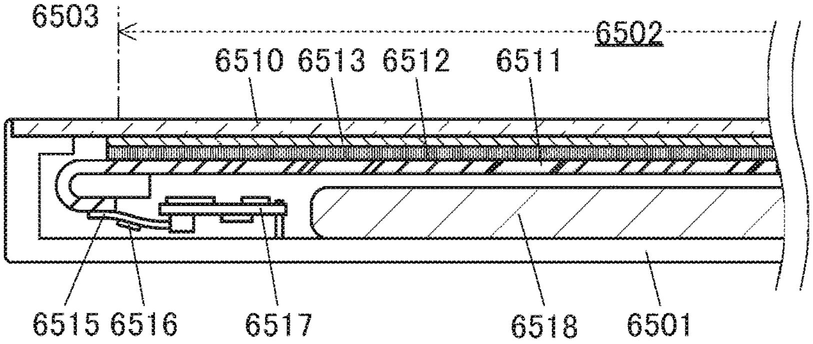

FIG. 28B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are placed in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the region that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be obtained. Since the display panel 6511 is extremely thin, the battery 6518 with high capacity can be mounted while an increase in thickness of the electronic device is suppressed. Moreover, part of the display panel 6511 is folded back such that a connection portion with the FPC 6515 is provided on the back side of the pixel portion, whereby an electronic device with a narrow bezel can be obtained.

Figure 28C:
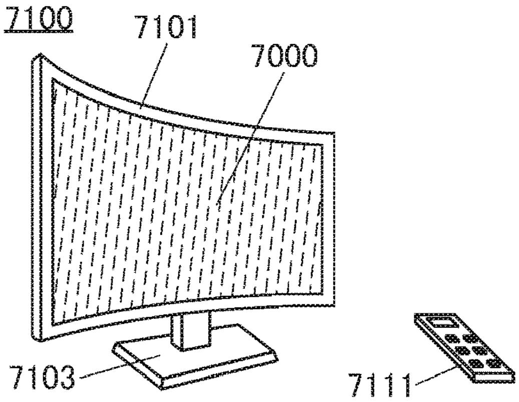

FIG. 28C illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used for the display portion 7000. Thus, the electronic device can have extremely high resolution.

Operation of the television device 7100 illustrated in FIG. 28C can be performed with an operation switch provided in the housing 7101 and a separate remote control 7111. Alternatively, the display portion 7000 may include a touch sensor, and the television device 7100 may be operated by touch on the display portion 7000 with a finger or the like. The remote control 7111 may include a display portion for displaying information output from the remote control 7111. With operation keys or a touch panel provided in the remote control 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network by wire or wirelessly via the modem, one-way (from a transmitter to a receiver) or two-way (between a transmitter and a receiver or between receivers, for example) information communication can be performed.

Figure 28D:
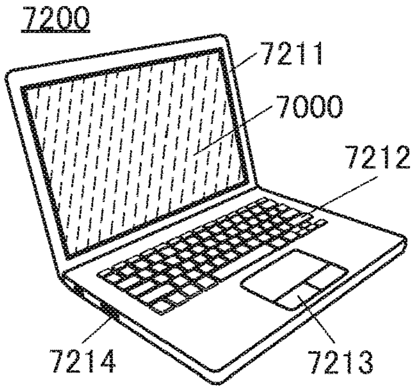

FIG. 28D illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000. Thus, the electronic device can have extremely high resolution.

Figure 28E:
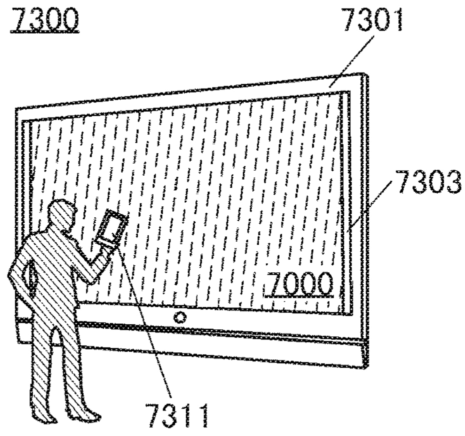
Figure 28F:
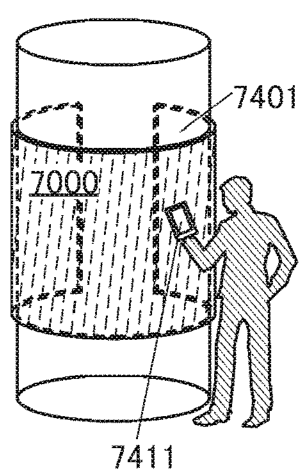

FIG. 28E and FIG. 28F illustrate examples of digital signage.

Digital signage 7300 illustrated in FIG. 28E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 28F is digital signage 7400 attached to a cylindrical pillar 7401. The digital signage 7400 includes the display portion 7000 provided along a curved surface of the pillar 7401.

The display device of one embodiment of the present invention can be used for the display portion 7000 in each of FIG. 28E and FIG. 28F. Thus, the electronic device can have extremely high resolution.

A larger area of the display portion 7000 can increase the amount of information that can be provided at a time. The larger display portion 7000 attracts more attention, so that the effectiveness of the advertisement can be increased, for example.

A touch panel is preferably used in the display portion 7000, in which case intuitive operation by a user is possible in addition to display of an image or a moving image on the display portion 7000. Moreover, for an application for providing information such as route information or traffic information, usability can be enhanced by intuitive operation.

As illustrated in FIG. 28E and FIG. 28F, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operating the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 29A to FIG. 29G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 29A to FIG. 29G have a variety of functions. For example, the electronic devices can have a function of displaying a variety of information (a still image, a moving image, a text image, and the like) on the display portion, a touch panel function, a function of displaying a calendar, date, time, or the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image and storing the taken image in a storage medium (an external storage medium or a storage medium incorporated in the camera), a function of displaying the taken image on the display portion, or the like.

The electronic devices illustrated in FIG. 29A to FIG. 29G will be described in detail below.

Figure 29A:
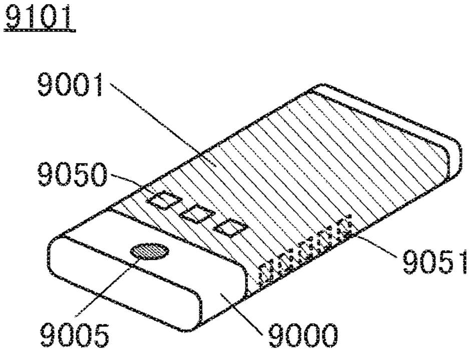
FIG. 29A to FIG. 29G are diagrams illustrating examples of electronic devices.

FIG. 29A is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display characters and image information on its plurality of surfaces. FIG. 29A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, for example, the icon 9050 may be displayed at the position where the information 9051 is displayed.

Figure 29B:
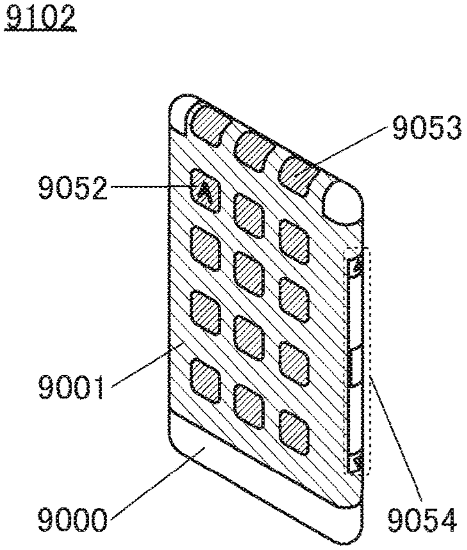

FIG. 29B is a perspective view illustrating a portable information terminal 9102. The portable information terminal 9102 has a function of displaying information on three or more surfaces of the display portion 9001. Shown here is an example in which information 9052, information 9053, and information 9054 are displayed on different surfaces. For example, a user can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 29C:
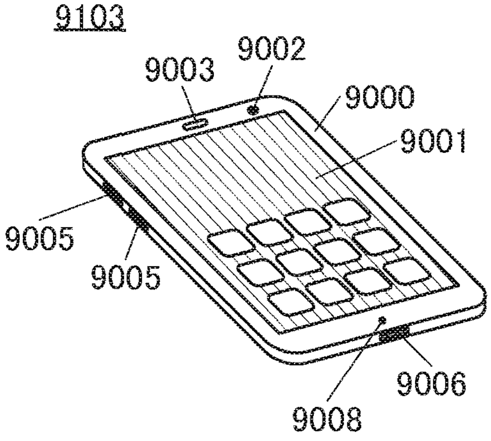

FIG. 29C is a perspective view illustrating a tablet terminal 9103. The tablet terminal 9103 is capable of executing a variety of applications such as mobile phone calls, e-mailing, viewing and editing texts, music reproduction, Internet communication, and a computer game. The tablet terminal 9103 includes the display portion 9001, a camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 29D:
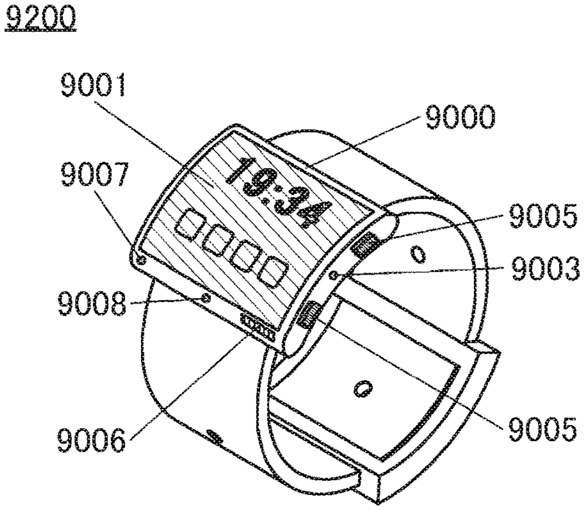

FIG. 29D is a perspective view illustrating a wristwatch-type portable information terminal 9200. For example, the portable information terminal 9200 can be used as a Smartwatch (registered trademark). The display surface of the display portion 9001 is curved, and display can be performed on the curved display surface. Furthermore, mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 29E:
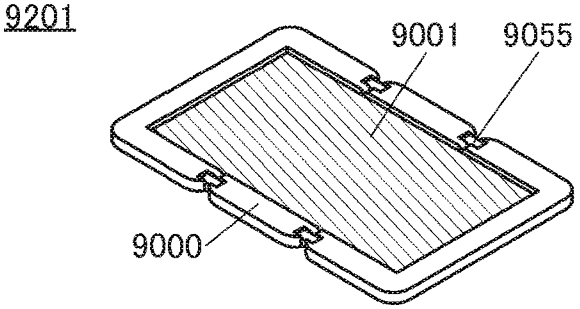
Figure 29F:
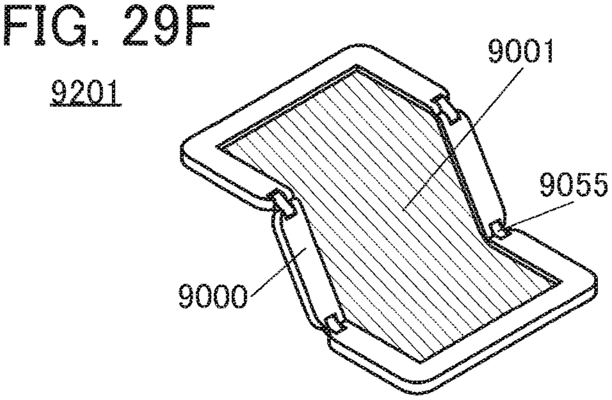
Figure 29G:
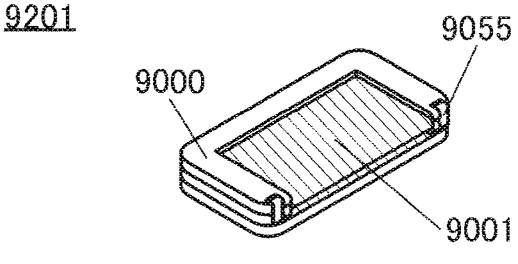

FIG. 29E to FIG. 29G are perspective views illustrating a foldable portable information terminal 9201. FIG. 29E is a perspective view of an opened state of the portable information terminal 9201, FIG. 29G is a perspective view of a folded state thereof, and FIG. 29F is a perspective view of a state in the middle of change from one of FIG. 29E and FIG. 29G to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with the other embodiments as appropriate. In this specification, in the case where a plurality of structure examples are described in one embodiment, the structure examples can be combined as appropriate.

REFERENCE NUMERALS

100A: display device, 100B: display device, 100C: display device, 100D: display device, 100E: display device, 100F: display device, 100G: display device, 100H: display device, 100I: display device, 100J: display device, 101: substrate, 105*a*: insulating layer, 105*b*: insulating layer, 105*c*: insulating layer, 105: insulating layer, 110*a*: subpixel, 110*b*: subpixel, 110B: light-emitting element, 110*c*: subpixel, 110*d*: subpixel, 110G: light-emitting element, 110R: light-emitting element, 110: light-emitting element, 111B: pixel electrode, 111G: pixel electrode, 111R: pixel electrode, 111: pixel electrode, 112B: organic layer, 112Bf: organic layer, 112G: organic layer, 112Gf: organic layer, 112R: organic layer, 112Rf: organic layer, 112: organic layer, 113: common electrode, 114: common layer, 118*a*: insulating layer, 118A: insulating film, 118*b*: insulating layer, 118B: insulating film, 118*c*: insulating layer, 118C: insulating film, 118: insulating layer, 121: protective layer, 124*a*: pixel, 124*b*: pixel, 126: resin layer, 131: plug, 135: first light-emitting unit, 136: charge-generation layer, 137: second light-emitting unit, 150: pixel, 151: resist mask, 152: resist mask, 170: substrate, 171: adhesive layer, 173_1*a*: groove, 173_1*b*: groove, 173_2*a*: groove, 173_2*b*: groove, 173_3*a*: groove, 173_3*b*: groove, 173_*a*: groove, 173_*b*: groove, 173: groove, 174_1: groove, 174_2: groove, 174_3: groove, 175_1: groove, 175_2: groove, 175_3: groove, 175: groove, 200A: display device, 200B: display device, 200C: display device, 200D: display device, 200E: display device, 200F: display device, 200G: display device, 240: capacitor, 241: conductive layer, 243: insulating layer, 245: conductive layer, 251: conductive layer, 252: conductive layer, 254: insulating layer, 255: insulating layer, 256: plug, 261: insulating layer, 262: insulating layer, 263: insulating layer, 264: insulating layer, 265: insulating layer, 271: plug, 274*a*: conductive layer, 274*b*: conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320A: transistor, 320B: transistor, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 700A: electronic device, 700B: electronic device, 721: housing, 723: wearing portion, 727: earphone portion, 750: earphone, 751: display panel, 753: optical member, 756: display region, 757: frame, 758: nose pad, 761: lower electrode, 762: upper electrode, 763*a*: light-emitting unit, 763*b*: light-emitting unit, 763*c*: light-emitting unit, 763: EL layer, 764: layer, 771*a*: light-emitting layer, 771*b*: light-emitting layer, 771*c*: light-emitting layer, 771: light-emitting layer, 772*a*: light-emitting layer, 772*b*: light-emitting layer, 772*c*: light-emitting layer, 772: light-emitting layer, 773: light-emitting layer, 780*a*: layer, 780*b*: layer, 780*c*: layer, 780: layer, 781: layer, 782: layer, 785: charge-generation layer, 790*a*: layer, 790*b*: layer, 790*c*: layer, 790: layer, 791: layer, 792: layer, 800A: electronic device, 800B: electronic device, 820: display portion, 821: housing, 822: communication portion, 823: wearing portion, 824: control portion, 825: image capturing portion, 827: earphone portion, 832: lens, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote control, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A display device comprising:

a first insulating layer;

a first light-emitting element and a second light-emitting element over the first insulating layer;

a second insulating layer;

a third insulating layer; and a resin layer, wherein the first light-emitting element comprises a first pixel electrode, a first organic layer and a common electrode, wherein the second light-emitting element comprises a second pixel electrode, a second organic layer and the common electrode, wherein the first light-emitting element and the second light-emitting element are configured to emit light of different colors, wherein the first insulating layer comprises a groove, wherein the groove comprises:

a region overlapping with the first pixel electrode;

a region overlapping with the second pixel electrode; and a region overlapping with neither the first pixel electrode nor the second pixel electrode, wherein the second insulating layer comprises:

a region in contact with at least a part of a top surface of the first organic layer;

a region in contact with a side surface of the first organic layer; and a region in contact with the first insulating layer below the first pixel electrode, wherein the third insulating layer comprises:

a region in contact with at least a part of a top surface of the second organic layer;

a region in contact with a side surface of the second organic layer; and a region in contact with the first insulating layer below the second pixel electrode, wherein the resin layer comprises a region in contact with the first insulating layer in a portion between the first organic layer and the second organic layer, and wherein the common electrode covers a top surface of the resin layer.

2. The display device according to claim 1, wherein the shortest distance between an end portion of the first pixel electrode and an end portion of the second pixel electrode is twice or more a thickness of the first organic layer.

3. The display device according to claim 1, wherein the groove has a downward-convex arc shape in a cross-sectional view.

4. The display device according to claim 1, wherein each of the second insulating layer and the third insulating layer comprises aluminum and oxygen.

5. A method for fabricating a display device comprising the steps of:

forming a first pixel electrode and a second pixel electrode over a first insulating layer;

processing the first insulating layer by an isotropic etching method to form a groove in the first insulating layer, wherein the groove comprises a region overlapping with the first pixel electrode, a region overlapping with the second pixel electrode, and a region overlapping with neither the first pixel electrode nor the second pixel electrode;

forming a first organic layer over the first pixel electrode by forming a film comprising a first light-emitting compound over the first pixel electrode and the first insulating layer;

forming a second insulating layer over the first organic layer;

forming a second organic layer over the second pixel electrode by forming a film comprising a second light-emitting compound over the second pixel electrode and the first insulating layer;

forming a third insulating layer over the second organic layer;

forming a resin layer over the first insulating layer, the second insulating layer, and the third insulating layer;

forming a first opening portion reaching the first organic layer in the resin layer and the second insulating layer and a second opening portion reaching the second organic layer in the resin layer and the third insulating layer by removing a part of the resin layer, a part of the second insulating layer, and a part of the third insulating layer; and forming a common electrode after forming the first opening portion, wherein the common electrode and the first organic layer overlap each other in the first opening portion, wherein the common electrode and the second organic layer overlap each other in the second opening portion, wherein the first pixel electrode, the first organic layer and the common electrode are included in a first light-emitting element, wherein the second pixel electrode, the second organic layer and the common electrode are included in a second light-emitting element, and wherein the first light-emitting element and the second light-emitting element are configured to emit light of different colors from each other.

6. The method for fabricating a display device, according to claim 5, wherein the first insulating layer is an insulating layer comprising an inorganic material, and wherein the groove is formed by wet etching treatment.

7. The method for fabricating a display device, according to claim 5, wherein the second insulating layer and the third insulating layer are formed by an ALD method.

8. A method for fabricating a display device comprising the steps of:

forming a first pixel electrode and a second pixel electrode over a first insulating layer;

processing the first insulating layer by an isotropic etching method to form a groove in the first insulating layer, wherein the groove comprises a region overlapping with the first pixel electrode, a region overlapping with the second pixel electrode, and a region overlapping with neither the first pixel electrode nor the second pixel electrode;

forming a first resist mask in a part of the groove and a portion overlapping with the second pixel electrode;

forming a first organic layer over the first pixel electrode and a first layer over the first resist mask by forming a film comprising a first light-emitting compound over the first pixel electrode, the first insulating layer, and the first resist mask;

forming a second insulating layer over the first organic layer;

removing the first resist mask and the first layer;

forming a second resist mask over the second insulating layer;

forming a second organic layer over the second pixel electrode and a second layer over the second resist mask by forming a film comprising a second light-emitting compound over the second pixel electrode, the first insulating layer, and the second resist mask;

forming a third insulating layer over the second organic layer;

removing the second resist mask and the second layer;

forming a resin layer over the first insulating layer, the second insulating layer, and the third insulating layer;

forming a first opening portion reaching the first organic layer in the resin layer and the second insulating layer and a second opening portion reaching the second organic layer in the resin layer and the third insulating layer by removing a part of the resin layer, a part of the second insulating layer, and a part of the third insulating layer; and forming a common electrode after forming the first opening portion, wherein the common electrode and the first organic layer overlap each other in the first opening portion, wherein the common electrode and the second organic layer overlap each other in the second opening portion, wherein the first pixel electrode, the first organic layer and the common electrode are included in a first light-emitting element, wherein the second pixel electrode, the second organic layer and the common electrode are included in a second light-emitting element, and wherein the first light-emitting element and the second light-emitting element are configured to emit light of different colors from each other.

* * * * *